US012776429B2

(12) United States Patent
Yoneda

(10) Patent No.: US 12,776,429 B2
(45) Date of Patent: Oct. 27, 2026

(54) CHIP RESISTOR AND MOUNTING STRUCTURE THEREOF

(71) Applicant: ROHM CO., LTD., Kyoto (JP)

(72) Inventor: Masaki Yoneda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 779 days.

(21) Appl. No.: 18/311,085

(22) Filed: May 2, 2023

(65) Prior Publication Data

US 2023/0282396 A1 Sep. 7, 2023

Related U.S. Application Data

(63) Continuation of application No. 17/233,059, filed on Apr. 16, 2021, now Pat. No. 11,676,742, which is a (Continued)

(30) Foreign Application Priority Data

Jun. 13, 2013 (JP) ................................ 2013-124894
Jun. 13, 2013 (JP) ................................ 2013-124895
Jul. 12, 2013 (JP) ................................ 2013-146847

(51) Int. Cl.
*H01C 1/012* (2006.01)
*H01C 1/014* (2006.01)
(Continued)

(52) U.S. Cl.
CPC ............ *H01C 1/012* (2013.01); *H01C 1/014* (2013.01); *H01C 1/028* (2013.01); *H01C 1/14* (2013.01);
(Continued)

(58) Field of Classification Search
CPC ........ H01C 1/012; H01C 1/014; H01C 1/028; H01C 1/14; H01C 1/142; H01C 3/12
See application file for complete search history.

(56) References Cited

U.S. PATENT DOCUMENTS 4,028,657 A 6/1977 Reichelt
5,164,699 A 11/1992 Smith et al.
(Continued)

FOREIGN PATENT DOCUMENTS

JP 47-25138 U 4/1972
JP 47-27876 8/1972
(Continued)

OTHER PUBLICATIONS

Office Action received in corresponding Japanese Patent application, Aug. 1, 2017, and corresponding English translation.
(Continued)

*Primary Examiner* — Kyung S Lee
(74) *Attorney, Agent, or Firm* — HSML P.C.

(57) ABSTRACT

A chip resistor with a reduced thickness is provided. The chip resistor includes an insulating substrate, a resistor embedded in the substrate, a first electrode electrically connected to the resistor, and a second electrode electrically connected to the resistor. The first electrode and the second electrode are spaced apart from each other in a lateral direction that is perpendicular to the thickness direction of the substrate.

19 Claims, 53 Drawing Sheets

Related U.S. Application Data continuation of application No. 16/780,431, filed on Feb. 3, 2020, now Pat. No. 11,017,922, which is a continuation of application No. 16/371,885, filed on Apr. 1, 2019, now Pat. No. 10,586,635, which is a continuation of application No. 15/802,032, filed on Nov. 2, 2017, now Pat. No. 10,290,401, which is a continuation of application No. 15/456,879, filed on Mar. 13, 2017, now Pat. No. 9,859,041, which is a continuation of application No. 14/294,477, filed on Jun. 3, 2014, now Pat. No. 9,633,768.

(51) Int. Cl.

| | |
|---|---|
| ***H01C 1/028*** | (2006.01) |
| ***H01C 1/14*** | (2006.01) |
| ***H01C 1/142*** | (2006.01) |
| ***H01C 3/12*** | (2006.01) |
| ***H05K 1/181*** | (2026.01) |
| ***H05K 3/341*** | (2026.01) |

(52) U.S. Cl.

CPC ............... *H01C 1/142* (2013.01); *H01C 3/12* (2013.01); *H05K 1/181* (2013.01); *H05K 3/3442* (2013.01); *H05K 2201/10022* (2013.01); *H05K 2201/10636* (2013.01); *Y02P 70/50* (2015.11)

(56) References Cited

U.S. PATENT DOCUMENTS

| | | | | |
|---|---|---|---|---|
| 5,610,572 | A | 3/1997 | Yajima | |
| 5,739,743 | A | 4/1998 | Mazzochette | |
| 6,100,787 | A | 8/2000 | Huang et al. | |
| 6,166,620 | A | 12/2000 | Inuzuka et al. | |
| 6,492,896 | B2 * | 12/2002 | Yoneda .................. | H01C 7/003 338/195 |
| 7,129,814 | B2 | 10/2006 | Tsukada | |
| 7,221,254 | B2 | 5/2007 | Tsukada | |
| 7,782,174 | B2 | 8/2010 | Urano | |
| 8,044,765 | B2 | 10/2011 | Tsukada | |
| 8,310,334 | B2 | 11/2012 | Chen et al. | |
| 9,633,768 | B2 * | 4/2017 | Yoneda .................... | H01C 3/12 |
| 9,859,041 | B2 * | 1/2018 | Yoneda .................... | H01C 1/14 |
| 10,290,401 | B2 * | 5/2019 | Yoneda .................. | H01C 1/142 |
| 10,586,635 | B2 * | 3/2020 | Yoneda .................. | H01C 1/012 |
| 11,017,922 | B2 * | 5/2021 | Yoneda .................. | H01C 1/142 |
| 2004/0041278 | A1 | 3/2004 | Akhtman et al. | |
| 2009/0179731 | A1 | 7/2009 | Ihle et al. | |
| 2009/0217511 | A1 * | 9/2009 | Chen .................... | H01C 17/006 29/620 |
| 2009/0231087 | A1 | 9/2009 | Hakey et al. | |
| 2010/0117783 | A1 | 5/2010 | Tanimura et al. | |
| 2011/0057766 | A1 * | 3/2011 | Chen ...................... | H01C 7/003 338/262 |
| 2011/0057767 | A1 | 3/2011 | Ryu et al. | |
| 2014/0232515 | A1 | 8/2014 | Harada et al. | |

FOREIGN PATENT DOCUMENTS

| | | | |
|---|---|---|---|
| JP | 54-69768 | A | 6/1979 |
| JP | 60-70701 | A | 4/1985 |
| JP | 11-168003 | A | 6/1999 |
| JP | 2000-340413 | A | 12/2000 |
| JP | 2004-253405 | A | 9/2004 |
| JP | 2003-068502 | A | 10/2005 |
| JP | 2005-277019 | A | 10/2005 |
| JP | 2007-142148 | A | 6/2007 |
| JP | 2008-187018 | A | 8/2008 |
| JP | 2008-218621 | A | 9/2008 |
| JP | 2009-289770 | A | 12/2009 |
| JP | 2010/113341 | A | 7/2010 |
| JP | 2013-58783 | A | 3/2013 |
| JP | 2013-80875 | A | 5/2013 |

OTHER PUBLICATIONS

Office Action, issued in corresponding Japanese Patent application, May 23, 2017, and corresponding English translation.

Office Action received in the corresponding Japanese Patent application, Oct. 29, 2019, and corresponding English translation (8 pages).

Office Action received in the corresponding Japanese Patent application, Jun. 7, 2022 and machine translation (6 pages).

Office Action received in corresponding Japanese Patent Application No. 2024-042335, Oct. 22, 2024, and machine translation (6 pages).

Office Action received in corresponding Japanese Patent Application No. 2022-126581, Oct. 3, 2023, and machine translation (6 pages).

Office Action received in corresponding Japanese Patent Application No. 2022-134091, Oct. 3, 2023, and machine translation (6 pages).

* cited by examiner

CHIP RESISTOR AND MOUNTING STRUCTURE THEREOF

BACKGROUND OF THE INVENTION

1. Field of the Invention

The present invention relates to a chip resistor and a mounting structure of the chip resistor.

2. Description of the Related Art

Chip resistors have been widely used in various electronic apparatuses. JP 2007-142148A, for example, discloses a chip resistor that includes a resistive portion and two plate-shaped electrodes connected to the resistive portion.

With the conventional chip resistor, the plate-shaped electrodes need to have a rather great thickness so that the chip resistor as a whole has an appropriate strength. Due to this, the conventional chip resistor may fail to have a desired small thickness. In addition, there has been a strong demand for improvement in heat dissipation performance of a chip resistor.

SUMMARY OF THE INVENTION

The present invention has been proposed in view of the foregoing circumstances. It is therefore an object of the present invention to provide a chip resistor that can be formed with a reduced thickness. It is also an object of the present invention to provide a chip resistor with improved heat dissipation performance.

According to a first aspect of the present invention, here is provided a chip resistor that includes: an insulating substrate; a resistor embedded in the substrate; a first electrode electrically connected to the resistor; and a second electrode electrically connected to the resistor. In the chip resistor, the first electrode is spaced apart from the second electrode in a first direction perpendicular to a thickness direction of the substrate.

According to a second aspect of the present invention, there is provided a chip resistor mounting structure that includes: a chip resistor in accordance with the above-noted first aspect; a mounting substrate on which the chip resistor is mounted; and an electroconductive bonding portion disposed between the mounting substrate and the chip resistor.

Other features and advantages of the present invention will become more apparent through the detailed description given below with reference to the accompanying drawings.

DETAILED DESCRIPTION OF THE PREFERRED EMBODIMENTS

Embodiments of the present invention will be described below with reference to the drawings.

Referring to FIG. 1 through FIG. 19, a first embodiment of the present invention will be described.

Figure 1:
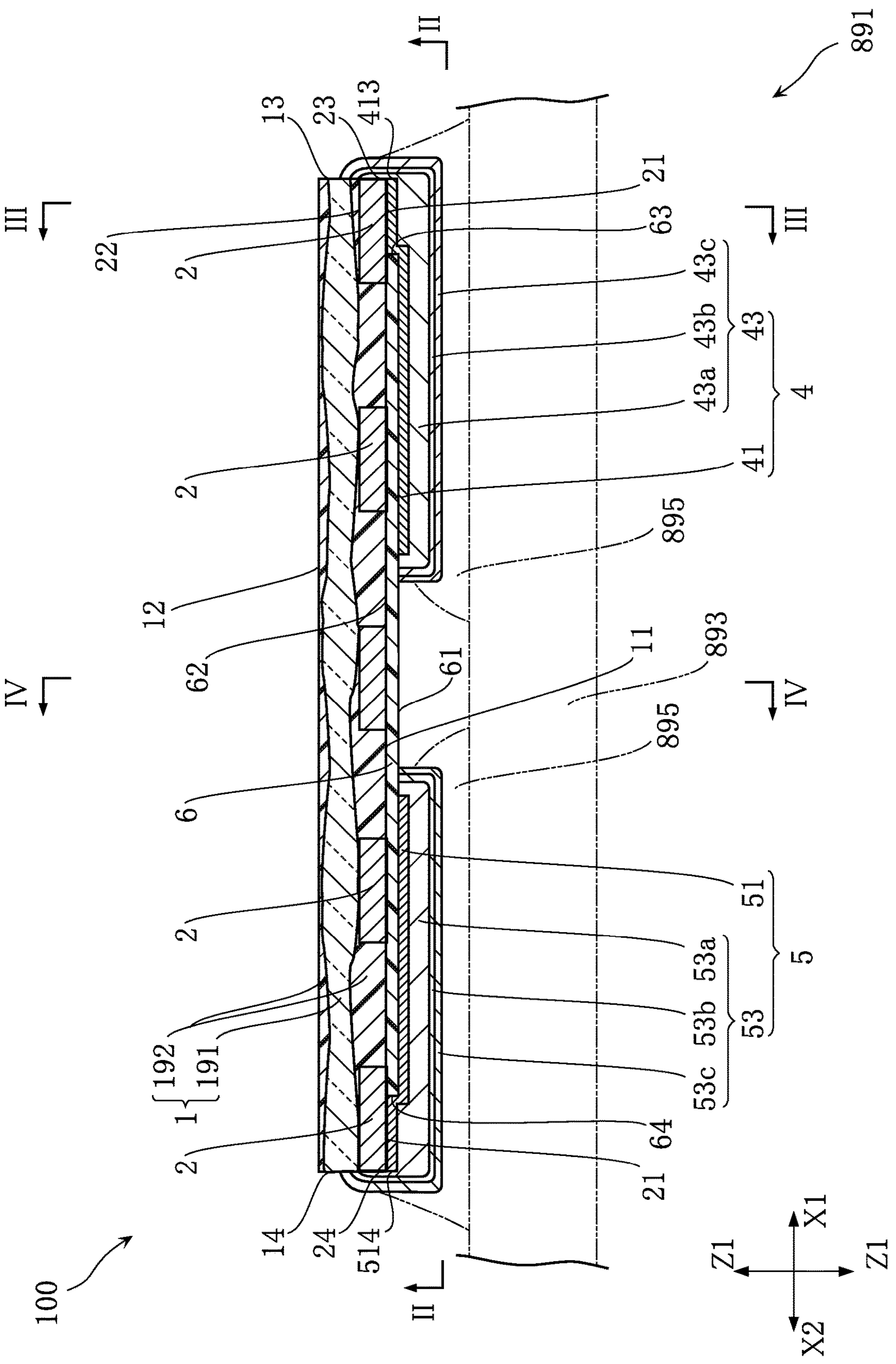
FIG. 1 is a cross-sectional view of a mounting structure of a chip resistor according to a first embodiment of the present invention.

FIG. 1 is a cross-sectional view of the mounting structure of a chip resistor according to the first embodiment of the present invention.

The chip resistor mounting structure 891 shown in FIG. 1 includes a chip resistor 100, a mounting substrate 893, and an electroconductive bonding portion 895.

The mounting substrate 893 is, for example, a printed circuit board. The mounting substrate 893 includes an insulating substrate and a non-illustrated pattern electrode formed on the insulating substrate. The insulating substrate is a glass epoxy resin substrate, for example. The chip resistor 100 is mounted on the mounting substrate 893. The bonding portion 895, which is electroconductive as noted above, is disposed between the chip resistor 100 and the mounting substrate 893. The bonding portion 895 serves to bond the chip resistor 100 and the mounting substrate 893 together. The bonding portion 895 is, for example, formed of solder.

Figure 2:
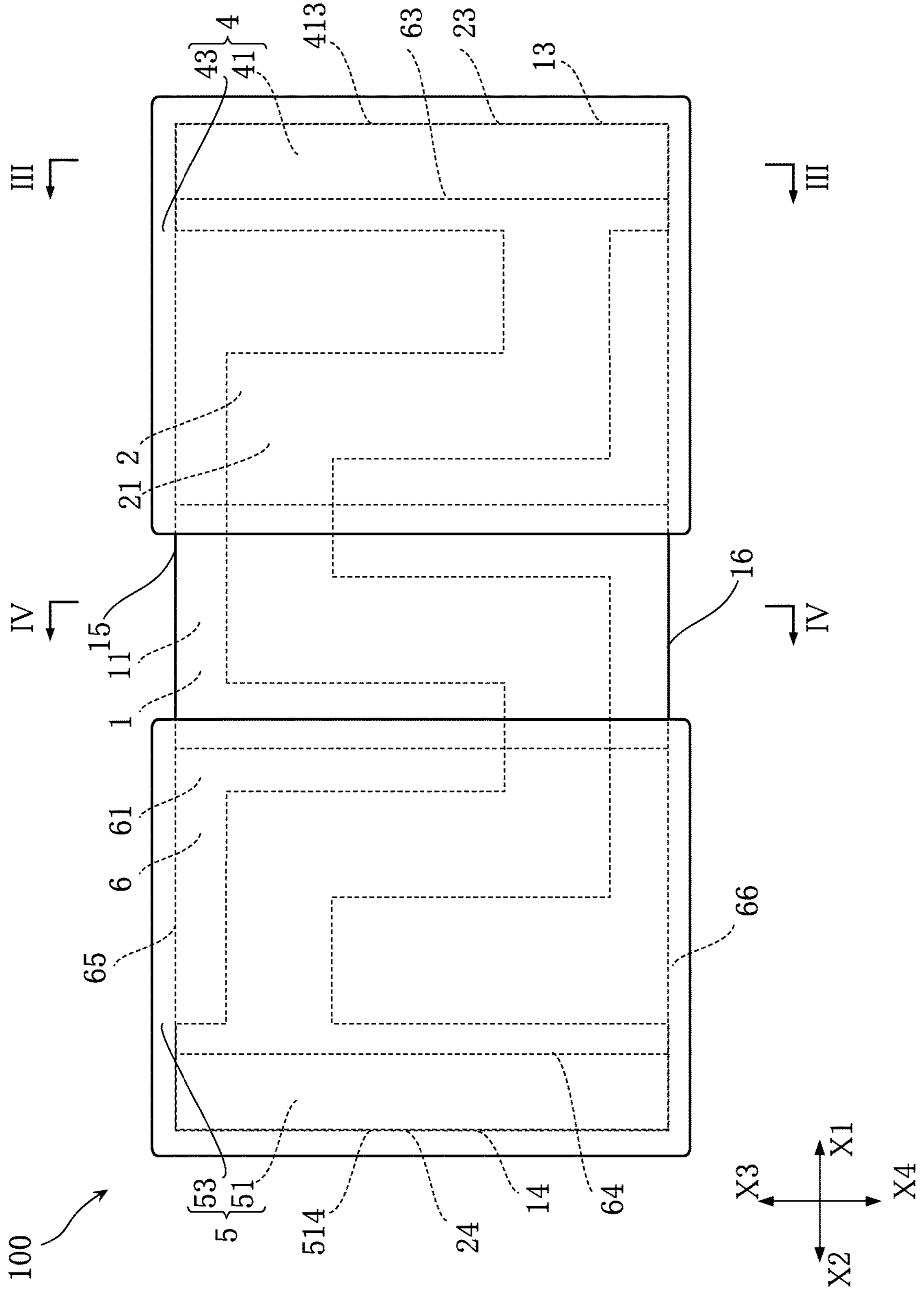
FIG. 2 is a partially seen-through plan view of the chip resistor, seen in the direction indicated by arrows II-II in FIG. 1.
Figure 3:
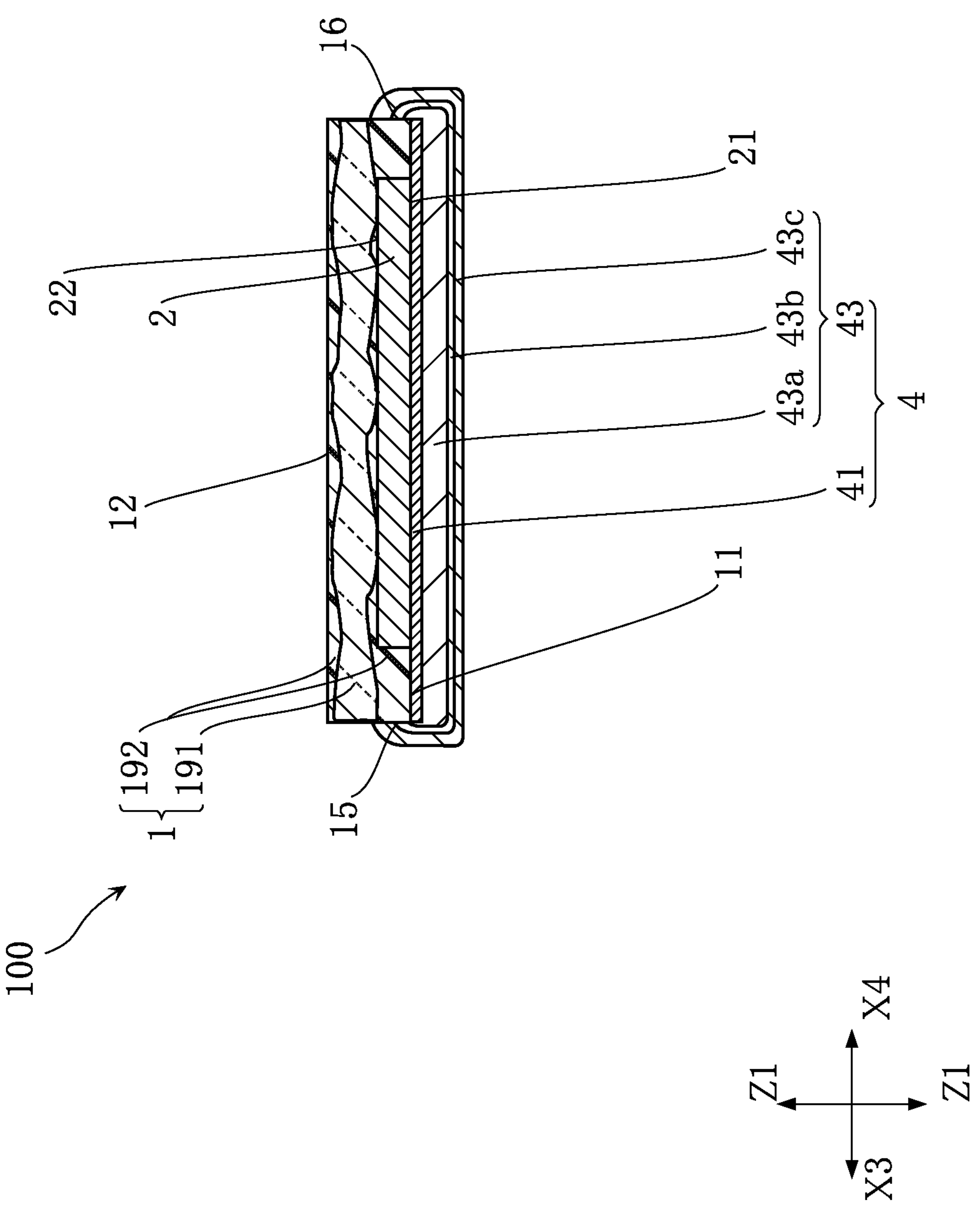
FIG. 3 is a cross-sectional view taken along a line III-III in FIGS. 1 and 2.
Figure 4:
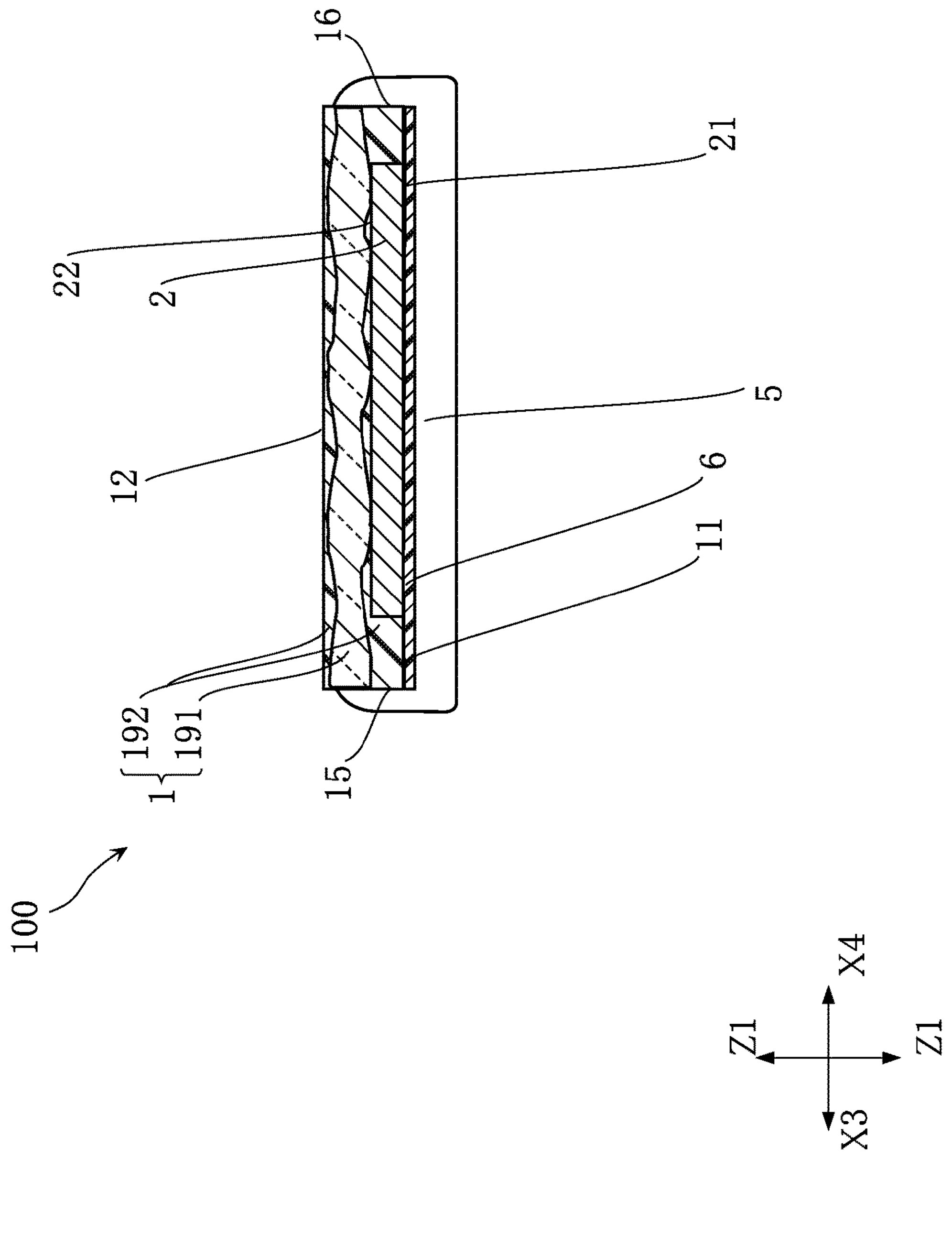
FIG. 4 is a cross-sectional view taken along a line IV-IV in FIGS. 1 and 2.
Figure 5:
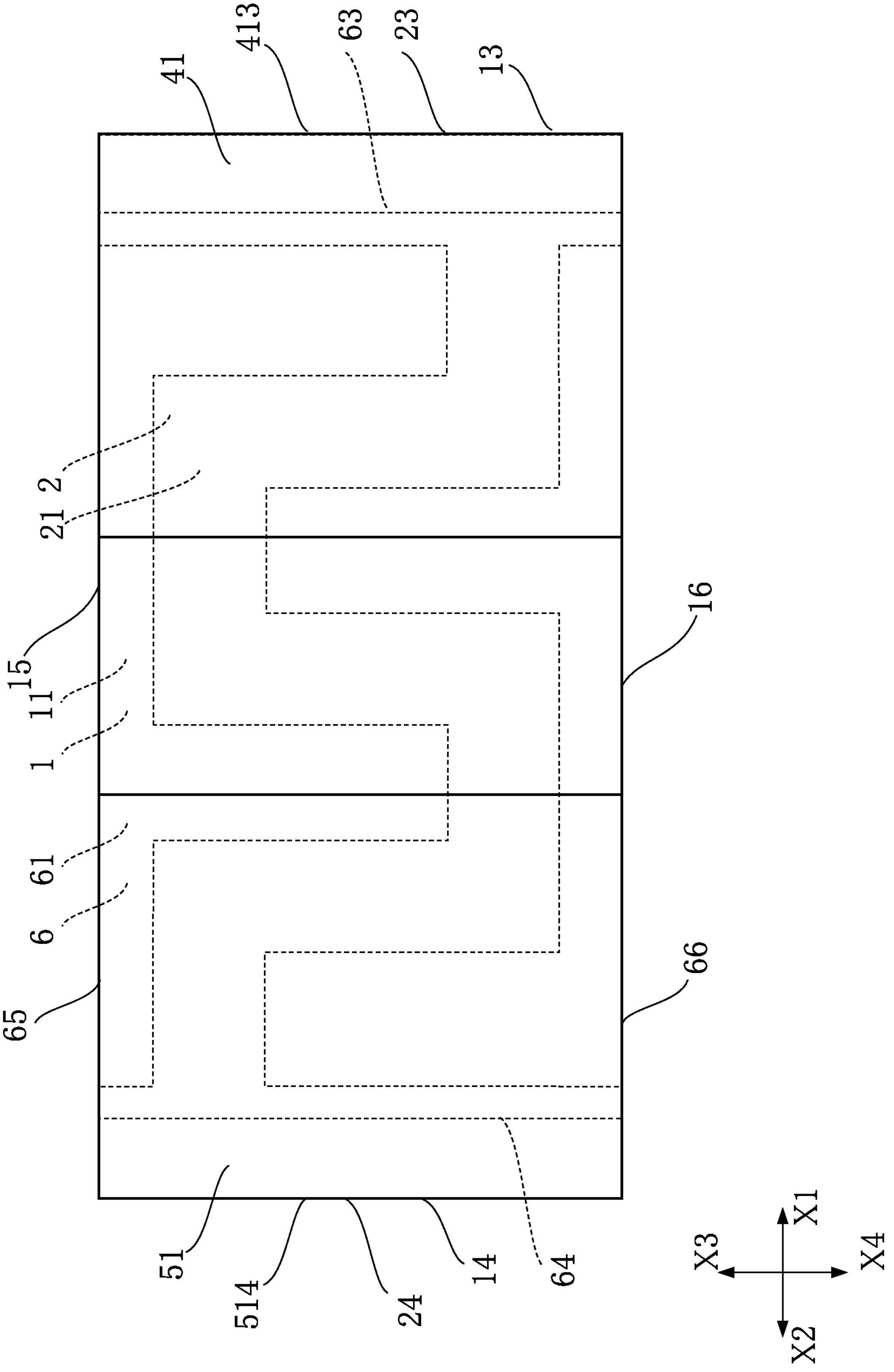
FIG. 5 is a partially seen-through plan view corresponding to FIG. 2, from which a first plated layer and a second plated layer are excluded.
Figure 6:
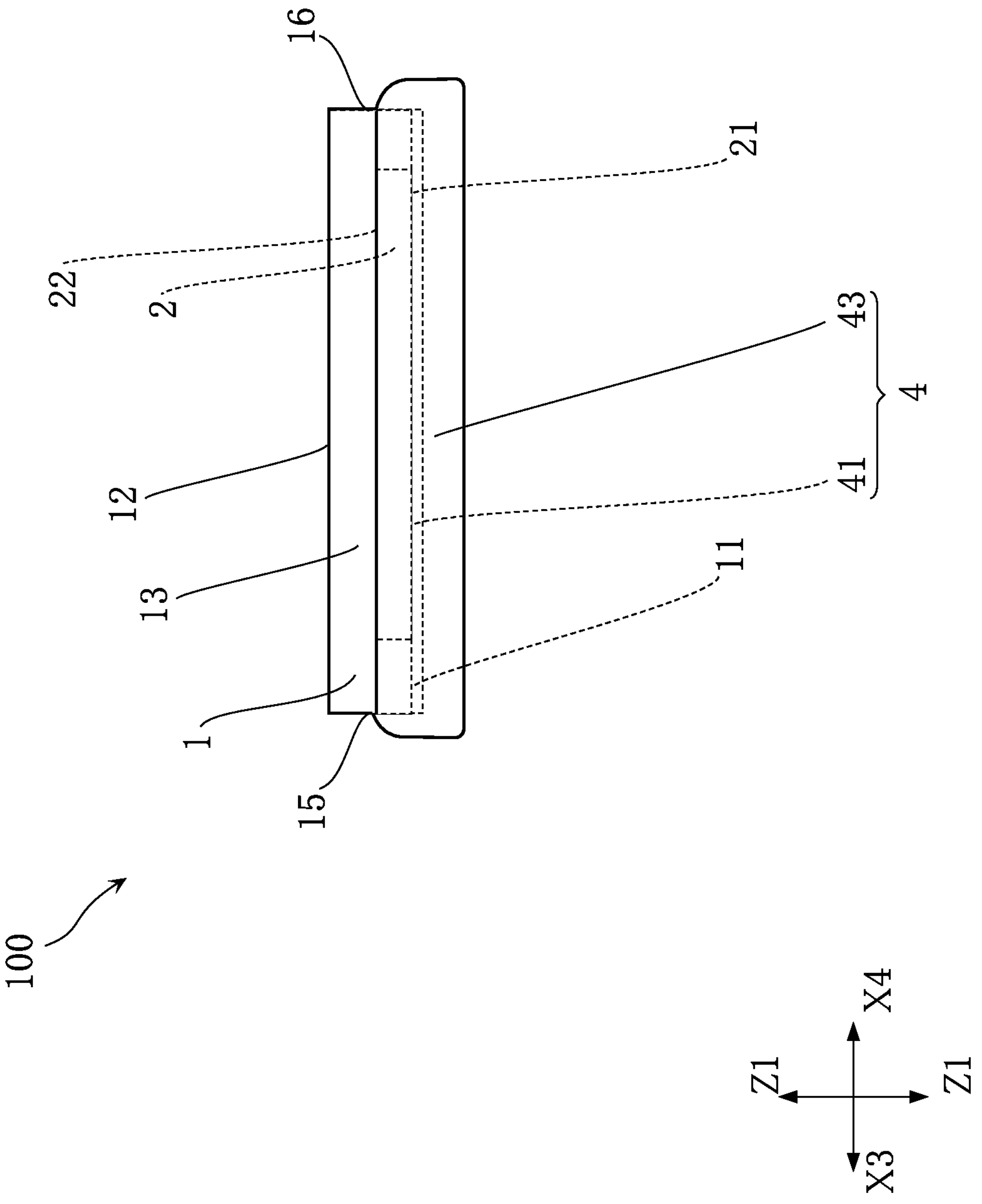
FIG. 6 is a partially seen-through right side view of the chip resistor shown in FIG. 1.
Figure 7:
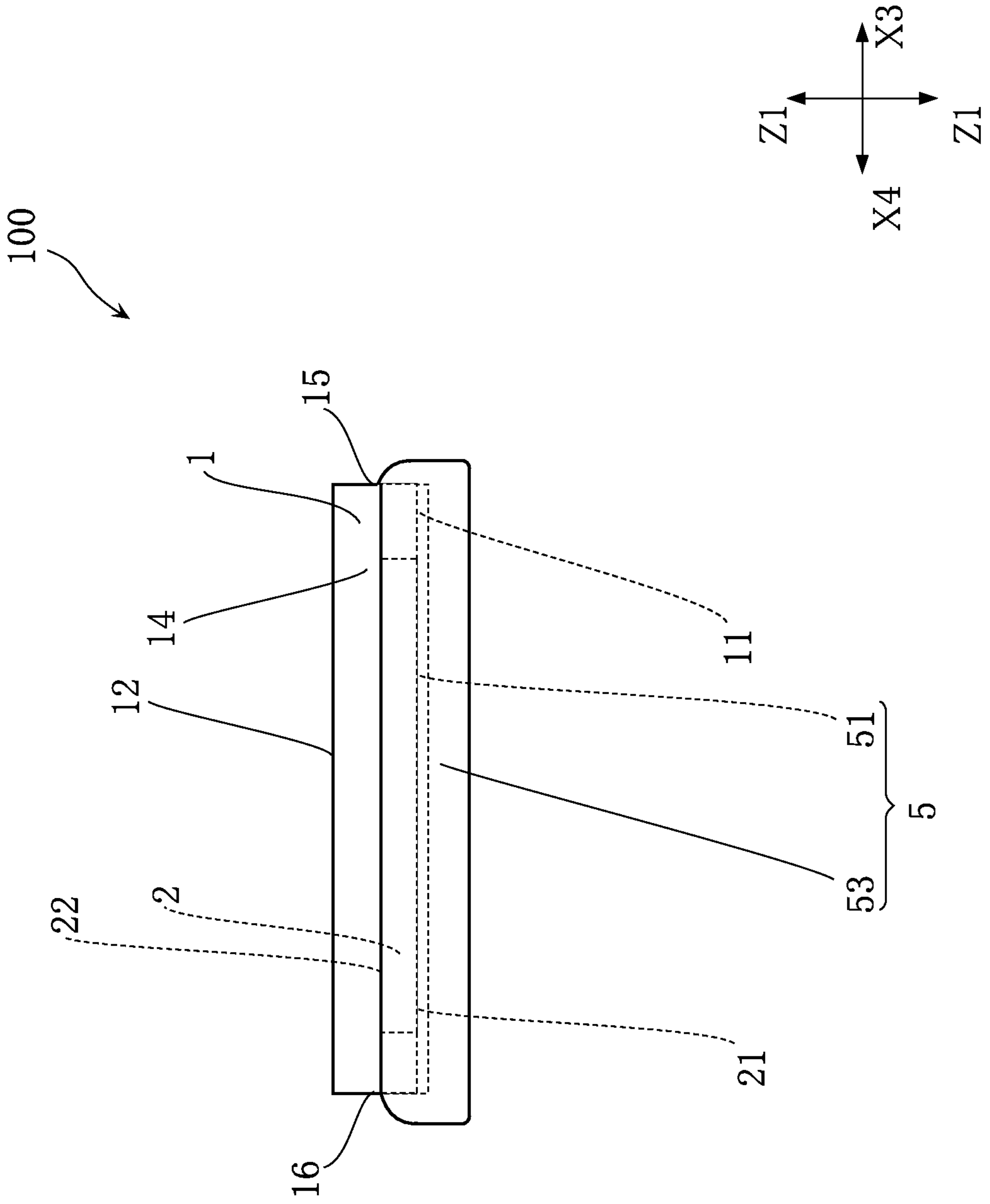
FIG. 7 is a partially seen-through left side view of the chip resistor shown in FIG. 1.
Figure 8:
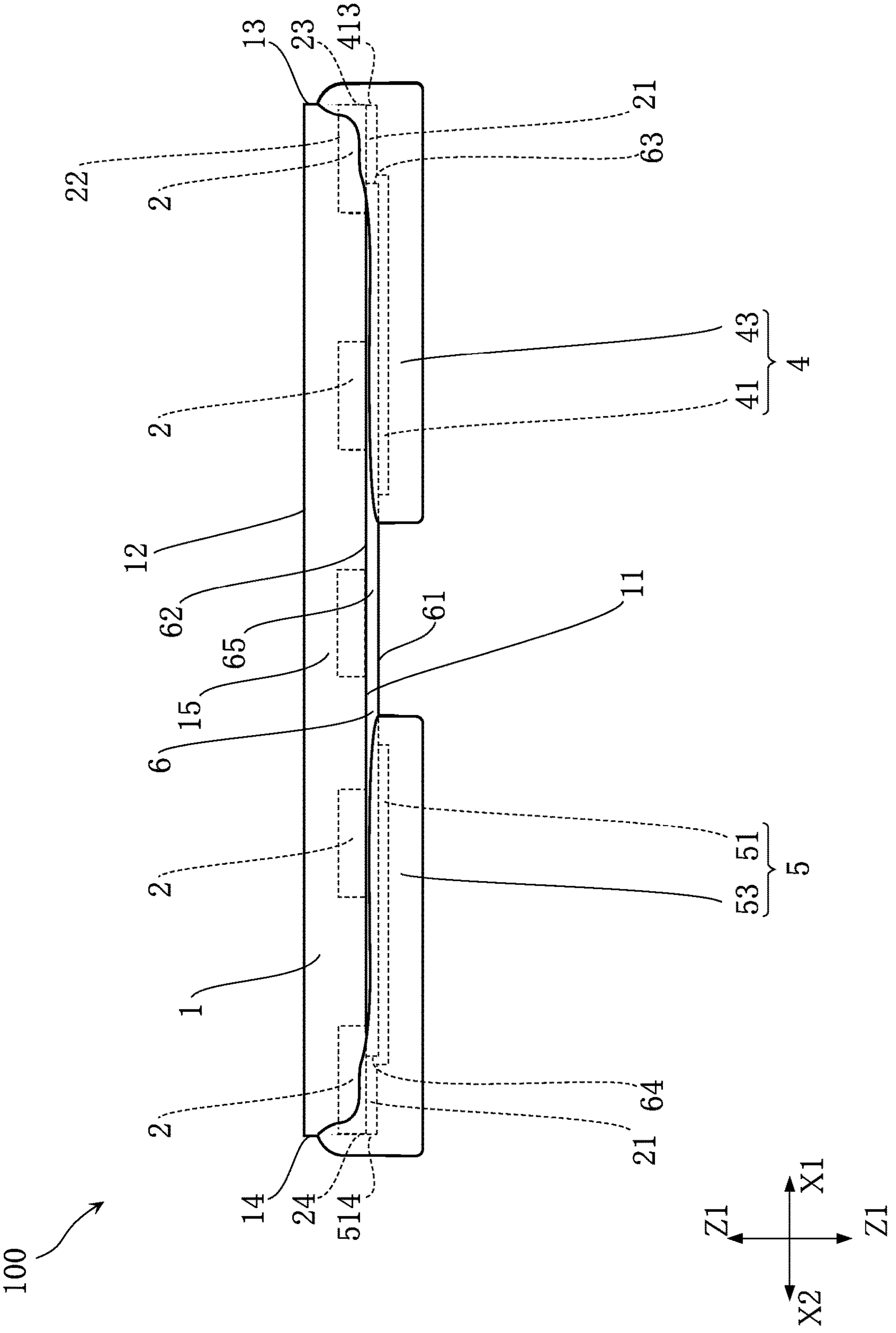
FIG. 8 is a front view of the chip resistor shown in FIG. 1.
Figure 9:
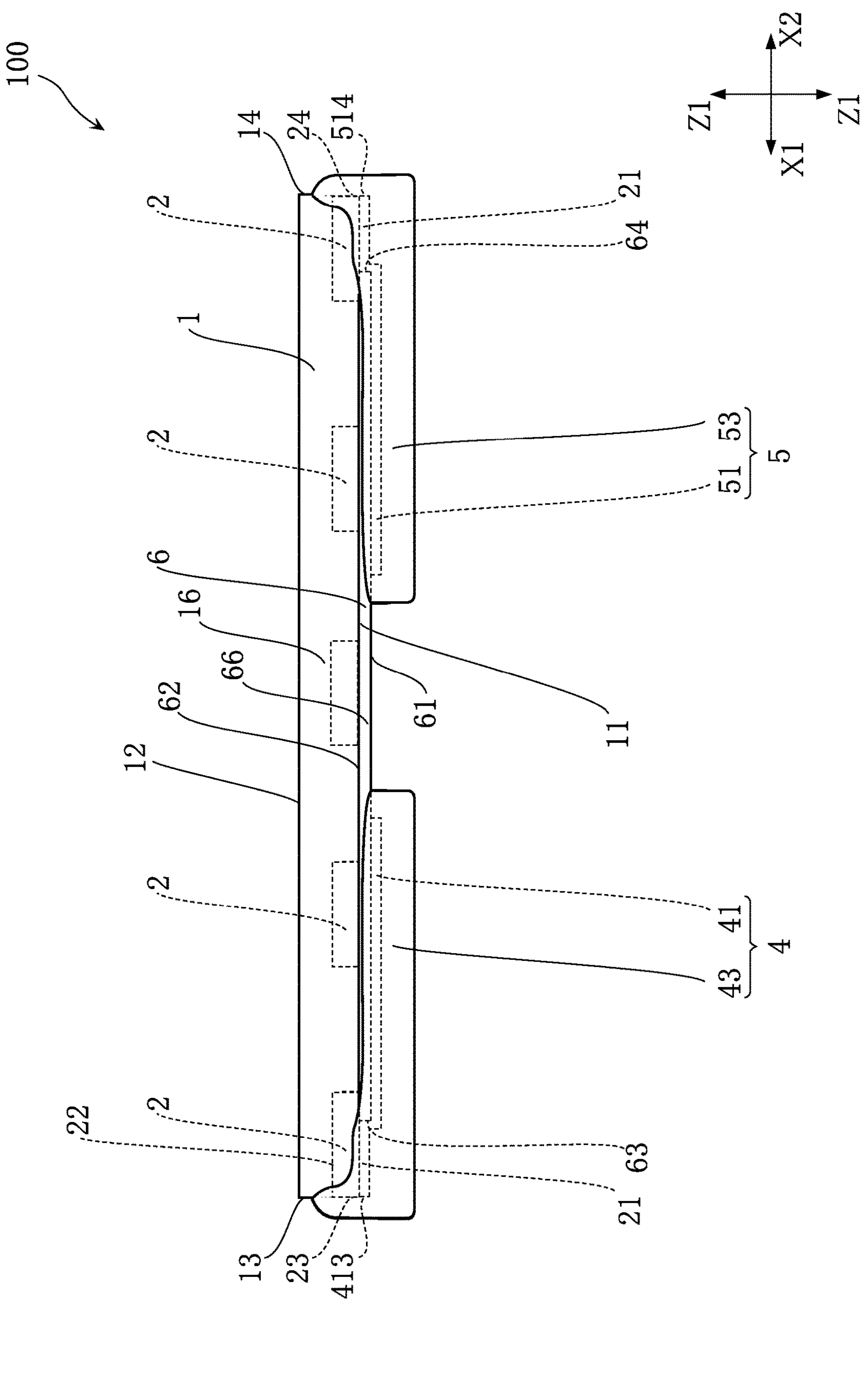
FIG. 9 is a rear view of the chip resistor shown in FIG. 1.

FIG. 2 is a partially seen-through plan view of the chip resistor, seen in the direction indicated by arrows II-II in FIG. 1. FIG. 3 is a cross-sectional view taken along a line III-III in FIGS. 1 and 2. FIG. 4 is a cross-sectional view taken along a line IV-IV in FIGS. 1 and 2. FIG. 5 is a partially seen-through plan view corresponding to FIG. 2, from which a first plated layer and a second plated layer are excluded. FIG. 6 is a partially seen-through right side view of the chip resistor shown in FIG. 1. FIG. 7 is a partially seen-through left side view of the chip resistor shown in FIG. 1. FIG. 8 is a front view of the chip resistor shown in FIG. 1. FIG. 9 is a rear view of the chip resistor shown in FIG. 1.

The chip resistor 100 shown in the drawings above includes a substrate 1, a resistor 2, a first electrode 4, a second electrode 5, and an insulating layer 6.

The substrate 1 has a plate-like shape. The substrate 1 can be either insulative or electroconductive. In the case where the substrate 1 is to be made insulative, the material to form the substrate 1 may contain a resin or a ceramic. For the resin, use may be made of an epoxy resin to form the substrate 1. For the ceramic, use may be made of $Al_2O_3$, AlN, or Sic. In the case where the substrate 1 is to be made conductive, the substrate 1 may be formed of Cu or Ag, for example. In the illustrated embodiment, the substrate 1 is made of a glass epoxy resin.

The substrate 1 includes a substrate obverse surface 11, a substrate reverse surface 12, a substrate first lateral face 13, a substrate second lateral face 14, a substrate first end face 15, and a substrate second end face 16.

The substrate obverse surface 11, the substrate reverse surface 12, the substrate first lateral face 13, the substrate second lateral face 14, the substrate first end face 15, and the substrate second end face 16 are all flat. Referring to FIG. 1, the up-down direction in the figure is defined as the "thickness direction" Z1 of the substrate 1. In FIG. 2, the "first direction" X1 runs to the right, and the "second direction" X2 runs to the left. Further, the "third direction" X3 runs upwards, and the "fourth direction" X4 runs downwards. The maximum thickness (maximum size in the thickness direction Z1) of the substrate 1 is, for example, 60 to 300 μm. The thickness direction Z1 is perpendicular to each of the first direction X1, the second direction X2, the third direction X3 and the fourth direction X4. In addition, each of the first direction X1 and the second direction X2 is perpendicular to the third direction X3 and the fourth direction X4.

The size of the chip resistor 100 in the first direction X1 is, for example, 5 to 10 mm, and the size of the chip resistor 100 in the third direction X3 is 2 to 10 mm for example.

The substrate obverse surface 11 and the substrate reverse surface 12 are directed in the opposite directions to each other. In other words, the two surfaces 11, 12 are arranged to face away from each other. The substrate first lateral face 13 is directed in the first direction X1, while the substrate second lateral face 14 is directed in the second direction X2. Thus, the substrate first lateral face 13 and the substrate second lateral face 14 are directed in opposite directions to each other. The substrate first end face 15 is directed in the third direction X3, while the substrate second end face 16 is directed in the fourth direction X4. Thus, the substrate first end face 15 and the substrate second end face 16 are directed in opposite directions to each other.

In this embodiment, the substrate 1 is a glass epoxy resin substrate as stated above. Hence, the substrate 1 includes a glass fiber portion 191 and a resin portion 192. The resin portion 192 defines the outer profile of the substrate 1. The resin portion 192 is formed of an epoxy resin, for example. The resin portion 192 constitutes the substrate obverse surface 11 and the substrate reverse surface 12.

The glass fiber portion 191 is formed of glass fiber. Specifically, the glass fiber portion 191 is formed by stacking glass fiber cloths. The glass fiber portion 191 constitutes a part of the substrate first lateral face 13, a part of the substrate second lateral face 14, a part of the substrate first end face 15, and a part of the substrate second end face 16.

According to the present invention, the substrate 1 may not be made of a glass epoxy resin. In that case, the substrate 1 may not include any glass fiber portion. As shown in FIG. 1, the resistor 2 is disposed in the substrate 1. Specifically, the resistor 2 is located on the side of the substrate obverse surface 11 of the substrate 1. The thickness (size in the thickness direction Z1) of the resistor 2 is, for example, 50 to 200 μm. In this embodiment, the resistor 2 has a serpentine shape when viewed in the thickness direction Z1. Forming the resistor 2 in the serpentine shape is preferable e.g. for increasing the resistance of the resistor 2. The resistor 2 may have a strip-like shape extending in the first direction X1 instead of the serpentine shape as in this embodiment. The resistor 2 is formed of a resistive metal material, the examples of which include manganin, zeranin, a Ni—Cr alloy, a Cu—Ni alloy, and a Fe—Cr alloy.

As shown in FIGS. 1 and 3, the resistor 2 includes a resistor obverse surface 21, a resistor reverse surface 22, a resistor first lateral face 23, and a resistor second lateral face 24. The resistor obverse surface 21, the resistor reverse surface 22, the resistor first lateral face 23, and the resistor second lateral face 24 are all flat. The resistor obverse surface 21 and the resistor reverse surface 22 are directed in opposite directions to each other. The resistor obverse surface 21 is directed in the same direction as the direction in which the substrate obverse surface 11 is directed, i.e., downward in FIG. 1. The resistor reverse surface 22 is directed in the same direction as the direction in which the substrate reverse surface 12 is directed, i.e., upward in FIG. 1. The resistor reverse surface 22 is directed to the substrate 1. The resistor first lateral face 23 is directed in the first direction X1. In this embodiment, the resistor first lateral face 23 is flush with the substrate first lateral face 13. The resistor second lateral face 24 is directed in the second direction X2. In this embodiment, the resistor second lateral face 24 is flush with the substrate second lateral face 14.

In this embodiment, the resistor 2 is embedded in the substrate 1. To be more detailed, the chip resistor 100 is configured as described below.

On the side of the substrate obverse surface 11, the resistor 2 is recessed into the substrate 1 in a direction from the substrate obverse surface 11 toward the substrate reverse surface 12, so that the entirety of the resistor 2 overlaps the substrate 1 in the thickness direction Z1 (in other words, overlaps the substrate when viewed in a direction perpendicular to the thickness direction Z1). The resistor 2 is in direct contact with the substrate 1. Further, in this embodiment in which the substrate 1 is made of glass epoxy resin, the resistor 2 is in direct contact with the glass fiber portion 191 of the substrate 1. The resistor obverse surface 21 is flush with the substrate obverse surface 11 of the substrate 1. This configuration is advantageous to forming the insulating layer 6 on the resistor obverse surface 21 and the substrate obverse surface 11, as will be described later. The resistor reverse surface 22 is in direct contact with the substrate 1. Further, in this embodiment in which the substrate 1 is the glass epoxy resin substrate, the resistor reverse surface 22 is in direct contact with the glass fiber portion 191 of the substrate 1.

According to the present invention, the resistor 2 and the substrate 1 may not be in direct contact with each other as in this embodiment. For example, the resistor 2 may be embedded in the substrate 1 with a bonding layer disposed therebetween. Also, the resistor 2 may not be in direct contact with the glass fiber portion 191.

The insulating layer 6 is formed so as to cover the resistor 2. The insulating layer 6 is in direct contact with the resistor 2 and the substrate 1. The insulating layer 6 is in direct contact with the resistor obverse surface 21 of the resistor 2 and the substrate obverse surface 11 of the substrate 1. The resistor 2 includes portions that are spaced apart from each other in the first direction X1 (or the second direction X2, for that matter), and that are left uncovered by the insulating layer 6. The insulating layer 6 is, for example, formed of a thermosetting material. The size of the insulating layer 6 in the X3-X4 direction is equal to the size of the substrate 1 in the X3-X4 direction. The maximum thickness (maximum size in the thickness direction Z1) of the insulating layer 6 is, for example, 20 to 60 μm. The insulating layer 6 is formed of a resin, for example. It is preferable to employ a material having high heat conductance to form the insulating layer 6, in order to facilitate heat generated in the resistor 2 to be dissipated to outside of the chip resistor 100. It is preferable that the heat conductance of the insulating layer 6 is higher than that of the material constituting the substrate 1 (in this embodiment, material constituting the resin portion 192). Preferably, the heat conductance of the insulating layer 6 is 1.0 W/(m·K) to 5.0 W/(m·K).

The insulating layer 6 includes an insulating layer obverse surface 61, an insulating layer reverse surface 62, an insulating layer first lateral face 63, an insulating layer second lateral face 64, an insulating layer first end face 65, and an insulating layer second end face 66.

The insulating layer obverse surface 61 and the insulating layer reverse surface 62 are directed in opposite directions to each other. The insulating layer obverse surface 61 is directed in the same direction as the direction in which the resistor obverse surface 21 is directed, i.e., downward in FIG. 1. The first electrode 4 and the second electrode 5 are provided on the insulating layer obverse surface 61. A part of the insulating layer obverse surface 61, more specifically a region of the insulating layer obverse surface 61 between the first electrode 4 and the second electrode 5, is exposed from the first electrode 4 and the second electrode 5. The insulating layer reverse surface 62 is directed in the same direction as the direction in which the resistor reverse surface 22 is directed, i.e., upward in FIG. 1. In this embodiment, the insulating layer reverse surface 62 is in direct contact with the resistor 2 and the substrate 1. Specifically, the insulating layer reverse surface 62 is in direct contact with the resistor obverse surface 21 and the substrate obverse surface 11. The insulating layer first lateral face 63 is directed in the first direction X1. The insulating layer second lateral face 64 is directed in the second direction X2. The insulating layer first end face 65 is directed in the third direction X3. In this embodiment, the insulating layer first end face 65 is flush with the substrate first end face 15. The insulating layer second end face 66 is directed in the fourth direction X4. The insulating layer second end face 66 is flush with the substrate second end face 16.

The first electrode 4 is electrically connected to the resistor 2. The first electrode 4 serves to supply power to the resistor 2 from the mounting substrate 893 on which the chip resistor 100 is mounted. The first electrode 4 is in direct contact with the resistor 2. In this embodiment, the first electrode 4 is in direct contact with the resistor obverse surface 21 of the resistor 2. In this embodiment, further, the first electrode 4 is formed so as to cover the resistor first lateral face 23 of the resistor 2 and the insulating layer 6. In this embodiment, the insulating layer 6 is disposed between the first electrode 4 and the resistor 2. In this embodiment, still further, the first electrode 4 is not formed so as to cover the substrate reverse surface 12. However, the first electrode 4 may be formed so as to cover the substrate reverse surface 12, unlike in this embodiment. In the mounting structure 891, as shown in FIG. 1, the first electrode 4 is in direct contact with the bonding portion 895, to be electrically connected to a non-illustrated interconnect pattern formed on the mounting substrate 893, through the bonding portion 895.

The first electrode 4 includes a first underlying layer 41 and a first plated layer 43.

The first underlying layer 41 is in direct contact with the resistor 2. In this embodiment, the first underlying layer 41 serves as the base for forming the first plated layer 43 on the insulating layer 6 by a plating method. The first underlying layer 41 is in direct contact with the portion of the resistor obverse surface 21 exposed from the insulating layer 6. The first underlying layer 41 is formed so as to overlap the resistor 2 when viewed in the thickness direction Z1 of the substrate 1. In addition, the first underlying layer 41 includes a portion separated from the resistor 2 in the thickness direction Z1. The insulating layer 6 is disposed between the first underlying layer 41 and the resistor 2. The first underlying layer 41 is disposed between the first plated layer 43 and the insulating layer 6. In this embodiment, it is preferable that the first underlying layer 41 has a large size in the first direction X1. Preferably, for example, the size of the first underlying layer 41 in the first direction X1 is equal to or larger than a quarter of the size of the resistor 2 in the first direction X1, and more preferably, equal to or larger than one third of the size of the resistor 2 in the first direction X1. The size of the first underlying layer 41 in the first direction X1 is, for example, 600 to 3200 μm. The first underlying layer 41 is thinner than the resistor 2. The first underlying layer 41 may be formed by physical vapor deposition (PVD), chemical vapor deposition (CVD), or printing. In this embodiment, the first underlying layer 41 is formed by sputtering. The thickness of the first underlying layer 41 is, for example, 100 to 500 nm. The first underlying layer 41 may contain Ni and Cr, for example.

The first underlying layer 41 includes an underlying layer first lateral face 413. The underlying layer first lateral face 413 is directed in the first direction X1. In this embodiment, the underlying layer first lateral face 413 is flush with the substrate first lateral face 13 and the resistor first lateral face 23.

The first plated layer 43 is formed so as to directly cover the first underlying layer 41. The first plated layer 43 is provided on the resistor 2, and is in direct contact with the insulating layer 6. The first plated layer 43 is in direct contact with a portion of the insulating layer 6 that is offset in the direction X2 from the first underlying layer 41. In the chip resistor 100 not mounted yet on the mounting substrate 893, the first plated layer 43 is outwardly exposed. Therefore, as shown in FIG. 1, in the mounting structure 891 the first plated layer 43 is in direct contact with the bonding portion 895, thus to be electrically connected to the non-illustrated interconnect pattern formed on the mounting substrate 893, through the bonding portion 895. In this embodiment, further, the first plated layer 43 is formed so as to cover the resistor first lateral face 23 of the resistor 2. Such a configuration is preferable because of allowing a solder fillet to be formed on the bonding portion 895.

More specifically, in this embodiment the first plated layer 43 includes a Cu layer 43*a*, a Ni layer 43*b*, and a Sn layer 43*c*. The Cu layer 43*a* is formed so as to directly cover the first underlying layer 41. The Ni layer 43*b* directly covers the Cu layer 43*a*. The Sn layer 43*c* directly covers the Ni layer 43*b*, and is outwardly exposed. In the mounting structure 891 of the chip resistor 100, the bonding portion 895 (in this embodiment, solder) is bonded onto the Sn layer 43*c*. For example, the Cu layer 43*a* has a thickness of 10 to 50 μm, the Ni layer 43*b* has a thickness of 1 to 10 μm, and the Sn layer 43*c* has a thickness of 1 to 10 μm. According to the present invention, the first plated layer 43 may not include the Ni layer 43*b* as in this embodiment.

The second electrode 5 is offset in the direction X2 from the first electrode 4. The second electrode 5 is electrically connected to the resistor 2. The second electrode 5 serves to supply power to the resistor 2 from the mounting substrate 893 on which the chip resistor 100 is mounted. The second electrode 5 is in direct contact with the resistor 2. In this embodiment, the second electrode 5 is in direct contact with the resistor obverse surface 21 of the resistor 2. In this embodiment, further, the second electrode 5 is formed so as to cover the resistor second lateral face 24 of the resistor 2 and the insulating layer 6. In this embodiment, the insulating layer 6 is disposed between the second electrode 5 and the resistor 2. In this embodiment, still further, the second electrode 5 is not formed so as to cover the substrate reverse surface 12. However, the second electrode 5 may be formed so as to cover the substrate reverse surface 12, unlike in this embodiment. In the mounting structure 891, as shown in FIG. 1, the second electrode 5 is in direct contact with the bonding portion 895, thus to be electrically connected to the non-illustrated interconnect pattern formed on the mounting substrate 893, through the bonding portion 895.

The second electrode 5 includes a second underlying layer 51 and a second plated layer 53.

The second underlying layer 51 is in direct contact with the resistor 2. In this embodiment, the second underlying layer 51 serves as the base for forming the second plated layer 53 on the insulating layer 6 by a plating method. The second underlying layer 51 is in direct contact with the portion of the resistor obverse surface 21 exposed from the insulating layer 6. The insulating layer 6 is disposed between the second underlying layer 51 and the resistor 2. The second underlying layer 51 is disposed between the second plated layer 53 and the layer 6. In this embodiment, it is preferable that the second underlying layer 51 has a large size in the first direction X1 (or the second direction X2). Preferably, for example, the size of the second underlying layer 51 in the first direction X1 is equal to or larger than a quarter of the size of the resistor 2 in the first direction X1, and more preferably, equal to or larger than one third of the size of the resistor 2 in the first direction X1. The size of the second underlying layer 51 in the first direction X1 is, for example, 600 to 3200 μm. The second underlying layer 51 is thinner than the resistor 2. The second underlying layer 51 may be formed by PVD, CVD, or printing. In this embodiment, the second underlying layer 51 is formed by sputtering. The thickness of the second underlying layer 51 is, for example, 100 to 500 nm. The second underlying layer 51 may contain Ni and Cr, for example.

The second underlying layer 51 includes an underlying layer second lateral face 514. The underlying layer second lateral face 514 is directed in the second direction X2. In this embodiment, the underlying layer second lateral face 514 is flush with the substrate second lateral face 14 and the resistor second lateral face 24.

The second plated layer 53 is formed so as to directly cover the second underlying layer 51. The second plated layer 53 is provided on the resistor 2, and is in direct contact with the insulating layer 6. The second plated layer 53 is in direct contact with a portion of the insulating layer 6 located on the X1-side with respect to the second underlying layer 51. In the chip resistor 100 not mounted yet on the substrate 893, the second plated layer 53 is mounting outwardly exposed. Therefore, as shown in FIG. 1, in the mounting structure 891 the second plated layer 53 is in direct contact with the bonding portion 895, thus to be electrically connected to the non-illustrated interconnect pattern formed on the mounting substrate 893, through the bonding portion 895. In this embodiment, further, the second plated layer 53 is formed so as to cover the resistor second lateral face 24 of the resistor 2. Such a configuration is preferable because of allowing a solder fillet to be formed on the bonding portion 895.

More specifically, in this embodiment the second plated layer 53 includes a Cu layer 53*a*, a Ni layer 53*b*, and a Sn layer 53*c*. The Cu layer 53*a* is formed so as to directly cover the second underlying layer 51. The Ni layer 53*b* directly covers the Cu layer 53*a*. The Sn layer 53*c* directly covers the Ni layer 53*b*, and is outwardly exposed. In the mounting structure 891 of the chip resistor 100, the bonding portion 895 (in this embodiment, solder) is bonded onto the Sn layer 53*c*. For example, the Cu layer 53*a* has a thickness of 10 to 50 μm, the Ni layer 53*b* has a thickness of 1 to 10 μm, and the Sn layer 53*c* has a thickness of 1 to 10 μm. According to the present invention, the second plated layer 53 may not include the Ni layer 53*b* as in this embodiment A manufacturing method of the chip resistor 100 will be described below.

Figure 10:
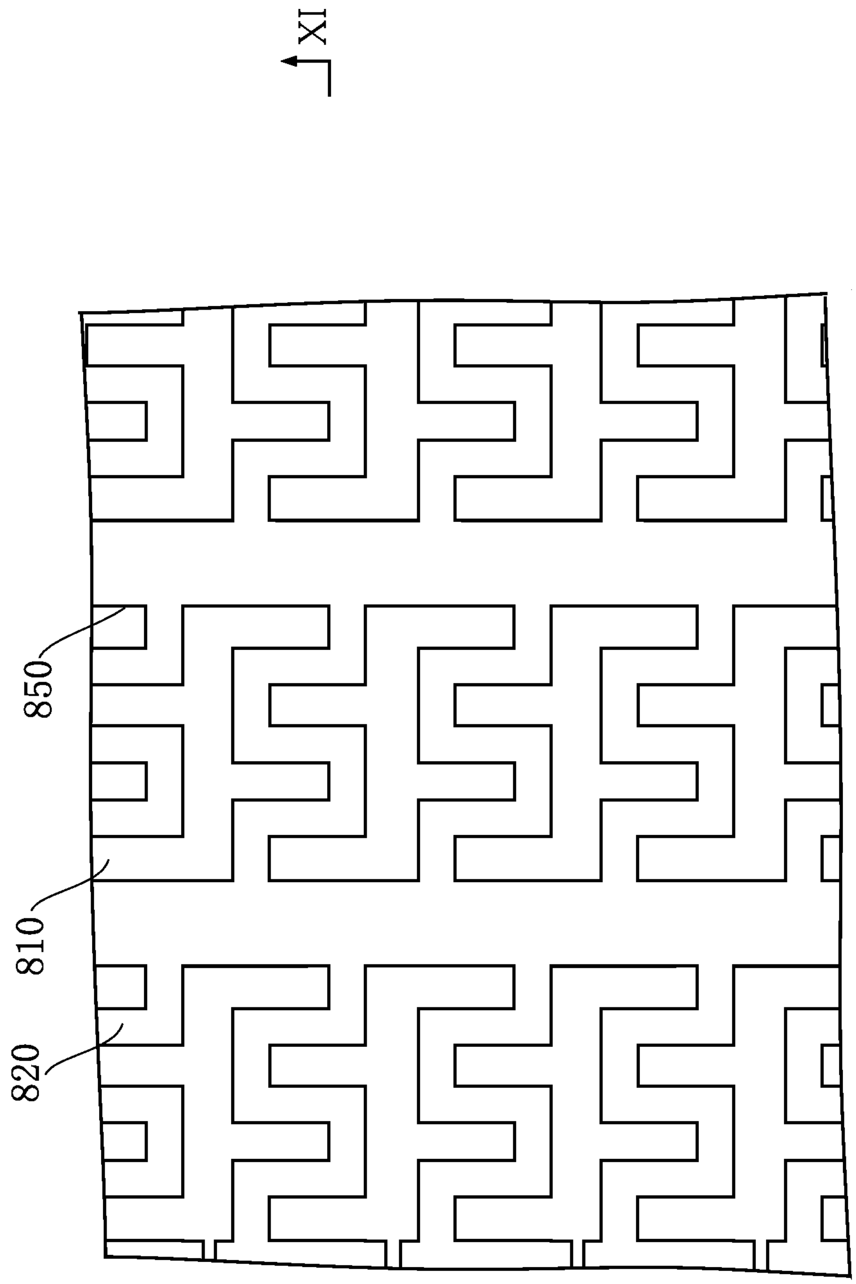
FIG. 10 is a plan view for explaining a manufacturing process of the chip resistor shown in FIG. 1.
Figure 11:
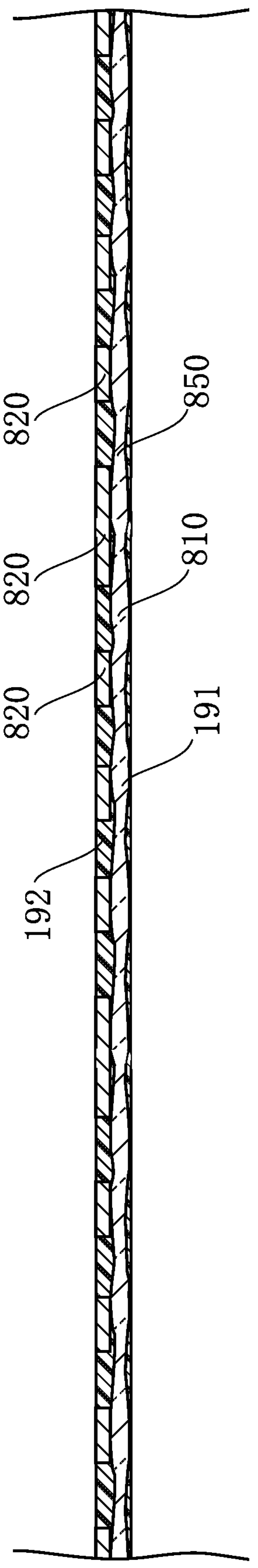
FIG. 11 is a cross-sectional view taken along a line XI-XI in FIG. 10.

Referring to FIGS. 10 and 11, a composite sheet 850 is first prepared. The composite sheet 850 is composed of a substrate sheet 810 and a resistor block 820. In this embodiment, the resistor block 820 is embedded in the substrate sheet 810 in the composite sheet 850. The composite sheet 850 is formed, for example, by vacuum pressing. In the composite sheet 850, the resistor block 820 is firmly fixed to the substrate sheet 810.

The substrate sheet 810 is the material to be formed into the substrate 1. The resistor block 820 is the material to be formed into the resistor 2. Accordingly, the resistor block 820 is in direct contact with the glass fiber portion 191, in the composite sheet 850.

The resistor block 820 is composed of a plurality of sections, each of which is to be formed into the resistor 2. In this embodiment, a plurality of serpentine-shaped sections are formed in advance by etching or punching in the resistor block 820, to form the serpentine-shaped resistor 2.

Then the resistance of the resistor 2 in the resistor block 820 is adjusted. The adjustment of the resistance of the resistor 2 is performed, for example, by grinding the resistor block 820.

Figure 12:
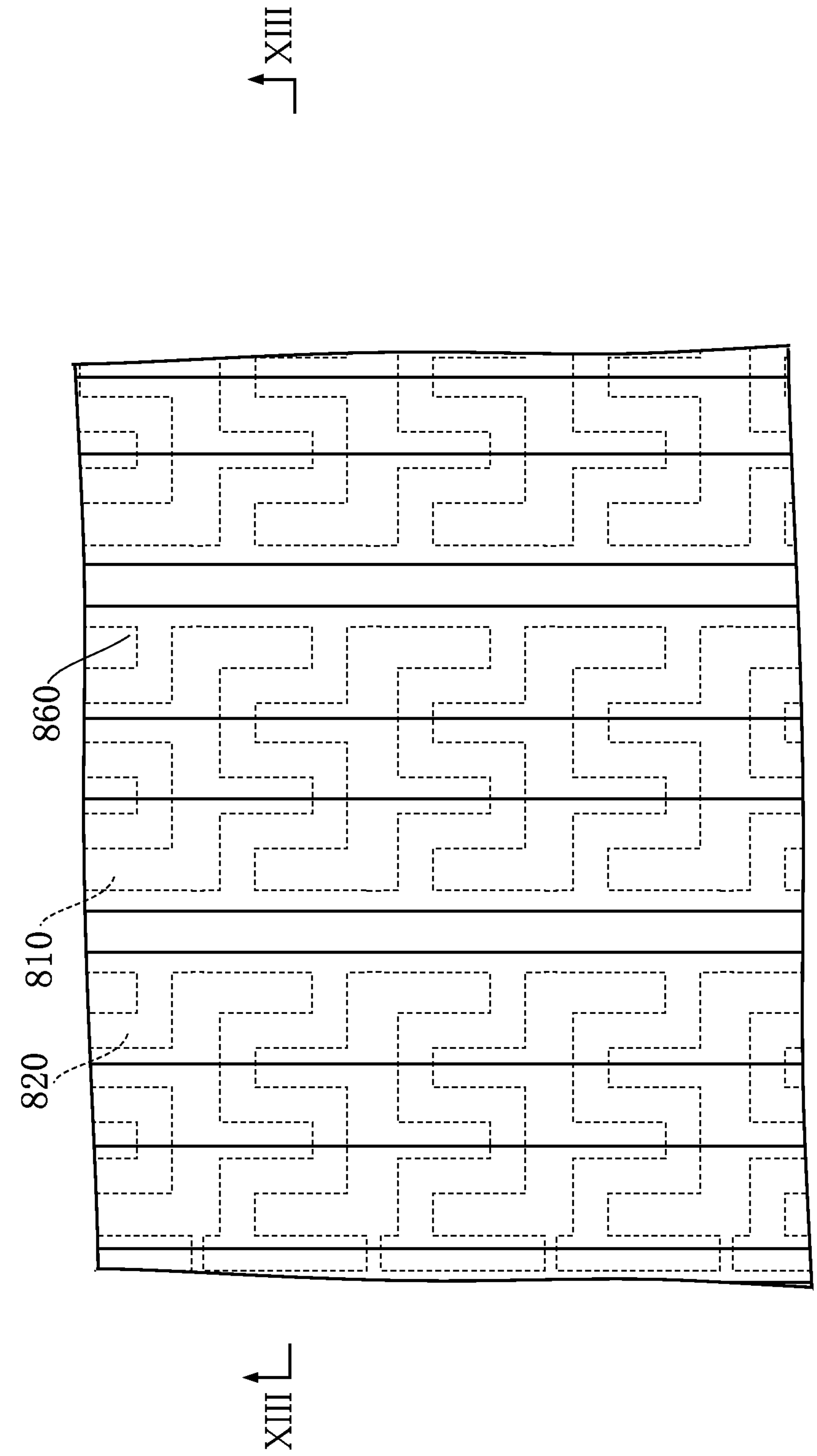
FIG. 12 is a rear view for explaining the manufacturing process that follows FIG. 10.
Figure 13:
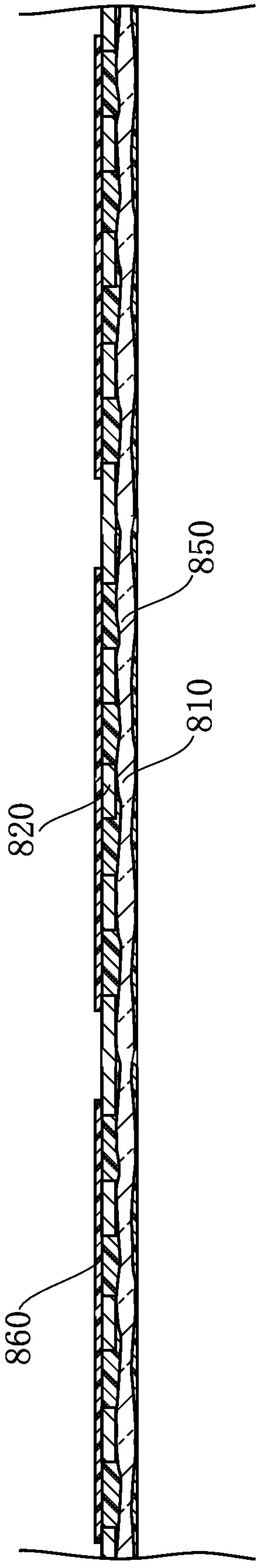
FIG. 13 is a cross-sectional view taken along a line XIII-XIII in FIG. 12.

Proceeding to FIGS. 12 and 13, an insulating film 860 is formed. The insulating film 860 is the material to be formed into the insulating layer 6. The insulating film 860 is formed as a plurality of strips extending in one direction, for example by printing or application. A part of the resistor block 820 is exposed from the insulating film 860.

Figure 14:
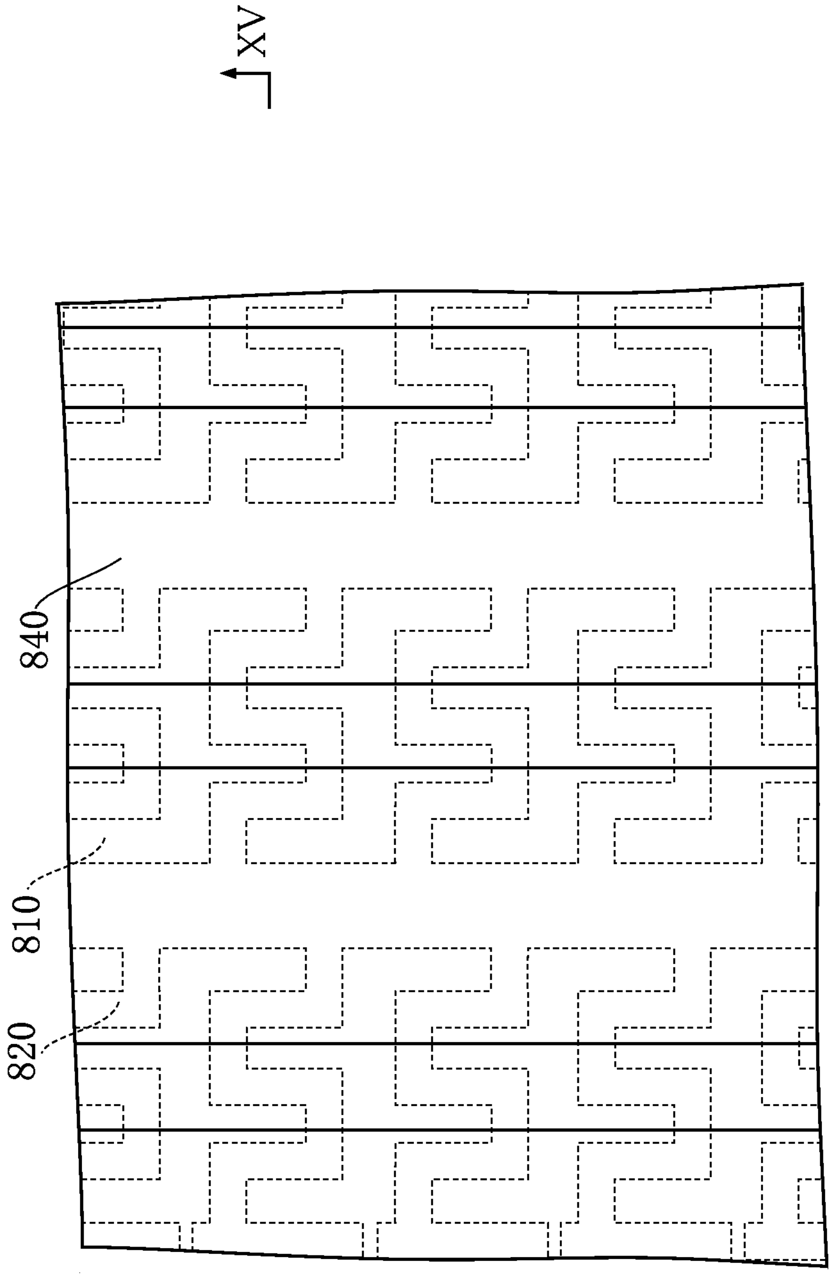
FIG. 14 is a rear view for explaining the manufacturing process that follows FIG. 12.
Figure 15:
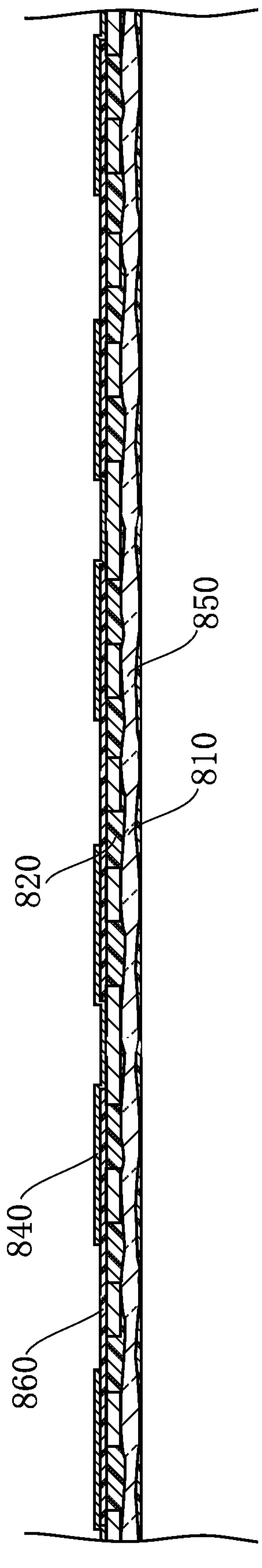
FIG. 15 is a cross-sectional view taken along a line XV-XV in FIG. 14.

Proceeding to FIGS. 14 and 15, a conductive material 840 is formed on the resistor block 820. The conductive material 840 is to be formed into the first underlying layer 41 or the second underlying layer 51. The deposition of the conductive material 840 may be performed through a PVD or CVD process. In the case of forming the conductive material 840 by PVD, for example sputtering may be performed. In this embodiment, the conductive material 840 is formed in a strip shape along the insulating film 860, and therefore a part of the insulating film 860 is exposed from the conductive material 840. To form the conductive material 840 in a strip shape, for example a masking method may be adopted. The conductive material 840 may be formed of Ni or Cr, for example.

Figure 16:
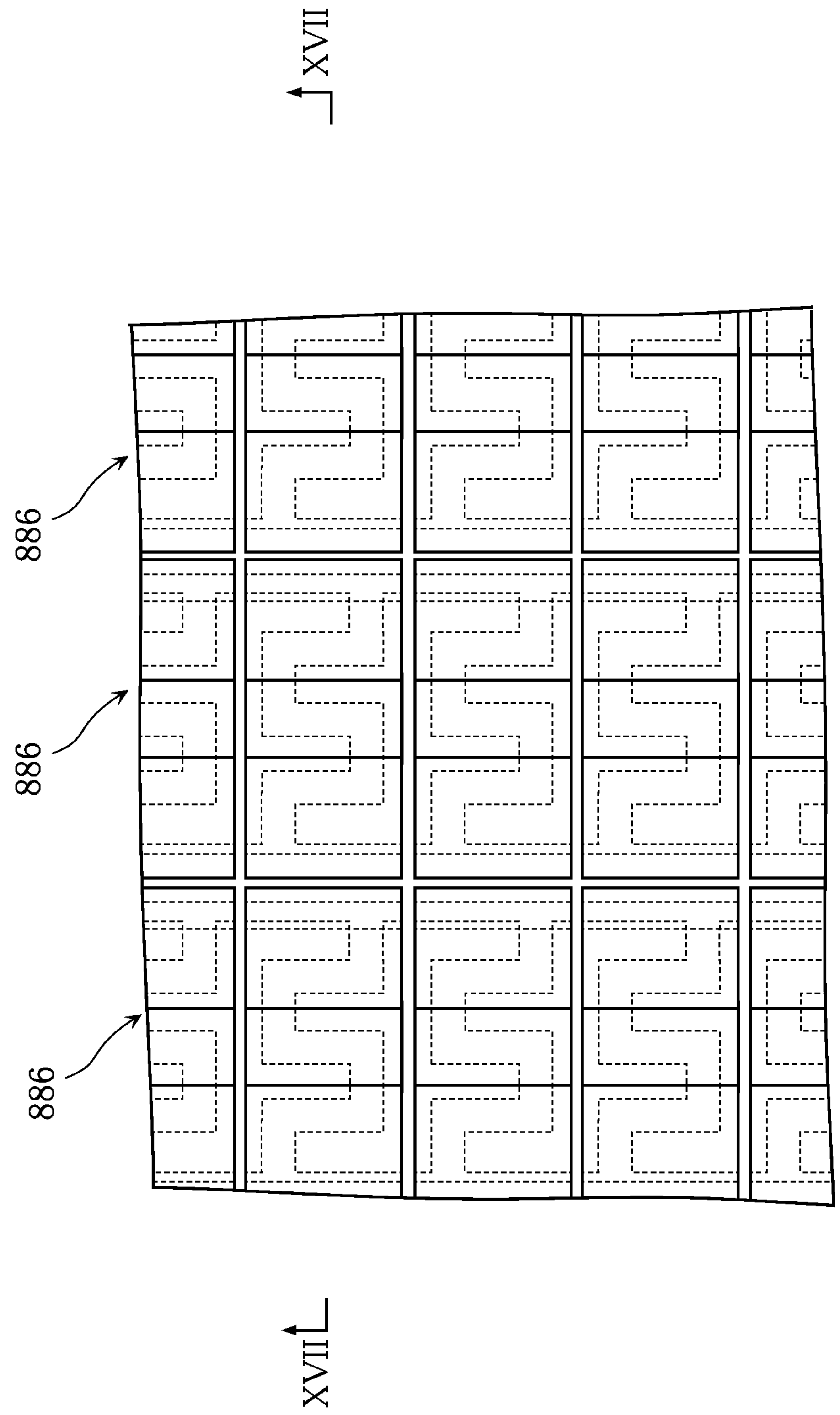
FIG. 16 is a rear view for explaining the manufacturing process that follows FIG. 14.
Figure 17:
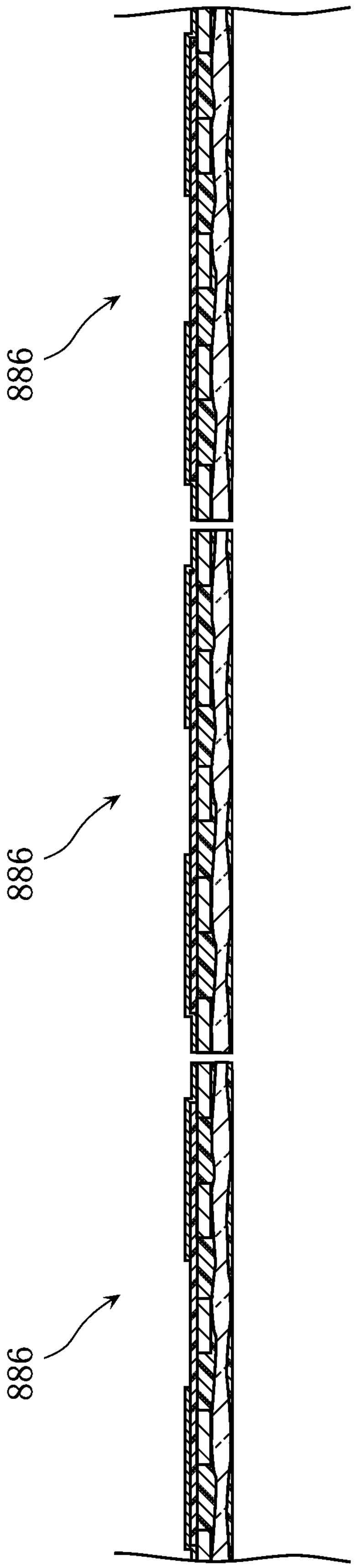
FIG. 17 is a cross-sectional view taken along a line XVII-XVII in FIG. 16.

As shown in FIGS. 16 and 17, the resistor block 820 is cut into a plurality of individual pieces 886. In this embodiment, the composite sheet 850 (resistor block 820 and substrate sheet 810) is collectively cut. To obtain the individual pieces 886, for example a punching or dicing method may be adopted. In this embodiment, punching is performed to obtain the individual pieces 886.

The cutting process to obtain the individual pieces 886 provides the substrate first lateral face 13, the substrate second lateral face 14, the substrate first end face 15, the substrate second end face 16, the resistor first lateral face 23, the resistor second lateral face 24, the underlying layer first lateral face 413, the underlying layer second lateral face 514, the insulating layer first end face 65, and the insulating layer second end face 66. By cutting the substrate sheet 810 and the resistor block 820 at a time, the substrate first lateral face 13, the resistor first lateral face 23, and the underlying layer first lateral face 413 can be made flush with each other. Likewise, cutting the substrate sheet 810 and the resistor block 820 at a time makes the substrate second lateral face 14, the resistor second lateral face 24, and the underlying layer second lateral face 514 flush with each other. Likewise, the above cutting process makes the substrate first end face 15 and the insulating layer first end face 65 flush with each other. Further, the above cutting process makes the substrate second end face 16 and the insulating layer second end face 66 flush with each other.

Then the first plated layer 43 (Cu layer 43*a*, Ni layer 43*b*, and Sn layer 43*c*) and the second plated layer 53 (Cu layer 53*a*, Ni layer 53*b*, and Sn layer 53*c*) shown in FIG. 1 are formed on each of the individual pieces 886. To form the first plated layer 43 and the second plated layer 53, for example a barrel plating method may be employed. Throughout the foregoing process, the chip resistor 100 can be obtained.

This embodiment provides the following advantages, for example.

In this embodiment, the resistor 2 is embedded in the substrate 1. Such a configuration ensures that the overall size of the substrate 1 and the resistor 2 in the thickness direction Z1 of the substrate 1 are to be reduced. Therefore, the chip resistor 100 can be formed in a reduced thickness.

To manufacture the chip resistor 100, the composite sheet 850 formed of the substrate sheet 810 in which the resistor block 820 is embedded can be employed. Therefore, it suffices to prepare the composite sheet 850 in order to manufacture the chip resistor 100, and the step of adhering the resistor block 820 onto the substrate sheet 810 can be excluded. As a result, the production efficiency of the chip resistor 100 can be improved.

In this embodiment, the insulating layer 6 has a heat conductance as high as 1.0 W/(m·K) to 5.0 W/(m·K). Such a property facilitates the heat generated in the resistor 2 to be dissipated to outside of the chip resistor 100 through the insulating layer 6. Therefore, the chip resistor 100 can be prevented from being overheated.

In this embodiment, the first electrode 4 includes the first underlying layer 41 in direct contact with the resistor 2 and the first plated layer 43 covering the first underlying layer 41. The insulating layer 6 is disposed between the first underlying layer 41 and the resistor 2. The mentioned configuration facilitates the first plated layer 43 to be formed on the insulating layer 6. Therefore, the first electrode 4 can be formed with a larger area. The increase in area of the first electrode 4 facilitates the heat generated in the resistor 2 to be discharged to the mounting substrate 893 through the first electrode 4. Thus, the heat dissipation performance of the chip resistor 100 can be improved.

In this embodiment, the substrate 1 is formed of an insulative material. In this case, there is no need to employ a Cu electrode which is relatively thick. Accordingly, the step of processing the Cu electrode can be skipped, and resultantly the production efficiency of the chip resistor 100 can be improved.

In this embodiment, the substrate 1 and the mounting substrate 893 are both glass epoxy resin substrates. Accordingly, the substrate 1 and the mounting substrate 893 have generally the same thermal expansion coefficient. When the substrate 1 is thermally expanded during the use of the chip resistor 100, the mounting substrate 893 is supposed to thermally expand at the same rate. Such a configuration prevents a malfunction that may arise from the impact of thermal expansion during the use of the chip resistor 100, for example fracture of the chip resistor 100.

First Variation of First Embodiment

Figure 18:
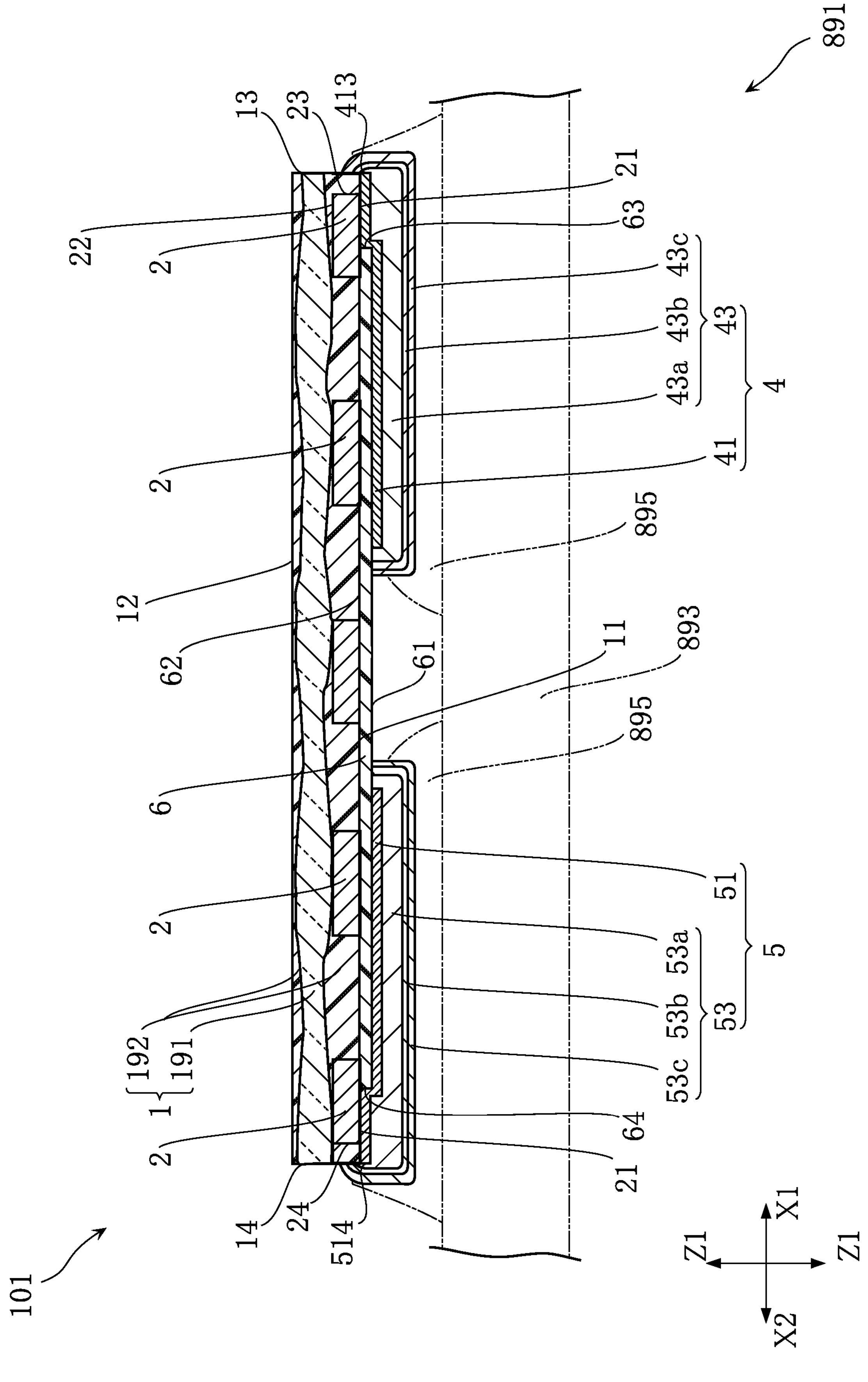
FIG. 18 is a cross-sectional showing a first variation of the first embodiment.

Referring to FIG. 18, a first variation of the first embodiment of the present invention will be described.

FIG. 18 is a cross-sectional view showing the first variation of the first embodiment.

A chip resistor 101 shown in FIG. 18 is different from the chip resistor 100 in that the resistor first lateral face 23 and the resistor second lateral face 24 of the resistor 2 are covered with the substrate 1. The remaining portions are configured in the same way as those of the chip resistor 100, and hence the description will not be repeated.

The chip resistor 101 can also provide the same advantages as those provided by the chip resistor 100.

Figure 19:
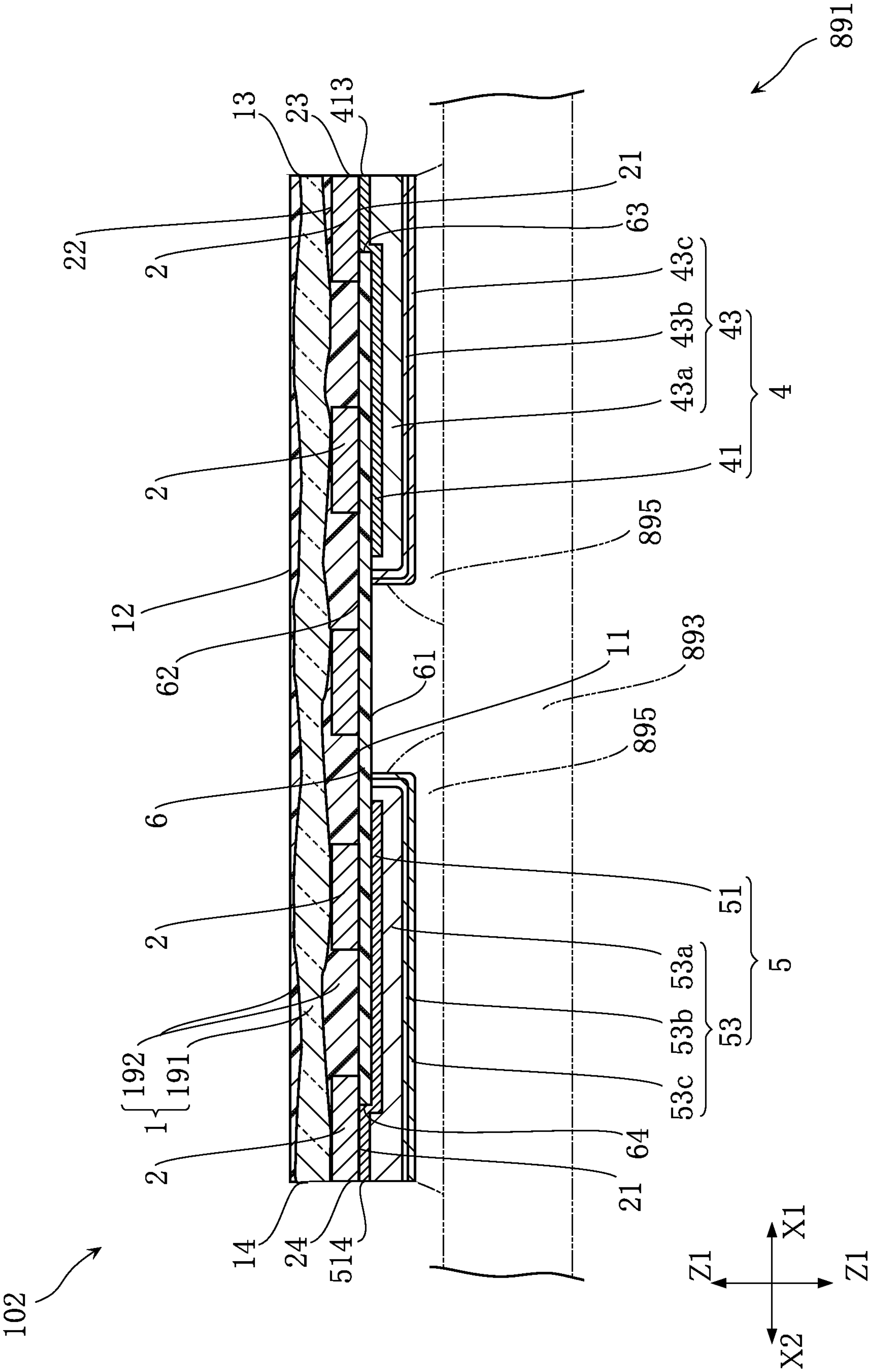
FIG. 19 is a cross-sectional showing a second variation of the first embodiment.

Referring to FIG. 19, a second variation of the first embodiment of the present invention will be described.

FIG. 19 is a cross-sectional view showing the second variation of the first embodiment.

A chip resistor 102 shown in FIG. 19 is different from the chip resistor 100 in that the first plated layer 43 includes a face that is flush with the underlying layer first lateral face 413 of the first underlying layer 41, and that the second plated layer 53 includes a face that is flush with the underlying layer first lateral face 514 of the second underlying layer 51. The remaining portions are configured in the same way as those of the chip resistor 100, and hence the description will not be repeated. Here, to manufacture the chip resistor 102, the plated layer is formed in advance of the cutting process of the composite sheet 850 described with reference to FIGS. 16 and 17.

The chip resistor 102 can also provide the same advantages as those provided by the chip resistor 100.

Referring now to FIG. 20 through FIG. 39, a second embodiment of the present invention will be described.

Figure 20:
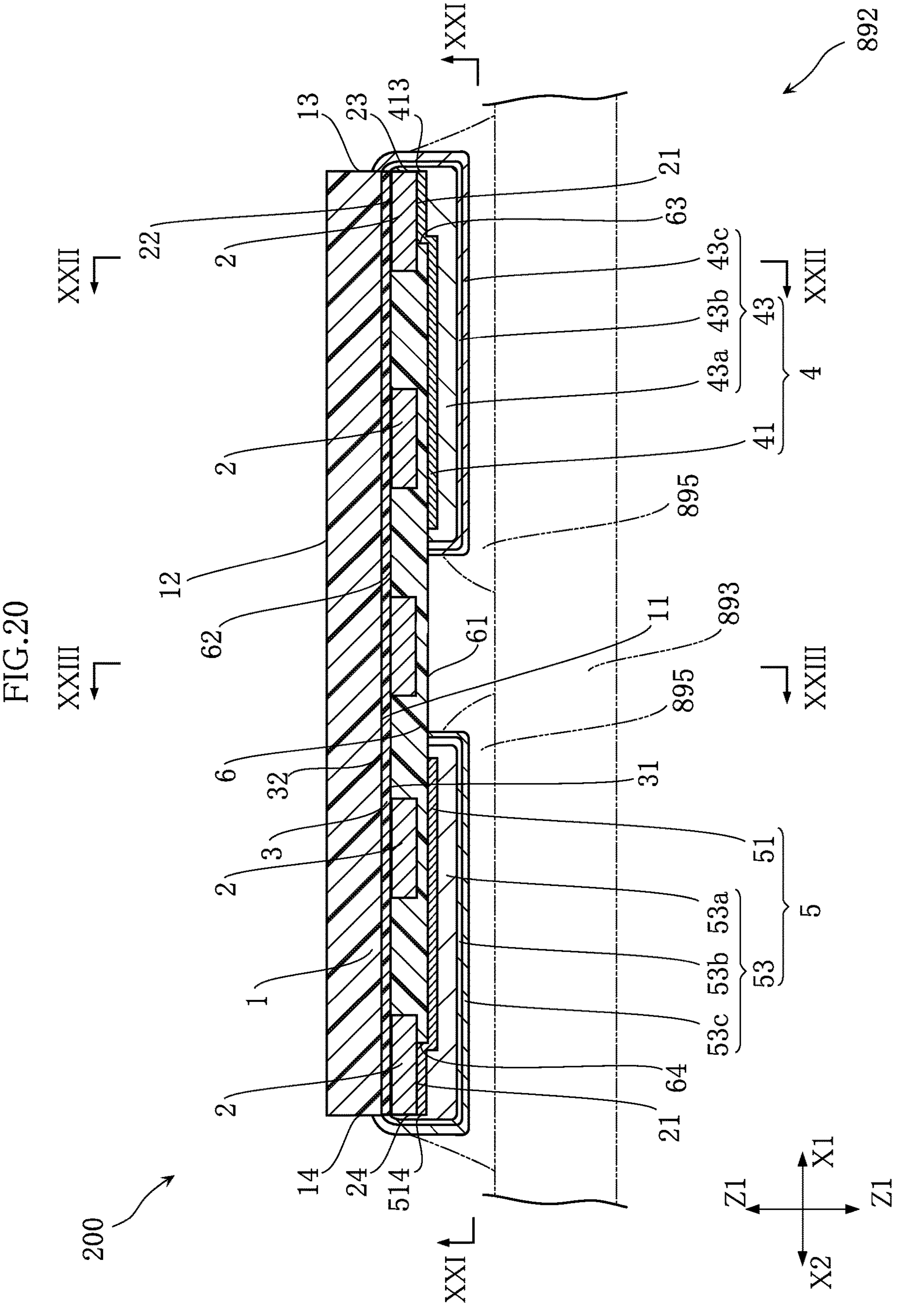
FIG. 20 is a cross-sectional view of a mounting structure of a chip resistor according to a second embodiment of the present invention.

FIG. 20 is a cross-sectional view of a mounting structure of a chip resistor according to the second embodiment of the present invention.

A chip resistor mounting structure 892 shown in FIG. 20 includes a chip resistor 200, the mounting substrate 893, and the bonding portion 895.

The mounting substrate 893 and the bonding portion 895 are configured in the same way as those of the first embodiment, and hence the description will not be repeated in this embodiment.

Figure 21:
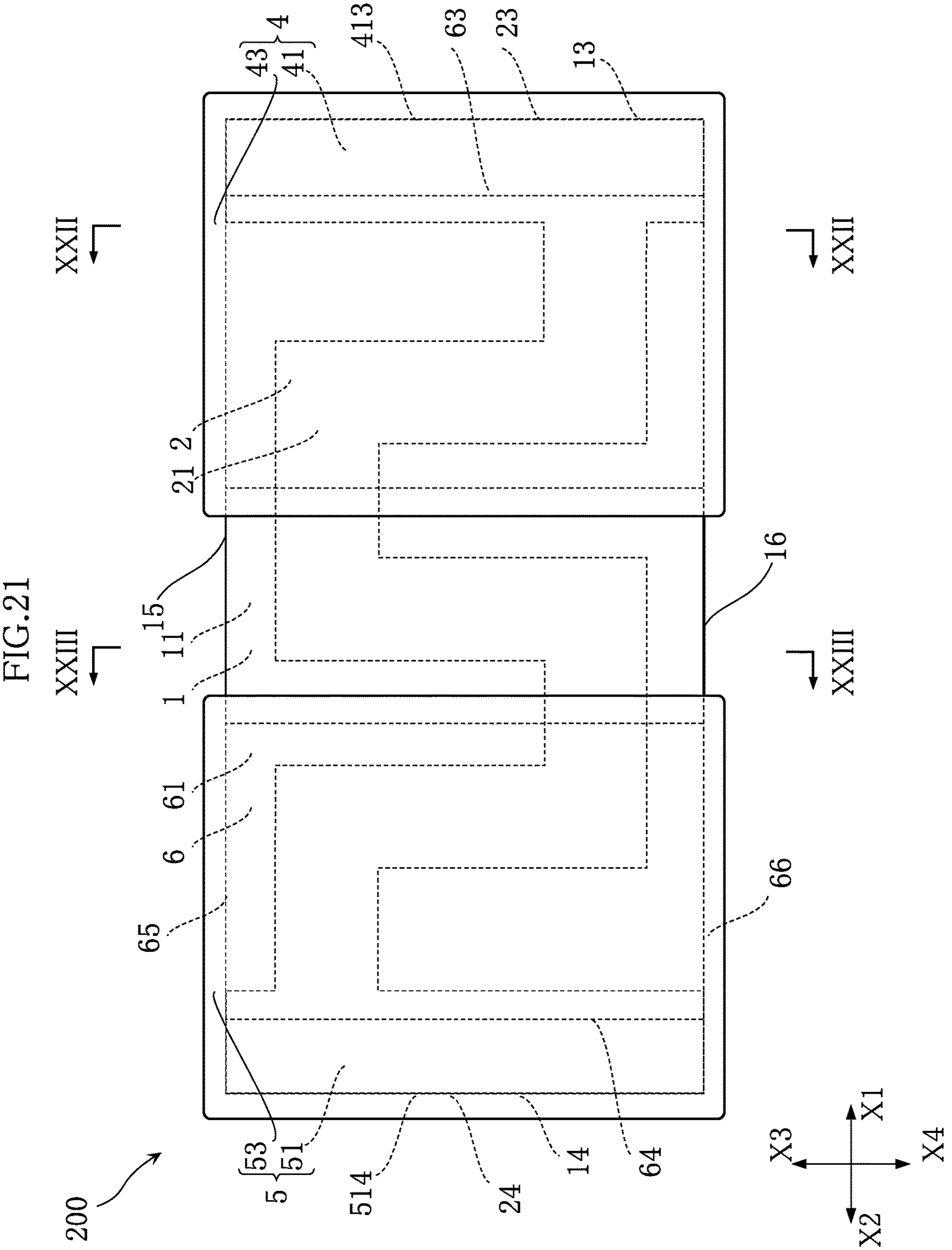
FIG. 21 is a partially seen-through plan view of the chip resistor, seen in the direction indicated by arrows XXI-XXI in FIG. 20.
Figure 22:
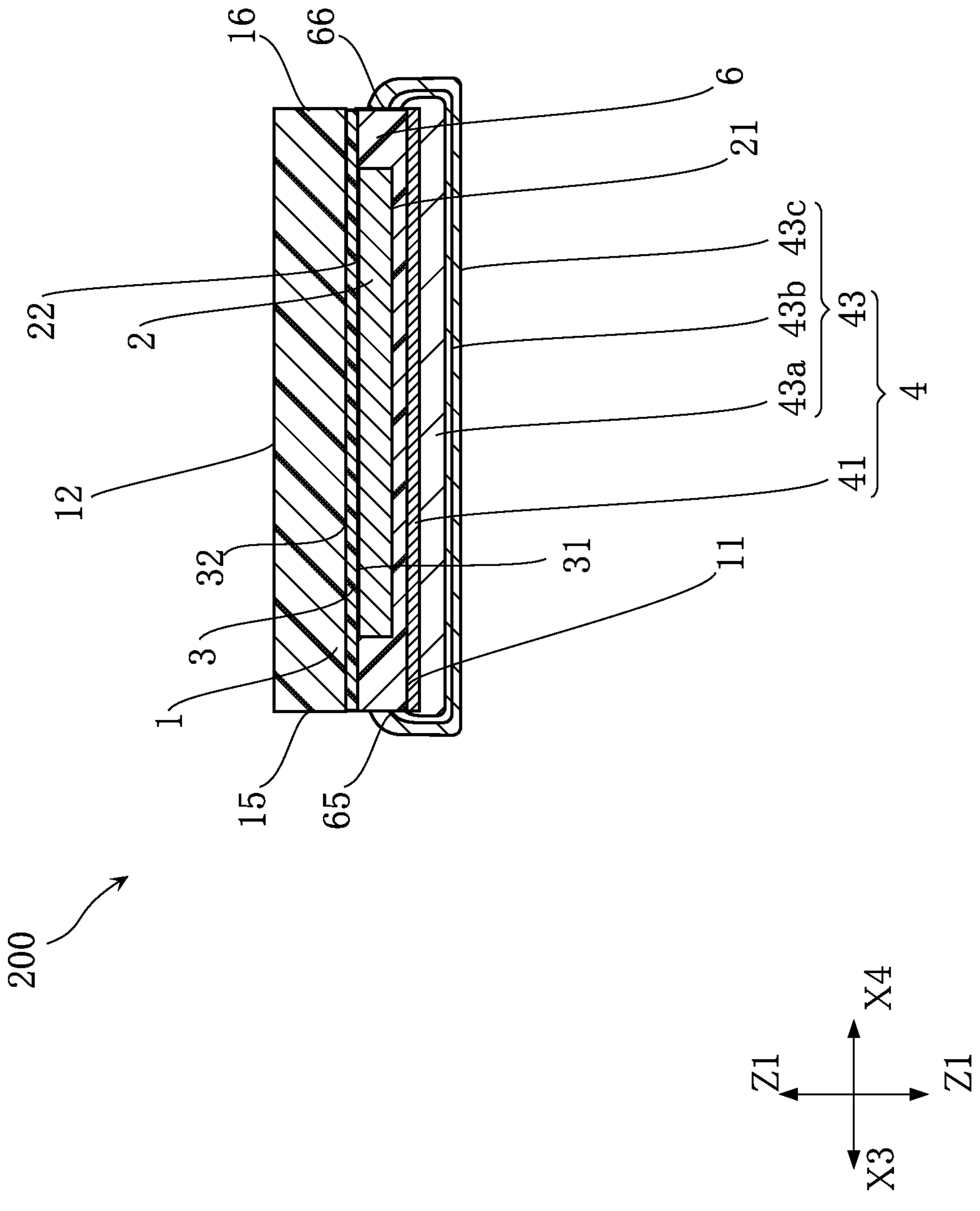
FIG. 22 is a cross-sectional view of the chip resistor taken along a line XXII-XXII in FIGS. 21 and 21.
Figure 23:
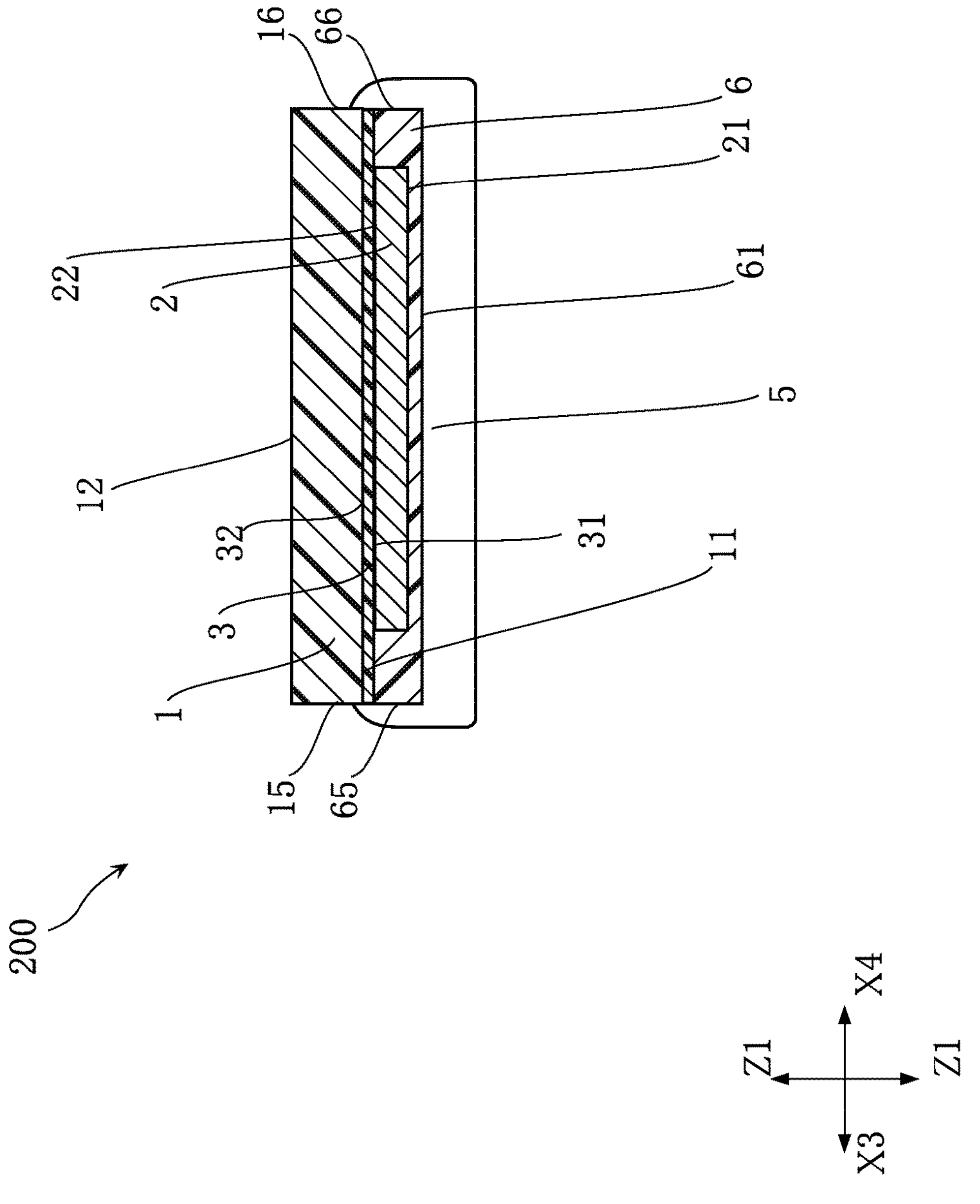
FIG. 23 is a cross-sectional view of the chip resistor taken along a line XXIII-XXIII in FIGS. 20 and 21.
Figure 24:
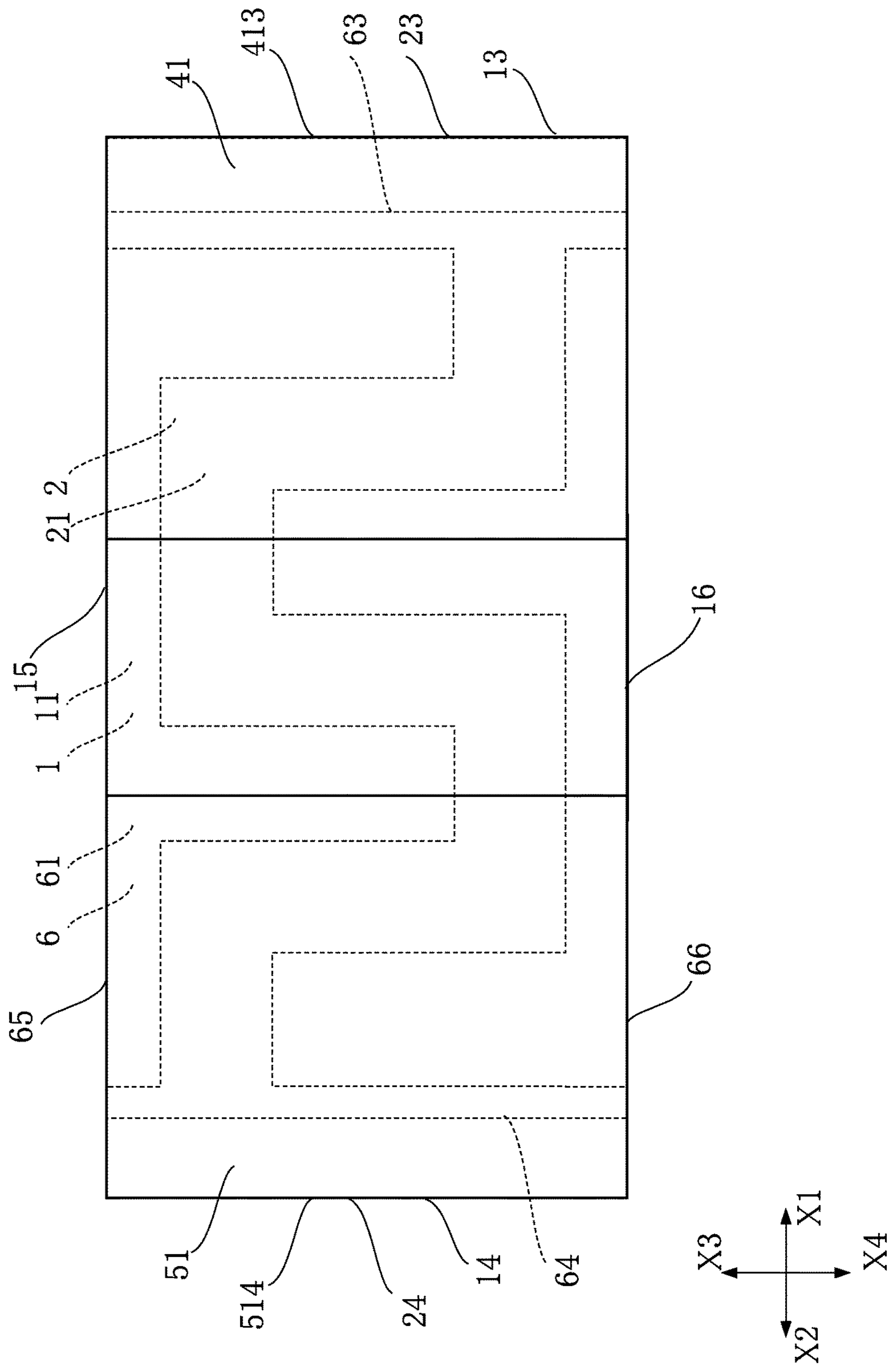
FIG. 24 is a partially seen-through plan view corresponding to FIG. 21, from which the first plated layer and the second plated layer are excluded.
Figure 25:
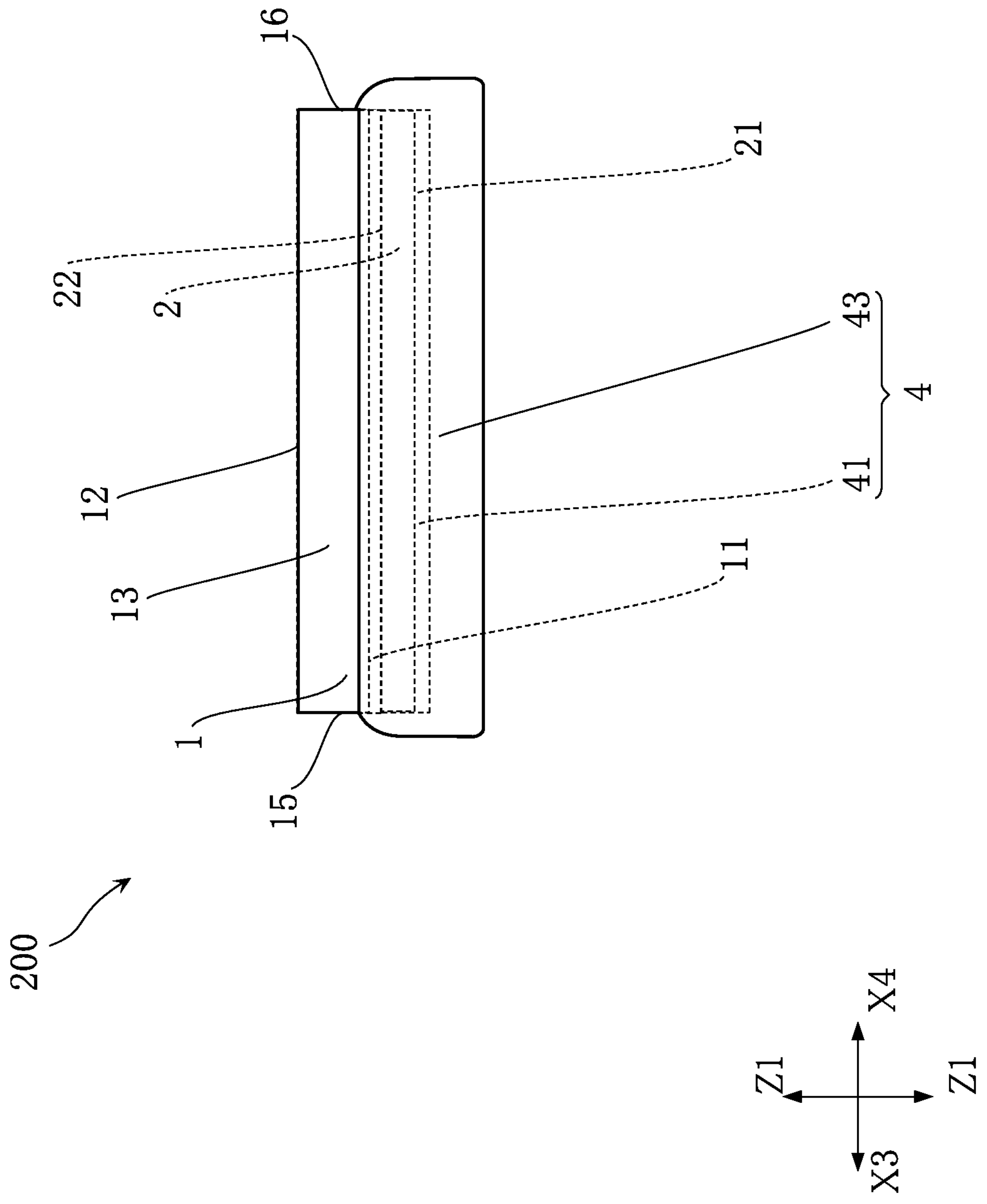
FIG. 25 is a partially seen-through right side view of the chip resistor shown in FIG. 20.
Figure 26:
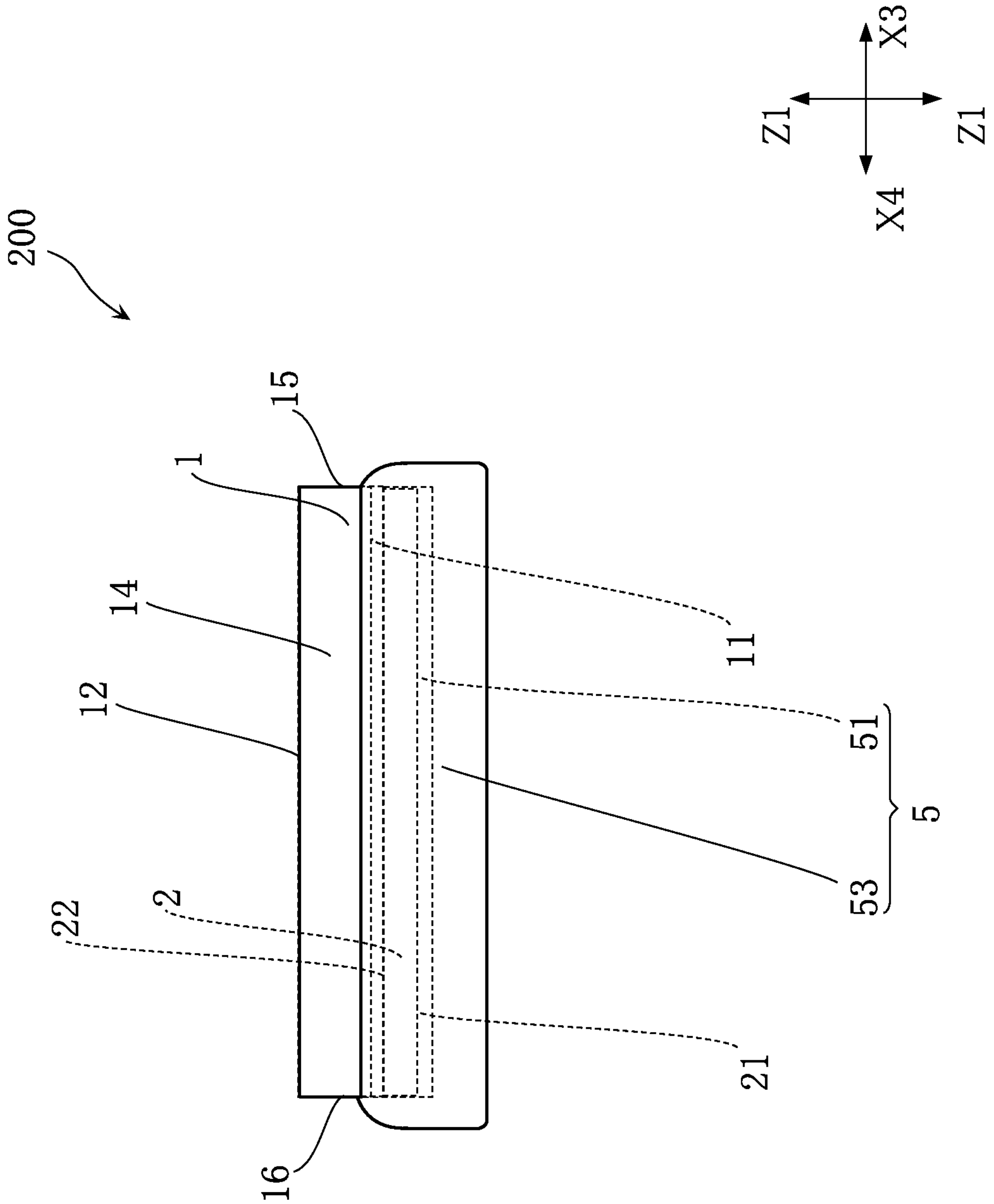
FIG. 26 is a partially seen-through left side view of the chip resistor shown in FIG. 20.
Figure 27:
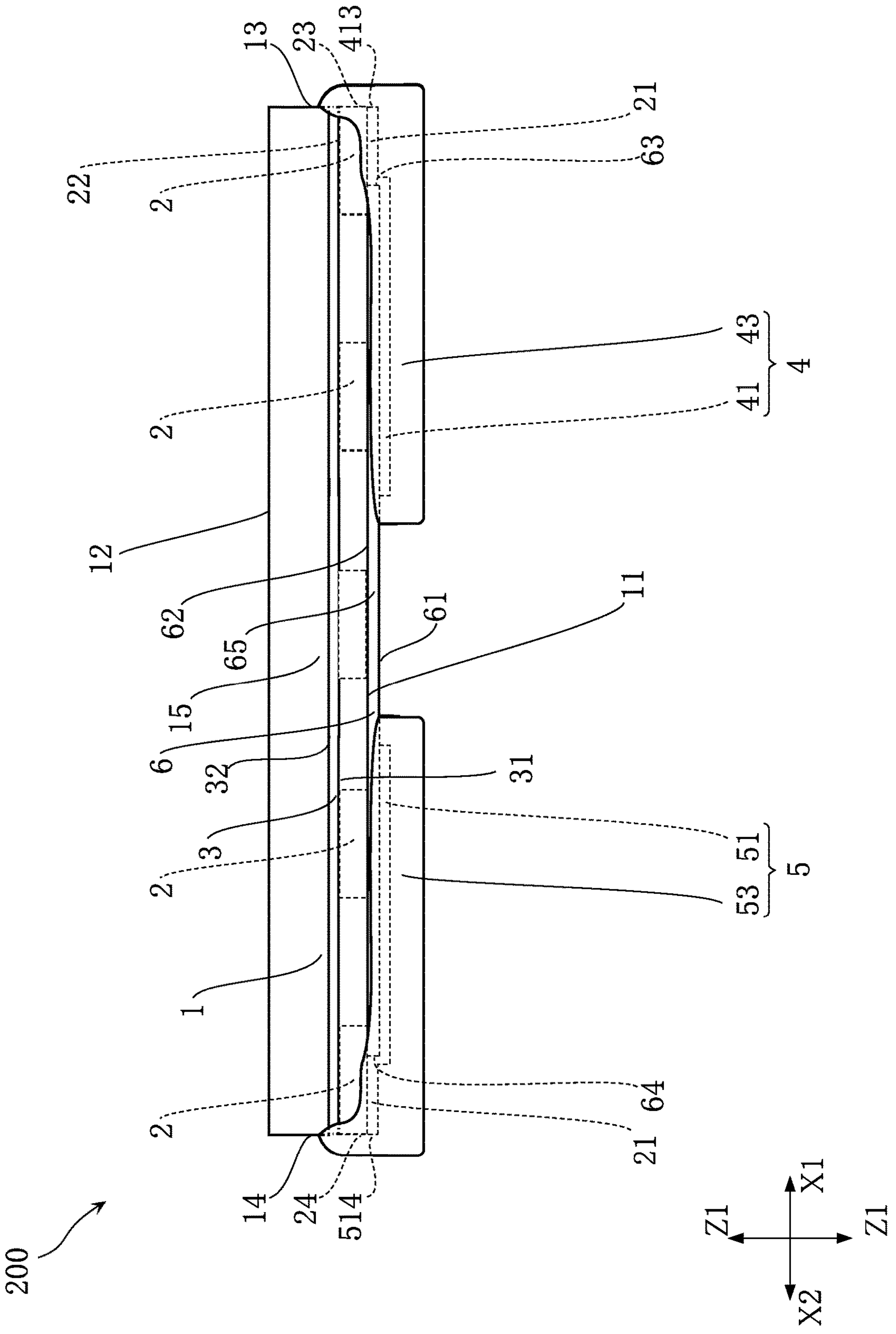
FIG. 27 is a front view of the chip resistor shown in FIG. 20.
Figure 28:
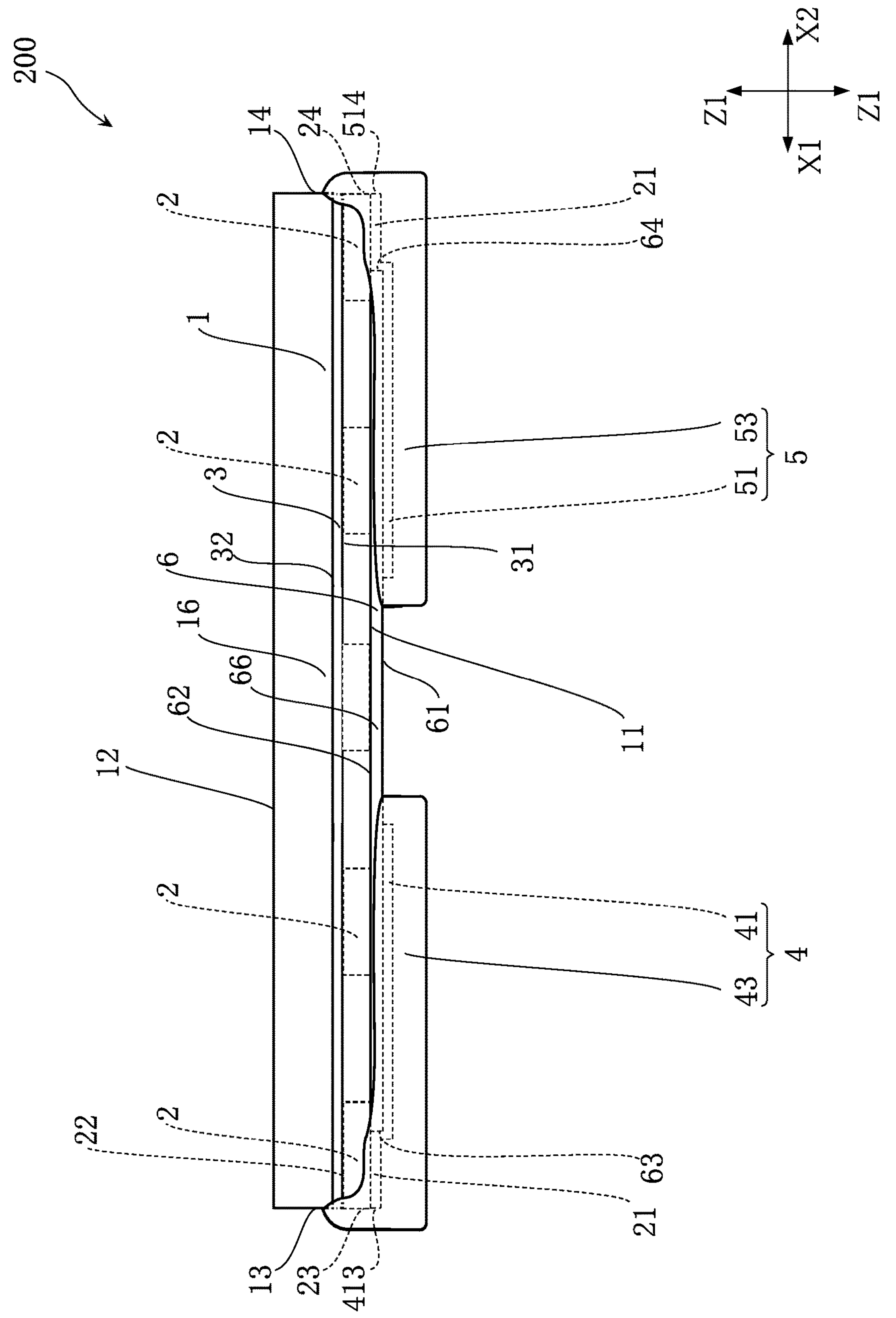
FIG. 28 is a rear view of the chip resistor shown in FIG. 20.

FIG. 21 is a partially seen-through plan view of the chip resistor, seen in the direction indicated by arrows XXI-XXI in FIG. 20. FIG. 22 is a cross-sectional view of the chip resistor taken along a line XXII-XXII in FIGS. 21 and 21. FIG. 23 is a cross-sectional view of the chip resistor taken along a line XXIII-XXIII in FIGS. 20 and 21. FIG. 24 is a partially seen-through plan view corresponding to FIG. 21, from which the first plated layer and the second plated layer are excluded. FIG. 25 is a partially seen-through right side view of the chip resistor shown in FIG. 20. FIG. 26 is a partially seen-through left side view of the chip resistor shown in FIG. 20. FIG. 27 is a front view of the chip resistor shown in FIG. 20. FIG. 28 is a rear view of the chip resistor shown in FIG. 20.

The chip resistor 200 shown in the drawings above includes the substrate 1, the resistor 2, a bonding layer 3, the first electrode 4, the second electrode 5, and the insulating layer 6.

The substrate 1 has a plate-like shape. The substrate 1 may be either insulative or conductive. In the case where the substrate 1 is to be made insulative, the material to form the substrate 1 may contain a resin or a ceramic. For example, an epoxy resin may be employed to form the substrate 1. Regarding the ceramic, for example $Al_2O_3$, AlN, and SiC may be employed. In the case where the substrate 1 is to be made conductive, the substrate 1 may be formed of Cu or Ag, for example. In the illustrated embodiment, the substrate 1 is a glass epoxy resin substrate.

The substrate 1 includes the substrate obverse surface 11, the substrate reverse surface 12, the substrate first lateral face 13, the substrate second lateral face 14, the substrate first end face 15, and the substrate second end face 16.

The substrate obverse surface 11, the substrate reverse surface 12, the substrate first lateral face 13, the substrate second lateral face 14, the substrate first end face 15, and the substrate second end face 16 are all flat. Referring to FIG. 20, the up-down direction in the figure is defined as the "thickness direction" Z1 of the substrate 1. In FIG. 21, the "first direction" X1 runs to the right, and the "second direction" X2 runs to the left. Further, the "third direction" X3 runs upwards, and the "fourth direction" X4 runs downwards. The maximum thickness (maximum size in the thickness direction Z1) of the substrate 1 is, for example, 60 to 300 μm. The thickness direction Z1 is perpendicular to each of the first direction X1, the second direction X2, the third direction X3 and the fourth direction X4. In addition, each of the first direction X1 and the second direction X2 is perpendicular to the third direction X3 and the fourth direction X4.

The size of the chip resistor 200 in the first direction X1 is, for example, 5 to 10 mm, and the size of the chip resistor 200 in the third direction X3 is 2 to 10 mm for example.

The substrate obverse surface 11 and the substrate reverse surface 12 are directed in opposite directions to each other. The substrate first lateral face 13 is directed in the first direction X1. The substrate second lateral face 14 is directed in the second direction X2. Thus, the substrate first lateral face 13 and the substrate second lateral face 14 are directed in opposite directions to each other. The substrate first end face 15 is directed in the third direction X3. The substrate second end face 16 is directed in the fourth direction X4. In other words, the substrate first end face 15 and the substrate second end face 16 are directed in opposite directions to each other.

As shown in FIG. 20, the resistor 2 is disposed in the substrate 1. Specifically, the resistor 2 is located on a side of the substrate obverse surface 11 of the substrate 1. The thickness (size in the thickness direction Z1) of the resistor 2 is, for example, 50 to 200 μm. In this embodiment, the resistor 2 has a serpentine shape when viewed in the thickness direction Z1. Forming the resistor 2 in the serpentine shape is preferable e.g. for increasing the resistance of the resistor 2. The resistor 2 may have a strip-like shape extending in the first direction X1 instead of the serpentine shape as in this embodiment. The resistor 2 is formed of a resistive metal material, the examples of which include manganin, zeranin, a Ni—Cr alloy, a Cu—Ni alloy, and a Fe—Cr alloy.

As shown in FIGS. 21 and 22, the resistor 2 includes the resistor obverse surface 21, the resistor reverse surface 22, the resistor first lateral face 23, and the resistor second lateral face 24. The resistor obverse surface 21, the resistor reverse surface 22, the resistor first lateral face 23, and the resistor second lateral face 24 are all flat.

The resistor obverse surface 21 and the resistor reverse surface 22 are directed in opposite directions to each other. The resistor obverse surface 21 is directed in the same direction as the direction in which the substrate obverse surface 11 is directed, i.e., downward in FIG. 20. The resistor reverse surface 22 is directed in the same direction as the direction in which the substrate reverse surface 12 is directed, i.e., upward in FIG. 20. The resistor reverse surface 22 is directed to the substrate 1. The resistor first lateral face 23 is directed in the first direction X1. In this embodiment, the resistor first lateral face 23 is flush with the substrate first lateral face 13. The resistor second lateral face 24 is directed in the second direction X2. In this embodiment, the resistor second lateral face 24 is flush with the substrate second lateral face 14.

The bonding layer 3 is disposed between the substrate 1 and the resistor 2. Specifically, the bonding layer 3 is disposed between the substrate obverse surface 11 of the substrate 1 and the resistor 2. The bonding layer 3 serves to bond the resistor 2 and the substrate obverse surface 11 together. It is preferable that the bonding layer 3 is formed of an insulative material, typically an epoxy-based material. The thickness (size in the thickness direction Z1) of the bonding layer 3 is, for example, 30 to 100 μm. As shown in FIGS. 21 and 22, the bonding layer 3 covers the entirety of the substrate obverse surface 11 in this embodiment.

The bonding layer 3 may be provided only on a part of the substrate obverse surface 11, unlike in this embodiment. For example, the bonding layer 3 may be provided only in a region on the substrate obverse surface 11 overlapping the resistor 2.

As shown in FIGS. 21 and 22, the bonding layer 3 includes the bonding layer obverse surface 31 and the bonding layer reverse surface 32 directed in opposite directions to each other. The bonding layer obverse surface 31 is directed in the same direction as the direction in which the substrate obverse surface 11 is directed, i.e., downward in FIG. 20. The bonding layer obverse surface 31 is in direct contact with the resistor 2. The bonding layer reverse surface 32 is in direct contact with the substrate 1.

The insulating layer 6 is formed so as to cover the resistor 2. The insulating layer 6 is provided on the resistor 2 and the substrate 1 via the bonding layer 3. The insulating layer 6 is in direct contact with the resistor obverse surface 21 of the resistor 2. The insulating layer 6 leaves uncovered portions of the resistor 2 that are spaced apart from each other in the first direction X1 (or the second direction X2). The insulating layer 6 is, for example, formed of a thermosetting material. The size of the insulating layer 6 in the third direction X3 is equal to the size of the substrate 1 in the third direction X3. The maximum thickness (maximum size in the thickness direction Z1) of the insulating layer 6 is, for example, 20 to 60 μm. The insulating layer 6 is formed of a resin, for example. It is preferable to employ a material having high heat conductance to form the insulating layer 6, in order to facilitate heat generated in the resistor 2 to be dissipated to outside of the chip resistor 200. It is preferable that the heat conductance of the insulating layer 6 is higher than that of the material constituting the substrate 1. Preferably, the heat conductance of the insulating layer 6 is 1.0 W/(m·K) to 5.0 W/(m·K).

The insulating layer 6 includes the insulating layer obverse surface 61, the insulating layer reverse surface 62, the insulating layer first lateral face 63, the insulating layer second lateral face 64, the insulating layer first end face 65, and the insulating layer second end face 66.

The insulating layer obverse surface 61 and the insulating layer reverse surface 62 are directed in opposite directions to each other. The insulating layer obverse surface 61 is directed in the same direction as the direction in which the resistor obverse surface 21 is directed, i.e., downward in FIG. 20. The first electrode 4 and the second electrode 5 are provided on the insulating layer obverse surface 61. A part of the insulating layer obverse surface 61, more specifically a region of the insulating layer obverse surface 61 between the first electrode 4 and the second electrode 5, is exposed from the first electrode 4 and the second electrode 5. The insulating layer reverse surface 62 is directed in the same direction as the direction in which the resistor reverse surface 22 is directed, i.e., upward in FIG. 20. In this embodiment, the insulating layer reverse surface 62 is in direct contact with the resistor 2 and the substrate 1. Specifically, the insulating layer reverse surface 62 is in direct contact with the resistor obverse surface 21 and the substrate obverse surface 11. The insulating layer first lateral face 63 is directed in the first direction X1. The insulating layer second lateral face 64 is directed in the second direction X2. The insulating layer first end face 65 is directed in the third direction X3. In this embodiment, the insulating layer first end face 65 is flush with the substrate first end face 15. The insulating layer second end face 66 is directed in the fourth direction X4. The insulating layer second end face 66 is flush with the substrate second end face 16.

The first electrode 4 is electrically connected to the resistor 2. The first electrode 4 serves to supply power to the resistor 2 from the mounting substrate 893 on which the chip resistor 200 is mounted. The first electrode 4 is in direct contact with the resistor 2. In this embodiment, the first electrode 4 is in direct contact with the resistor obverse surface 21 of the resistor 2. In this embodiment, further, the first electrode 4 is formed so as to cover the resistor first lateral face 23 of the resistor 2 and the insulating layer 6. In this embodiment, the insulating layer 6 is disposed between the first electrode 4 and the resistor 2. In this embodiment, still further, the first electrode 4 is not formed so as to cover the substrate reverse surface 12. However, the first electrode 4 may be formed so as to cover the substrate reverse surface 12, unlike in this embodiment. In the mounting structure 892, as shown in FIG. 20, the first electrode 4 is in direct contact with the bonding portion 895, to be electrically connected to a non-illustrated interconnect pattern formed on the mounting substrate 893, through the bonding portion 895.

As shown in FIG. 20, the first electrode 4 includes the first underlying layer 41 and the first plated layer 43.

The first underlying layer 41 is in direct contact with the resistor 2. In this embodiment, the first underlying layer 41 serves as the base for forming the first plated layer 43 on the insulating layer 6 by a plating method. The first underlying layer 41 is in direct contact with the portion of the resistor obverse surface 21 exposed from the insulating layer 6. The first underlying layer 41 is formed so as to overlap the resistor 2 when viewed in the thickness direction Z1 of the substrate 1. In addition, the first underlying layer 41 includes a portion separated from the resistor 2 in the thickness direction Z1. The insulating layer 6 is disposed between the first underlying layer 41 and the resistor 2. The first underlying layer 41 is disposed between the first plated layer 43 and the insulating layer 6. In this embodiment, it is preferable that the first underlying layer 41 has a large size in the first direction X1. Preferably, for example, the size of the first underlying layer 41 in the first direction X1 is equal to or larger than a quarter of the size of the resistor 2 in the first direction X1, and more preferably, equal to or larger than one third of the size of the resistor 2 in the first direction X1. The size of the first underlying layer 41 in the first direction X1 is, for example, 600 to 3200 μm. The first underlying layer 41 is thinner than the resistor 2. The first underlying layer 41 may be formed by PVD, CVD, or printing. In this embodiment, the first underlying layer 41 is formed by sputtering. The thickness of the first underlying layer 41 is, for example, 0.5 to 1.0 nm. The first underlying layer 41 may contain Ni and Cr, for example. In a different embodiment, the thickness of the first underlying layer 41 may be much greater, for example, in a range of 0.5 to 1.0 μm.

The first underlying layer 41 includes an underlying layer first lateral face 413. The underlying layer first lateral face 413 is directed in the first direction X1. In this embodiment, the underlying layer first lateral face 413 is flush with the substrate first lateral face 13 and the resistor first lateral face 23.

The first plated layer 43 is formed so as to directly cover the first underlying layer 41. The first plated layer 43 is provided on the resistor 2, and is in direct contact with the insulating layer 6. The first plated layer 43 is in direct contact with a portion of the insulating layer 6 that is offset in the direction X2 from the first underlying layer 41. In the chip resistor 200 unmounted yet on the mounting substrate 893, the first plated layer 43 is outwardly exposed. Therefore, as shown in FIG. 20, in the mounting structure 892 the first plated layer 43 is in direct contact with the bonding portion 895, thus to be electrically connected to the non-illustrated interconnect pattern formed on the mounting substrate 893, through the bonding portion 895. In this embodiment, further, the first plated layer 43 is formed so as to cover the resistor first lateral face 23 of the resistor 2. Such a configuration is preferable because of allowing a solder fillet to be formed on the bonding portion 895.

More specifically, in this embodiment the first plated layer 43 includes a Cu layer 43*a*, a Ni layer 43*b*, and a Sn layer 43*c*. The Cu layer 43*a* is formed so as to directly cover the first underlying layer 41. The Ni layer 43*b* directly covers the Cu layer 43*a*. The Sn layer 43*c* directly covers the Ni layer 43*b*, and is outwardly exposed. In the mounting structure 892 of the chip resistor 200, the bonding portion 895 (in this embodiment, solder) is bonded onto the Sn layer 43*c*. For example, the Cu layer 43*a* has a thickness of 10 to 50 μm, the Ni layer 43*b* has a thickness of 1 to 10 μm, and the Sn layer 43*c* has a thickness of 1 to 10 μm. According to the present invention, the first plated layer 43 may not include the Ni layer 43*b* as in this embodiment.

The second electrode 5 is offset in the direction X2 from the first electrode 4. The second electrode 5 is electrically connected to the resistor 2. The second electrode 5 serves to supply power to the resistor 2 from the mounting substrate 893 on which the chip resistor 200 is mounted. The second electrode 5 is in direct contact with the resistor 2. In this embodiment, the second electrode 5 is in direct contact with the resistor obverse surface 21 of the resistor 2. In this embodiment, further, the second electrode 5 is formed so as to cover the resistor second lateral face 24 of the resistor 2 and the insulating layer 6. In this embodiment, the insulating layer 6 is disposed between the second electrode 5 and the resistor 2. In this embodiment, still further, the second electrode 5 is not formed so as to cover the substrate reverse surface 12. However, the second electrode 5 may be formed so as to cover the substrate reverse surface 12, unlike in this embodiment. In the mounting structure 892, as shown in FIG. 20, the second electrode 5 is in direct contact with the bonding portion 895, thus to be electrically connected to the non-illustrated interconnect pattern formed on the mounting substrate 893, through the bonding portion 895.

As shown in FIG. 20, the second electrode 5 includes the second underlying layer 51 and the second plated layer 53.

The second underlying layer 51 is in direct contact with the resistor 2. In this embodiment, the second underlying layer 51 serves as the base for forming the second plated layer 53 on the insulating layer 6 by a plating method. The second underlying layer 51 is in direct contact with the portion of the resistor obverse surface 21 exposed from the insulating layer 6. The insulating layer 6 is disposed between the second underlying layer 51 and the resistor 2. The second underlying layer 51 is disposed between the second plated layer 53 and the insulating layer 6. In this embodiment, it is preferable that the second underlying layer 51 has a large size in the first direction X1. Preferably, for example, the size of the second underlying layer 51 in the first direction X1 is equal to or larger than a quarter of the size of the resistor 2 in the first direction X1, and more preferably, equal to or larger than one third of the size of the resistor 2 in the first direction X1. The size of the second underlying layer 51 in the first direction X1 is, for example, 600 to 3200 μm. The second underlying layer 51 is thinner than the resistor 2. The second underlying layer 51 may be formed by PVD, CVD, or printing. In this embodiment, the second underlying layer 51 is formed by sputtering. The thickness of the second underlying layer 51 is, for example, 0.5 to 1.0 nm. The second underlying layer 51 may contain Ni and Cr, for example. In a different embodiment, the thickness of the second underlying layer 51 may be much greater, for example, in a range of 0.5 to 1.0 μm.

The second underlying layer 51 includes an underlying layer second lateral face 514. The underlying layer second lateral face 514 is directed in the second direction X2. In this embodiment, the underlying layer second lateral face 514 is flush with the substrate second lateral face 14 and the resistor second lateral face 24.

The second plated layer 53 is formed so as to directly cover the second underlying layer 51. The second plated layer 53 is provided on the resistor 2, and is in direct contact with the insulating layer 6. The second plated layer 53 is in direct contact with a portion of the insulating layer 6 located on the X1-side with respect to the second underlying layer 51. In the chip resistor 200 not mounted yet on the mounting substrate 893, the second plated layer 53 is outwardly exposed. Therefore, as shown in FIG. 1, in the mounting structure 892 the second plated layer 53 is in direct contact with the bonding portion 895, thus to be electrically connected to the non-illustrated interconnect pattern formed on the mounting substrate 893, through the bonding portion 895. In this embodiment, further, the second plated layer 53 is formed so as to cover the resistor second lateral face 24 of the resistor 2. Such a configuration is preferable because of allowing a solder fillet to be formed on the bonding portion 895.

More specifically, in this embodiment the second plated layer 53 includes a Cu layer 53*a*, a Ni layer 53*b*, and a Sn layer 53*c*. The Cu layer 53*a* is formed so as to directly cover the second underlying layer 51. The Ni layer 53*b* directly covers the Cu layer 53*a*. The Sn layer 53*c* directly covers the Ni layer 53*b*, and is outwardly exposed. In the mounting structure 892 of the chip resistor 200, the bonding portion 895 (in this embodiment, solder) is bonded onto the Sn layer 53*c*. For example, the Cu layer 53*a* has a thickness of 10 to 50 μm, the Ni layer 53*b* has a thickness of 1 to 10 μm, and the Sn layer 53*c* has a thickness of 1 to 10 μm. According to the present invention, the second plated layer 53 may not include the Ni layer 53*b* as in this embodiment A manufacturing method of the chip resistor 200 will be described below.

Figure 29:
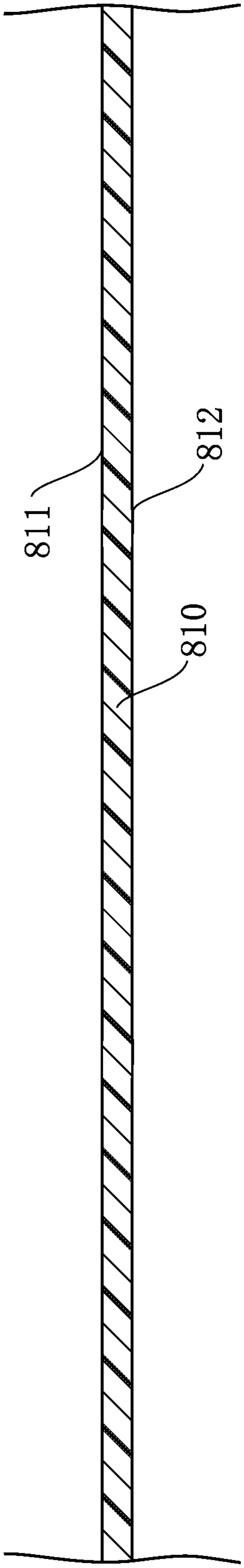
FIG. 29 is a cross-sectional view for explaining a manufacturing process of the chip resistor shown in FIG. 20.

Referring first to FIG. 29, a substrate sheet 810 is prepared. The substrate sheet 810 is the material to be formed into the substrate 1. The substrate sheet 810 is formed of an insulative material, such as a ceramic or a resin, and examples of the former include $Al_2O_3$, AlN, and SiC. The substrate sheet 810 includes a front surface 811 and a rear surface 812 directed in opposite directions to each other.

Figure 30:
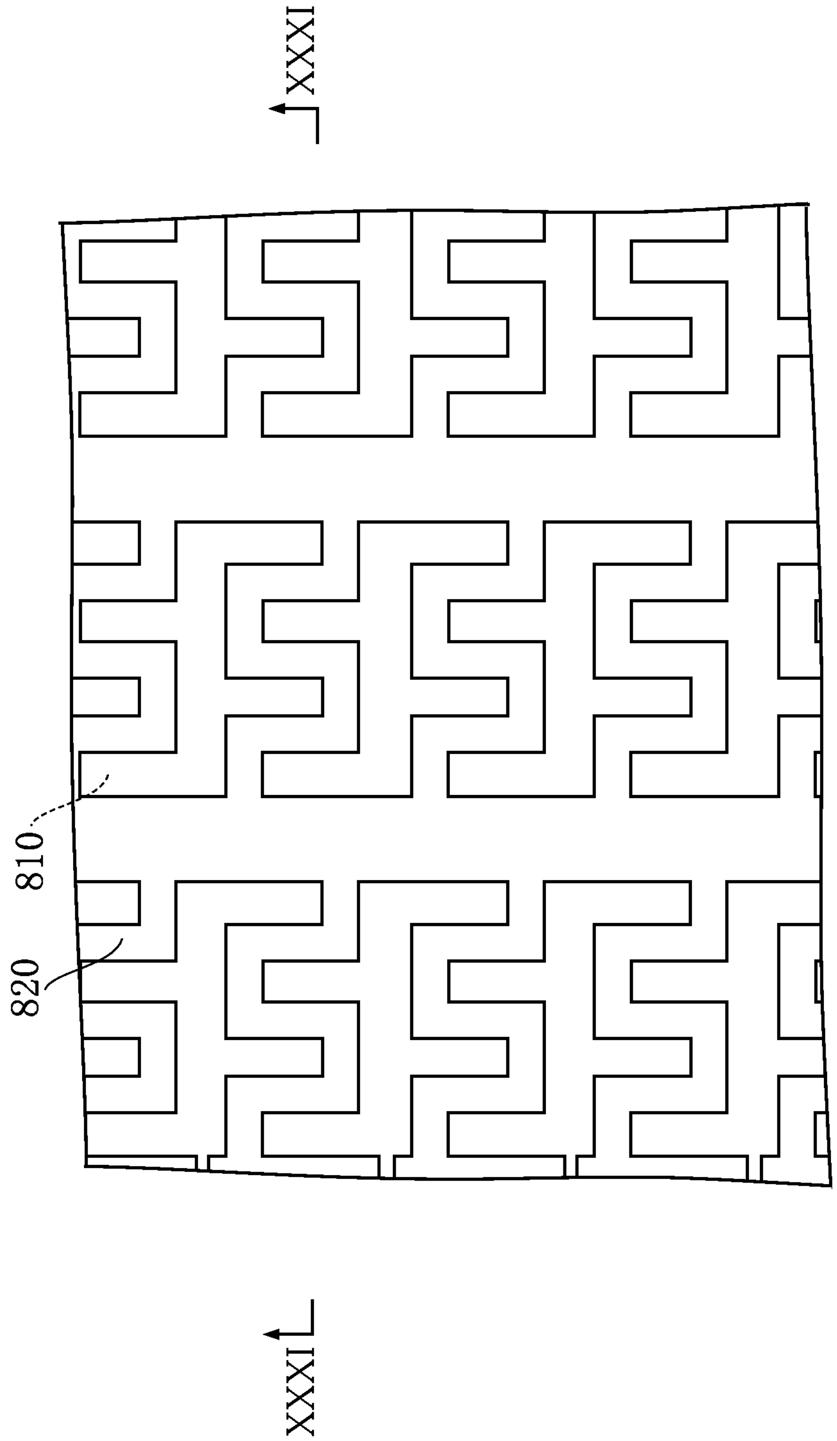
FIG. 30 is a plan view for explaining the manufacturing process that follows FIG. 29.
Figure 31:
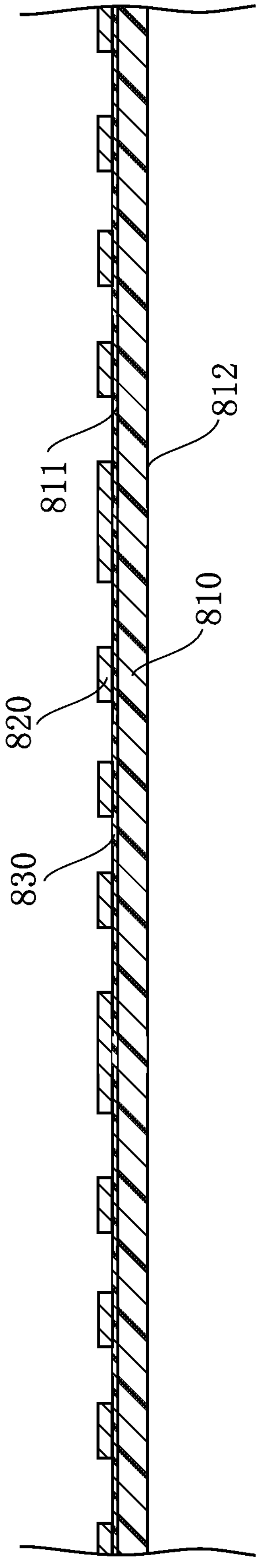
FIG. 31 is a cross-sectional view taken along a line XXXI-XXXI in FIG. 30.

As shown in FIGS. 30 and 31, a bonding material 830 is adhered to the front surface 811 of the substrate sheet 810. The bonding material 830 is to be formed into the bonding layer 3. In this embodiment, the bonding material 830 is a heat-conductive adhesive sheet. In FIG. 31, the bonding material 830 is tentatively thermal-bonded to the front surface 811 of the substrate sheet 810.

Referring again to FIGS. 30 and 31, the resistor block 820 is bonded onto the front surface 811 via the bonding material 830. In this embodiment, the resistor block 820 is tentatively thermal-bonded to the bonding material 830 in the state shown in FIGS. 30 and 31. The resistor block 820 is composed of a plurality of sections, each of which is to be formed into the resistor 2. To form the serpentine-shaped resistor 2 in this embodiment, a plurality of serpentine-shaped sections are formed by etching or punching in the resistor block 820 before the resistor block 820 is bonded to the sheet front surface 811. Then the resistor block 820 is trimmed (not shown) to adjust the resistance of the resistor 2. The trimming is performed, for example, with a laser, a sand blaster, a dicer, or a grinder.

Instead of the adhesive sheet, a liquid adhesive may be employed as the bonding material 830 to adhere the resistor block 820 to the front surface 811 of the substrate sheet 810.

Figure 32:
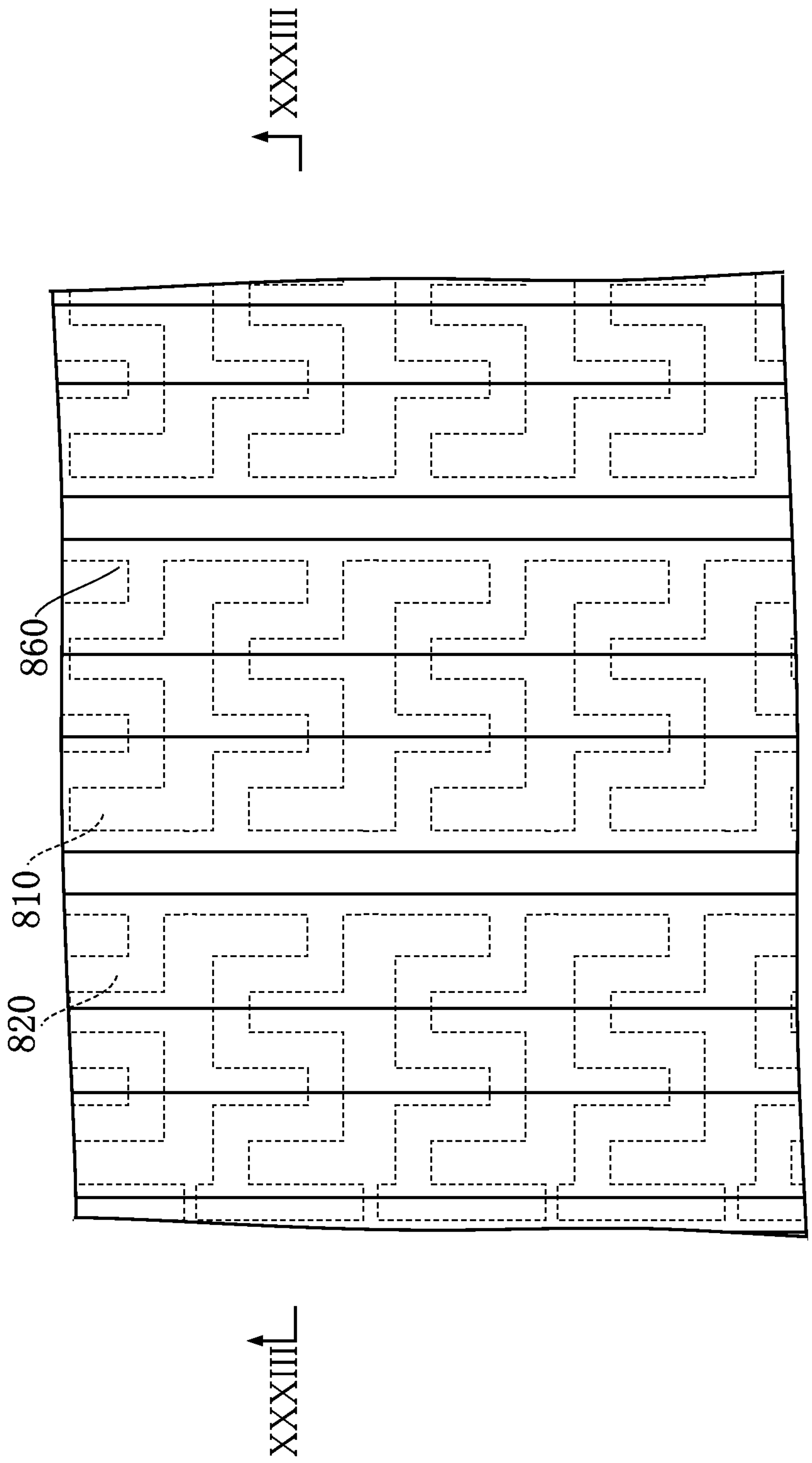
FIG. 32 is a rear view for explaining the manufacturing process that follows FIG. 30.
Figure 33:
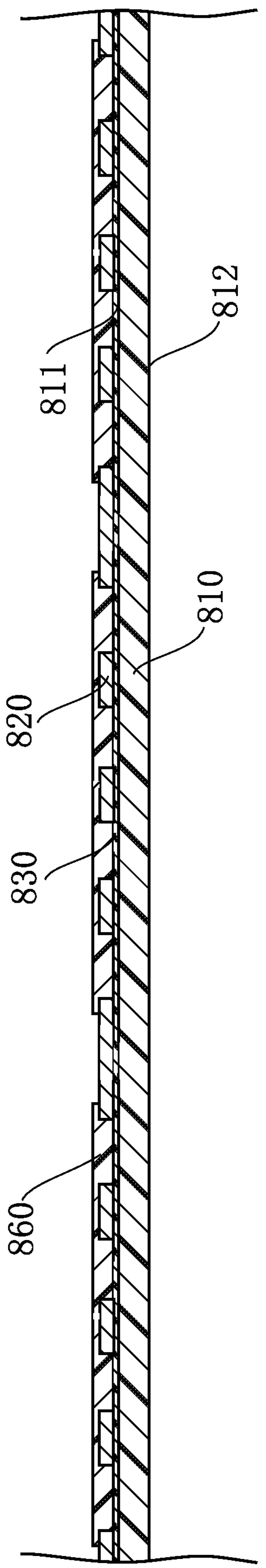
FIG. 33 is a cross-sectional view taken along a line XXXIII-XXXIII in FIG. 32.

Proceeding to FIGS. 32 and 33, the insulating film 860 is formed. The insulating film 860 is the material to be formed into the insulating layer 6. The insulating film 860 is formed as a plurality of strips extending in one direction, for example by printing or application. A part of the resistor block 820 is exposed from the insulating film 860.

Figure 34:
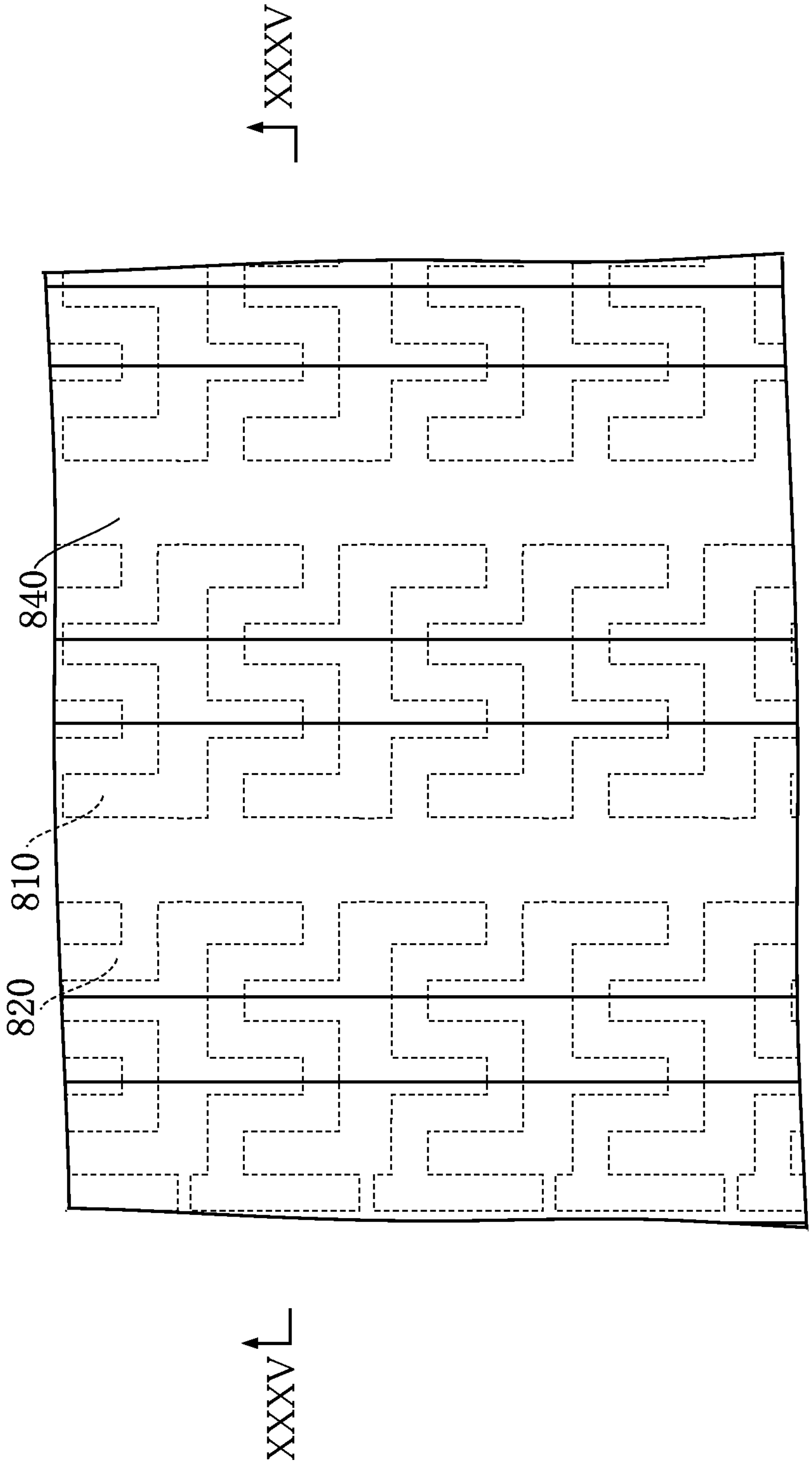
FIG. 34 is a rear view for explaining the manufacturing process that follows FIG. 32.
Figure 35:
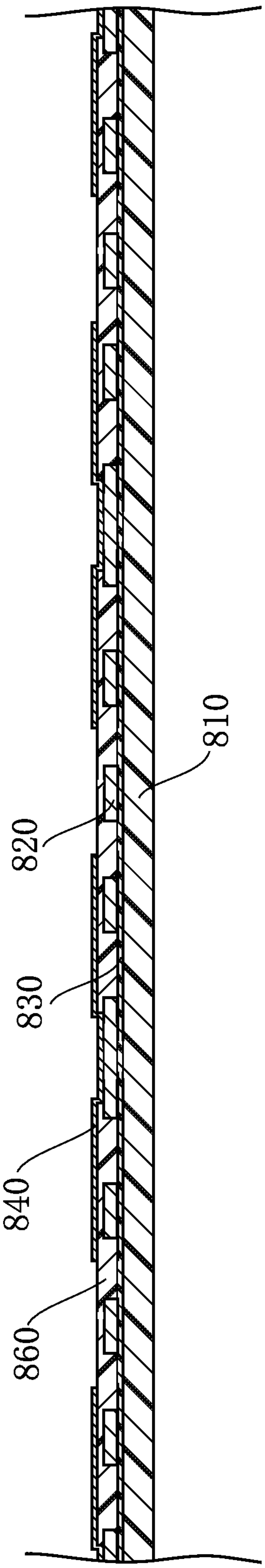
FIG. 35 is a cross-sectional view taken along a line XXXV-XXXV in FIG. 34.

Proceeding to FIGS. 34 and 35, the conductive material 840 is formed on the resistor block 820. The conductive material 840 is to be formed into the first underlying layer 41 or the second underlying layer 51. The deposition of the conductive material 840 may be performed through a PVD or CVD process. In the case of forming the conductive material 840 by PVD, for example sputtering may be performed. In this embodiment, the conductive material 840 is formed in a strip shape along the insulating film 860, and therefore a part of the insulating film 860 is exposed from the conductive material 840. To form the conductive material 840 in a strip shape, for example a masking method may be adopted. The conductive material 840 may be formed of Ni or Cr, for example.

Figure 36:
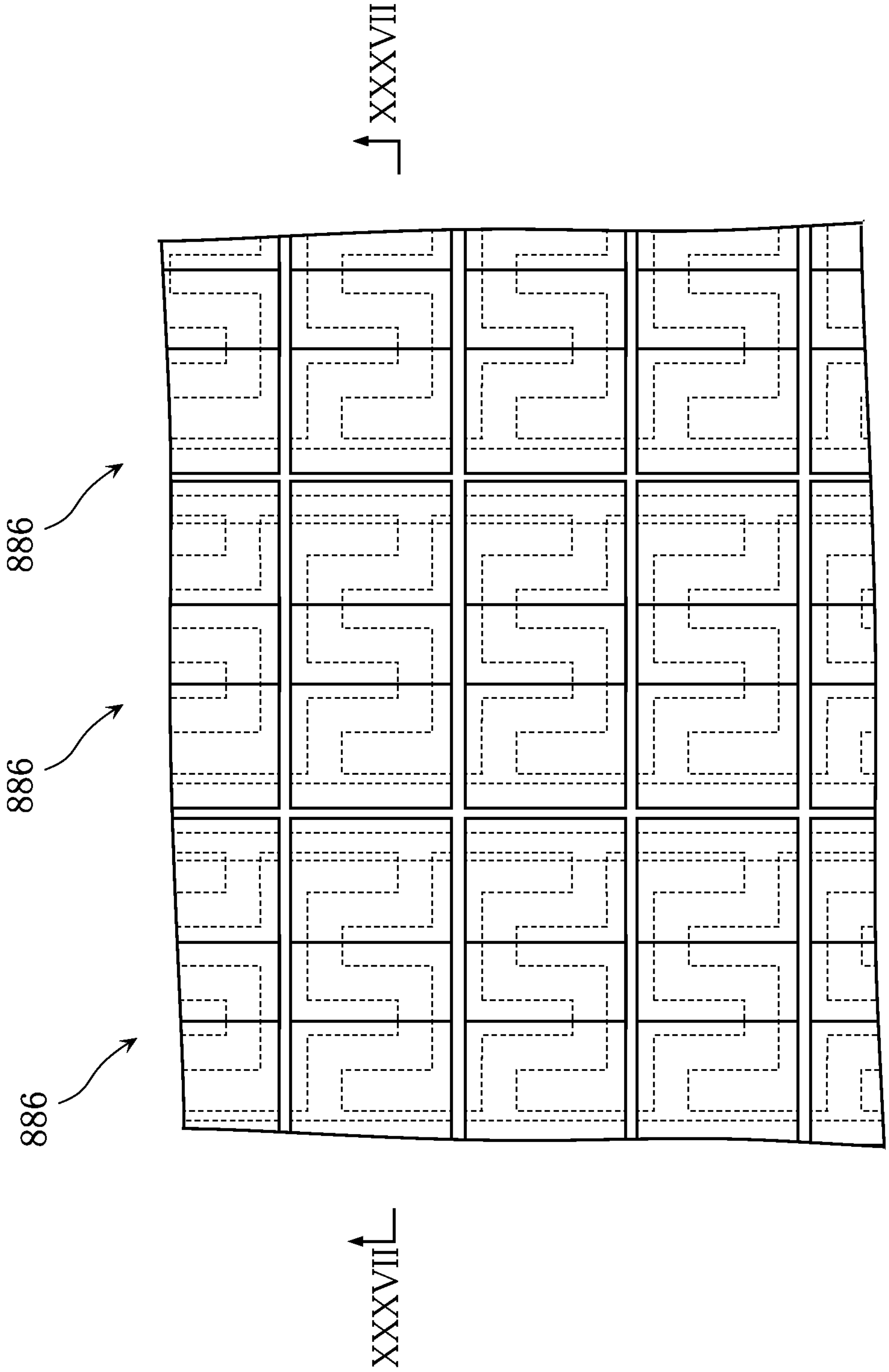
FIG. 36 is a rear view for explaining the manufacturing process that follows FIG. 34.
Figure 37:
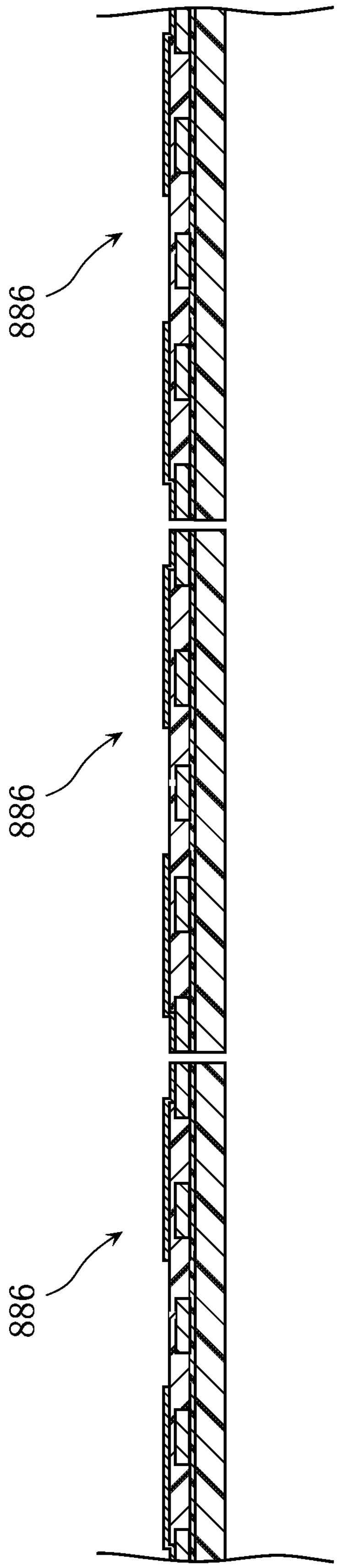
FIG. 37 is a cross-sectional view taken along a line XXXVII-XXXVII in FIG. 36.

Proceeding to FIGS. 36 and 37, the resistor block 820 is cut into a plurality of individual pieces 886. In this embodiment, the resistor block 820 and substrate sheet 810 are collectively cut. To obtain the individual pieces 886, for example a punching or dicing method may be adopted. In this embodiment, punching is performed to obtain the individual pieces 886.

The cutting process to obtain the individual pieces 886 provides the substrate first lateral face 13, the substrate second lateral face 14, the substrate first end face 15, the substrate second end face 16, the resistor first lateral face 23, the resistor second lateral face 24, the underlying layer first lateral face 413, the underlying layer second lateral face 514, the insulating layer first end face 65, and the insulating layer second end face 66. By cutting the substrate sheet 810 and the resistor block 820 at a time, the substrate first lateral face 13, the resistor first lateral face 23, and the underlying layer first lateral face 413 can be made flush with each other. Likewise, cutting the substrate sheet 810 and the resistor block 820 at a time makes the substrate second lateral face 14, the resistor second lateral face 24, and the underlying layer second lateral face 514 flush with each other. Likewise, the above cutting process makes the substrate first end face 15 and the insulating layer first end face 65 flush with each other. Further, the above cutting process makes the substrate second end face 16 and the insulating layer second end face 66 flush with each other.

Then the first plated layer 43 (Cu layer 43*a*, Ni layer 43*b*, and Sn layer 43*c*) and the second plated layer 53 (Cu layer 53*a*, Ni layer 53*b*, and Sn layer 53*c*) shown in FIG. 20 are formed on each of the individual pieces 886. To form the first plated layer 43 and the second plated layer 53, for example a barrel plating method may be employed. Throughout the foregoing process, the chip resistor 200 can be obtained.

This embodiment provides the following advantages.

In this embodiment, the insulating layer 6 has a heat conductance as high as 1.0 W/(m·K) to 5.0 W/(m·K). Such a property facilitates the heat generated in the resistor 2 to be dissipated to outside of the chip resistor 200 through the insulating layer 6. Therefore, the chip resistor 200 can be prevented from being overheated.

In this embodiment, the first electrode 4 includes the first underlying layer 41 in direct contact with the resistor 2 and the first plated layer 43 covering the first underlying layer 41. The insulating layer 6 is disposed between the first underlying layer 41 and the resistor 2. The mentioned configuration facilitates the first plated layer 43 to be formed on the insulating layer 6. Therefore, the first electrode 4 can be formed with a larger area. The increase in area of the first electrode 4 facilitates the heat generated in the resistor 2 to be discharged to the mounting substrate 893 through the first electrode 4. Thus, the heat dissipation performance of the chip resistor 200 can be improved.

In this embodiment, the substrate 1 is formed of an insulative material. In this case, there is no need to employ a Cu electrode which is relatively thick. Accordingly, the step of processing the Cu electrode can be skipped, and resultantly the production efficiency of the chip resistor 200 can be improved.

In this embodiment, the substrate 1 and the mounting substrate 893 are both glass epoxy resin substrates. Accordingly, the substrate 1 and the mounting substrate 893 have generally the same thermal expansion coefficient. When the substrate 1 is thermally expanded during the use of the chip resistor 200, the mounting substrate 893 is supposed to thermally expand at the same rate. Such a configuration prevents a malfunction that may arise from the impact of thermal expansion during the use of the chip resistor 200, for example fracture of the chip resistor 200.

First Variation of Second Embodiment

Figure 38:
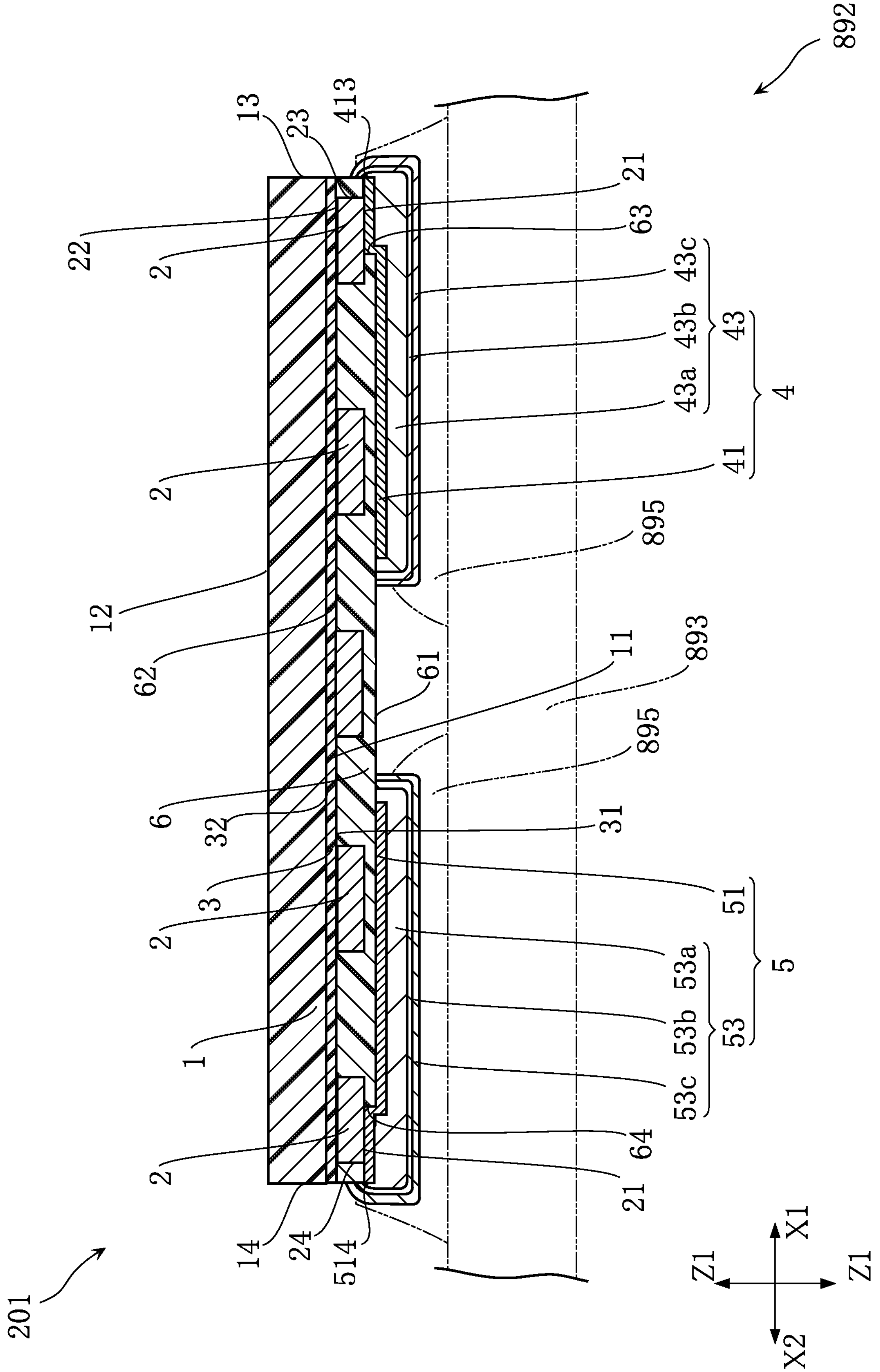
FIG. 38 is a cross-sectional view showing a first variation of the second embodiment.

Referring to FIG. 38, a first variation of the second embodiment of the present invention will be described.

FIG. 38 is a cross-sectional view showing the first variation of the second embodiment.

A chip resistor 201 shown in FIG. 38 is different from the chip resistor 200 in that the resistor first lateral face 23 and the resistor second lateral face 24 of the resistor 2 are covered with the insulating layer 6. The remaining portions are configured in the same way as those of the chip resistor 200, and hence the description will not be repeated.

The chip resistor 201 can also provide the same advantages as those provided by the chip resistor 200.

Second Variation of Second Embodiment

Figure 39:
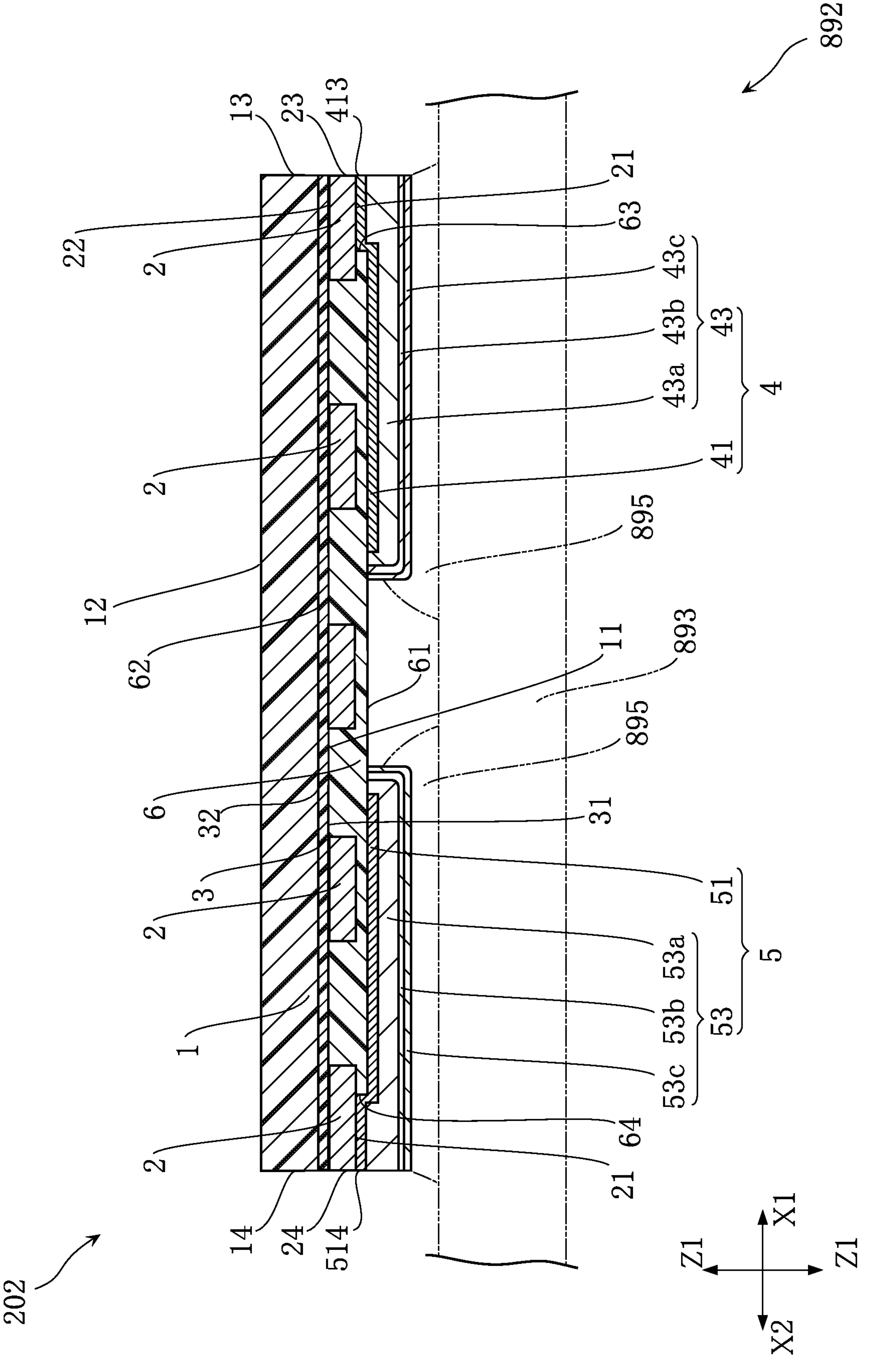
FIG. 39 is a cross-sectional view showing a second variation of the second embodiment.

Referring to FIG. 39, a second variation of the second embodiment of the present invention will be described.

FIG. 39 is a cross-sectional view showing the second variation of the second embodiment.

A chip resistor 202 shown in FIG. 39 is different from the chip resistor 200 in that the first plated layer 43 includes a face that is flush with the underlying layer first lateral face 413 of the first underlying layer 41, and that the second plated layer 53 includes a face that is flush with the underlying layer first lateral face 514 of the second underlying layer 51. The remaining portions are configured in the same way as those of the chip resistor 200, and hence the description will not be repeated. Here, to manufacture the chip resistor 202, the plated layer is formed in advance of the cutting process of the substrate sheet 810 and the resistor block 820 described with reference to FIGS. 36 and 37.

The chip resistor 202 can also provide the same advantages as those provided by the chip resistor 200.

Referring now to FIG. 40 through FIG. 47, a third embodiment of the present invention will be described.

Figure 40:
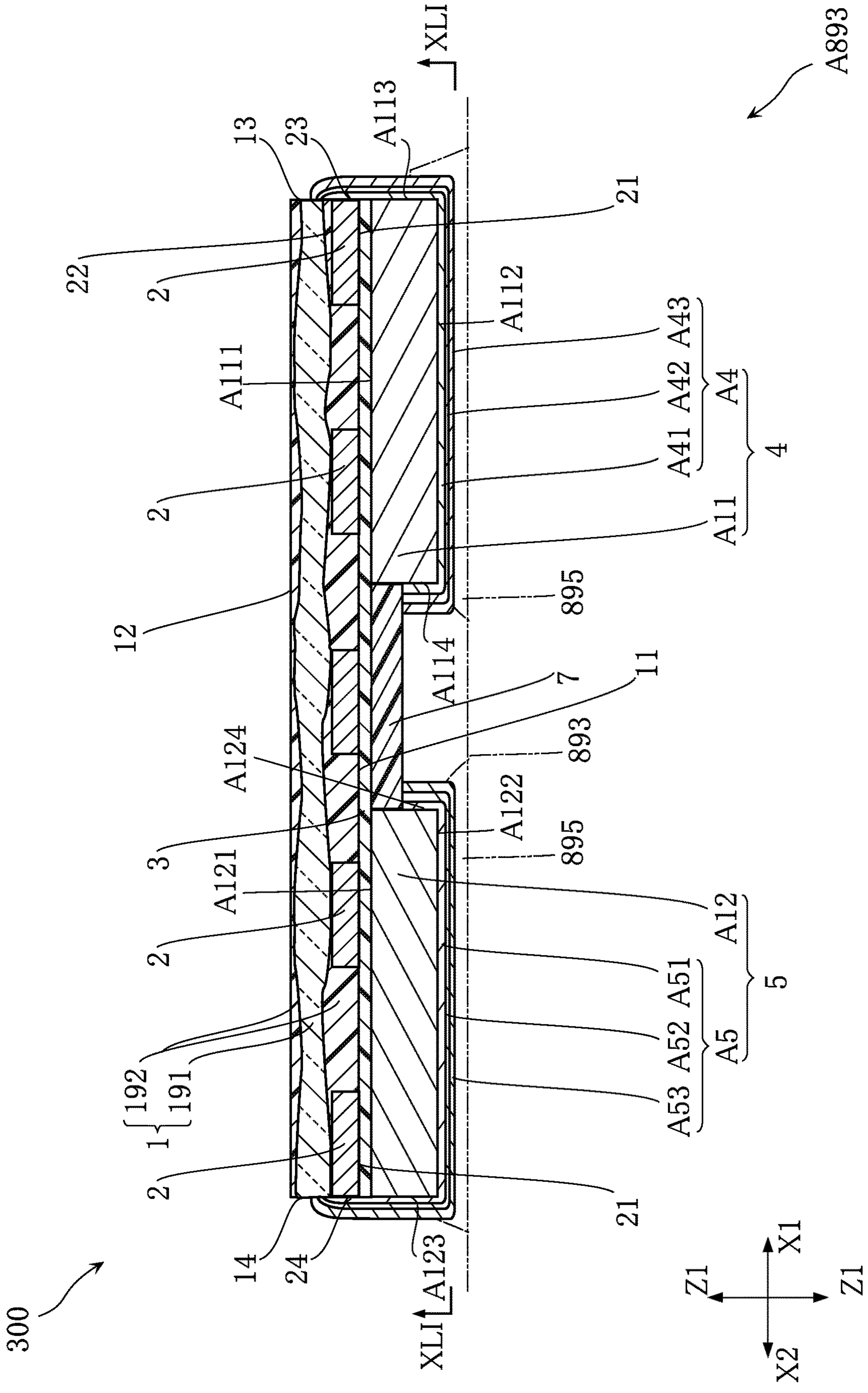
FIG. 40 is a cross-sectional view of a mounting structure of a chip resistor according to a third embodiment of the present invention.

A chip resistor mounting structure A893 shown in FIG. 40 includes a chip resistor 300, the mounting substrate 893, and the bonding portion 895.

The mounting substrate 893 and the bonding portion 895 are configured in the same way as those of the first embodiment, and hence the description will not be repeated in this embodiment.

Figure 41:
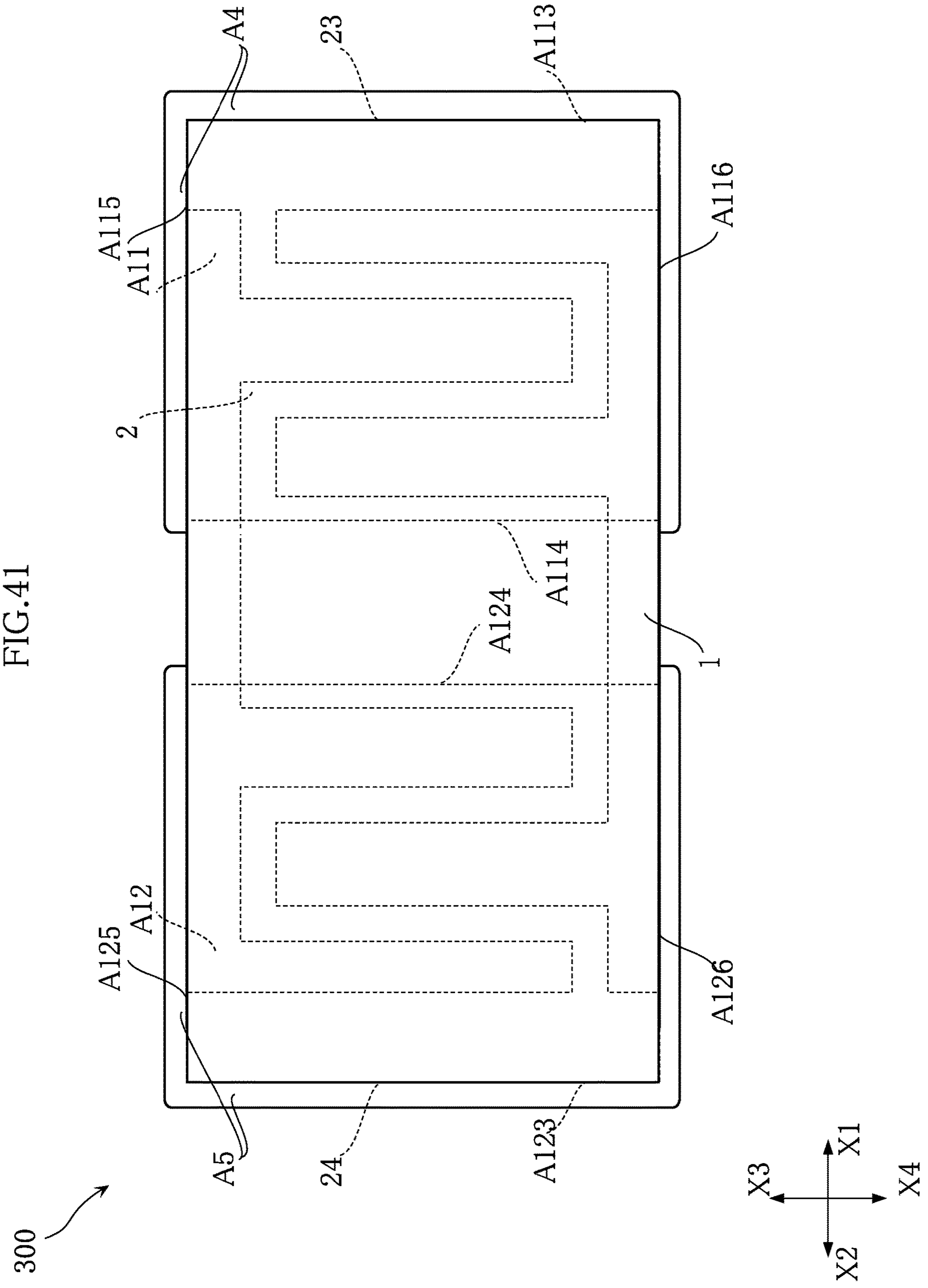
FIG. 41 is a partially seen-through plan view of the chip resistor, seen in the direction indicated by arrows XLI-XLI in FIG. 40.

The chip resistor 300 shown in FIGS. 40 and 41 includes the substrate 1, the resistor 2, the bonding layer 3, the first electrode 4, the second electrode 5, and a heat conducting portion 7.

The substrate 1 and the resistor 2 are configured in the same way as those of the first embodiment, and hence the description will not be repeated in this embodiment.

The bonding layer 3 is formed so as to cover the resistor 2. The bonding layer 3 is in direct contact with the resistor 2 and the substrate 1. Specifically, the bonding layer 3 is in direct contact with the resistor obverse surface 21 of the resistor 2 and the substrate obverse surface 11 of the substrate 1. The bonding layer 3 serves to bond a first conductive plate A11 and a second conductive plate A12 to the substrate 1 and the resistor 2. It is preferable that the bonding layer 3 is formed of an insulative material, typically exemplified by an epoxy-based material. It is preferable to employ a material having high heat conductance to form the bonding layer 3, in order to facilitate heat generated in the resistor 2 to be dissipated through the bonding layer 3 to outside of the chip resistor 300. The heat conductance of the material constituting the bonding layer 3 is, for example, 0.5 W/(m·K) to 3.0 W/(m·K). The thickness (size in the thickness direction Z1) of the bonding layer 3 of the insulating layer 6 is, for example, 30 to 100 μm. The bonding layer 3 may be formed from a sheet-shaped material or a liquid material.

The first electrode 4 is electrically connected to the resistor 2. The first electrode 4 serves to supply power to the resistor 2 from the mounting substrate 893 on which the chip resistor 300 is mounted. The first electrode 4 is in direct contact with the resistor 2. In this embodiment, the first electrode 4 is in contact with the resistor first lateral face 23 of the resistor 2 and the bonding layer 3. In this embodiment, further, the bonding layer 3 is disposed between the first electrode 4 and the resistor 2. In the mounting structure A893, the first electrode 4 is in direct contact with the bonding portion 895, to be electrically connected to a non-illustrated interconnect pattern formed on the mounting substrate 893, through the bonding portion 895.

The first electrode 4 includes a first conductive plate A11 and a first plated layer A4.

The first conductive plate A11 has a plate-like shape and is formed of a conductive material, examples of which include Cu, Ag, Au, and Al. The heat generated in the resistor 2 is dissipated through the first conductive plate A11 to outside of the chip resistor 300. The thickness (size in the thickness direction Z1) of the first conductive plate A11 is, for example, 200 to 800 μm.

The first conductive plate A11 includes a first conductive plate front surface A111, a first conductive plate rear surface A112, a first conductive plate outer lateral face A113, a first conductive plate inner lateral face A114, a first conductive plate end face A115, and another first conductive plate end face A116. In this embodiment, at least the first conductive plate front surface A111, the first conductive plate rear surface A112, the first conductive plate outer lateral face A113, the first conductive plate end face A115 and the first conductive plate end face A116 are flat. The first conductive plate front surface A111 and the first conductive plate rear surface A112 are directed in opposite directions to each other. The first conductive plate front surface A111 is directed in one direction of the thickness direction Z1, and the first conductive plate rear surface A112 is directed in the other direction of the thickness direction Z1. The first conductive plate outer lateral face A113 is directed in the first direction X1. The first conductive plate inner lateral face A114 is directed in the second direction X2. Thus, the first conductive plate outer lateral face A113 and the first conductive plate inner lateral face A114 are directed in opposite directions to each other. The first conductive plate inner lateral face A114 is directed toward the second conductive plate A12. The first conductive plate end face A115 is directed in the third direction X3. The first conductive plate end face A116 is directed in the fourth direction X4. Thus, the first conductive plate end face A115 and the first conductive plate end face A116 are directed in opposite directions to each other.

The first plated layer A4 shown in FIG. 40 is electrically connected to the resistor 2. The first plated layer A4 is formed so as to directly cover the first conductive plate outer lateral face A113. In this embodiment, further, the first plated layer A4 is formed so as to directly cover the first conductive plate rear surface A112, the first conductive plate inner lateral face A114, the first conductive plate end face A115, and the first conductive plate end face A116. However, the first plated layer A4 may not directly cover the first conductive plate rear surface A112, the first conductive plate inner lateral face A114, the first conductive plate end face A115, and the first conductive plate end face A116, and a part of those surfaces may be exposed from the first plated layer A4. The first plated layer A4 is in contact with the resistor 2.

The first plated layer A4 includes a first inner plated layer A41 and a first outer plated layer A43. The first inner plated layer A41 is formed of, for example, Cu, Ag, or Au, so as to directly cover the first conductive plate outer lateral face A113. In this embodiment, the first inner plated layer A41 directly covers the entirety of the first conductive plate outer lateral face A113. In this embodiment, further, the first inner plated layer A41 directly covers the first conductive plate rear surface A112, the first conductive plate inner lateral face A114, the first conductive plate end face A115, and the first conductive plate end face A116. The first outer plated layer A43 is formed on the first inner plated layer A41. When the chip resistor 300 is mounted, solder (conductive bonding portion 895) is applied to the first outer plated layer A43. The first outer plated layer A43 is, for example, formed of Sn.

In this embodiment, the first plated layer A4 also includes a first intermediate plated layer A42. The first intermediate plated layer A42 is disposed between the first inner plated layer A41 and the first outer plated layer A43. The first intermediate plated layer A42 is, for example, formed of Ni. Alternatively, the first intermediate plated layer A42 may be excluded from the first plated layer A4, so that the first inner plated layer A41 and the first outer plated layer A43 may be in direct contact with each other.

For example, the first inner plated layer A41 has a thickness of 10 to 50 μm, the first intermediate plated layer A42 has a thickness of 1 to 10 μm, and the first outer plated layer A43 has a thickness of 1 to 10 μm.

The second electrode 5 is offset in the direction X2 from the first electrode 4. The second electrode 5 is electrically connected to the resistor 2. The second electrode 5 serves to supply power to the resistor 2 from the mounting substrate 893 on which the chip resistor 300 is mounted. The second electrode 5 is in direct contact with the resistor 2. In this embodiment, the second electrode 5 is in direct contact with the resistor obverse surface 21 of the resistor 2. In this embodiment, further, the second electrode 5 is formed so as to cover the resistor second lateral face 24 of the resistor 2 and the insulating layer 6. In this embodiment, the insulating layer 6 is disposed between the second electrode 5 and the resistor 2. In this embodiment, still further, the second electrode 5 is not formed so as to cover the substrate reverse surface 12. However, the second electrode 5 may be formed so as to cover the substrate reverse surface 12, unlike in this embodiment. In the mounting structure 891, as shown in FIG. 1, the second electrode 5 is in direct contact with the bonding portion 895, thus to be electrically connected to the non-illustrated interconnect pattern formed on the mounting substrate 893, through the bonding portion 895.

The second electrode 5 includes a second conductive plate A12 and a second plated layer A5.

The second conductive plate A12 is spaced apart from the first conductive plate A11. Specifically, the second conductive plate A12 is spaced away from the first conductive plate A11 in the direction X2, opposite to the first direction X1. The second conductive plate A12 has a plate shape and is formed of a conductive material, examples of which include Cu, Ag, Au, and Al. The heat generated in the resistor 2 is dissipated through the second conductive plate A12 to outside of the chip resistor 300. The thickness (size in the thickness direction Z1) of the second conductive plate A12 is, for example, 200 to 800 μm.

The second conductive plate A12 includes a second conductive plate front surface A121, a second conductive plate rear surface A122, a second conductive plate outer lateral face A123, a second conductive plate inner lateral face A124, a second conductive plate end face A125, and another second conductive plate end face A126. In this embodiment, at least the second conductive plate front surface A121, the second conductive plate rear surface A122, the second conductive plate outer lateral face A123, the second conductive plate end face A125 and the second conductive plate end face A126 are flat.

The second conductive plate front surface A121 and the second conductive plate rear surface A122 are directed in opposite directions to each other. The second conductive plate front surface A121 is directed in one direction of the thickness direction Z1, and the second conductive plate rear surface A122 is directed in the other direction of the thickness direction Z1. The second conductive plate outer lateral face A123 is directed in the first direction X1. The second conductive plate inner lateral face A124 is directed in the second direction X2. Thus, the second conductive plate outer lateral face A123 and the second conductive plate inner lateral face A124 are directed in opposite directions to each other. The second conductive plate inner lateral face A124 is directed toward the second conductive plate A12. The second conductive plate end face A125 is directed in the third direction X3. The second conductive plate end face A126 is directed in the fourth direction X4. Thus, the second conductive plate end face A125 and the second conductive plate end face A126 are directed in opposite directions to each other.

The second plated layer A5 is electrically connected to the resistor 2. In this embodiment, the second plated layer A5 is formed so as to directly cover the entirety of the second conductive plate outer lateral face A123. In this embodiment, further, the second plated layer A5 is formed so as to directly cover the second conductive plate rear surface A122, the second conductive plate inner lateral face A124, the second conductive plate end face A125, and the second conductive plate end face A126. However, the second plated layer A5 may not directly cover the second conductive plate rear surface A122, the second conductive plate inner lateral face A124, the second conductive plate end face A125, and the second conductive plate end face A126, and a part of those surfaces may be exposed from the second plated layer A5.

The second plated layer A5 includes a second inner plated layer A51 and a second outer plated layer A53. The second inner plated layer A51 is formed of, for example, Cu, Ag, or Au, so as to directly cover the second conductive plate outer lateral face A123. In this embodiment, the second inner plated layer A51 directly covers the entirety of the second conductive plate outer lateral face A123. In this embodiment, further, the second inner plated layer A51 directly covers the second conductive plate rear surface A122, the second conductive plate inner lateral face A124, the second conductive plate end face A125, and the second conductive plate end face A126. The second outer plated layer A53 is formed on the second inner plated layer A51. When the chip resistor 300 is mounted, solder (conductive bonding portion 895) is applied to the second outer plated layer A53. The second outer plated layer A53 is, for example, formed of Sn.

In this embodiment, the second plated layer A5 also includes a second intermediate plated layer A52. The second intermediate plated layer A52 is disposed between the second inner plated layer A51 and the second outer plated layer A53. The second intermediate plated layer A52 is, for example, formed of Ni. Alternatively, the second intermediate plated layer A52 may be excluded from the second plated layer A5, so that the second inner plated layer A51 and the second outer plated layer A53 may be in direct contact with each other.

For example, the second inner plated layer A51 has a thickness of 10 to 50 μm, the second intermediate plated layer A52 has a thickness of 1 to 10 μm, and the second outer plated layer A53 has a thickness of 1 to 10 μm.

The heat conducting portion 7 is insulative and disposed between the first conductive plate A11 and the second conductive plate A12. The heat conducting portion 7 is formed of an epoxy-based material. In this embodiment, the heat conducting portion 7 is formed so as to directly cover the bonding layer 3, more specifically the rear face of the bonding layer 3. In addition, the heat conducting portion 7 is in direct contact with the first conductive plate inner lateral face A114 of the first conductive plate A11 and the second conductive plate inner lateral face A124 of the second conductive plate A12. The heat conducting portion 7 is, for example, formed of a thermosetting material. In this embodiment, the heat conducting portion 7 is in direct contact with the first plated layer A4 and the second plated layer A5. To facilitate heat generated in the resistor 2 to be dissipated to outside of the chip resistor 300, it is preferable that the material constituting the heat conducting portion 7 has higher heat conductance than a material constituting the bonding layer 3. For example, the heat conductance of the material constituting the heat conducting portion 7 is 0.5 W/(m·K) to 3.0 W/(m·K).

A manufacturing method of the chip resistor 300 will be described below.

Figure 42:
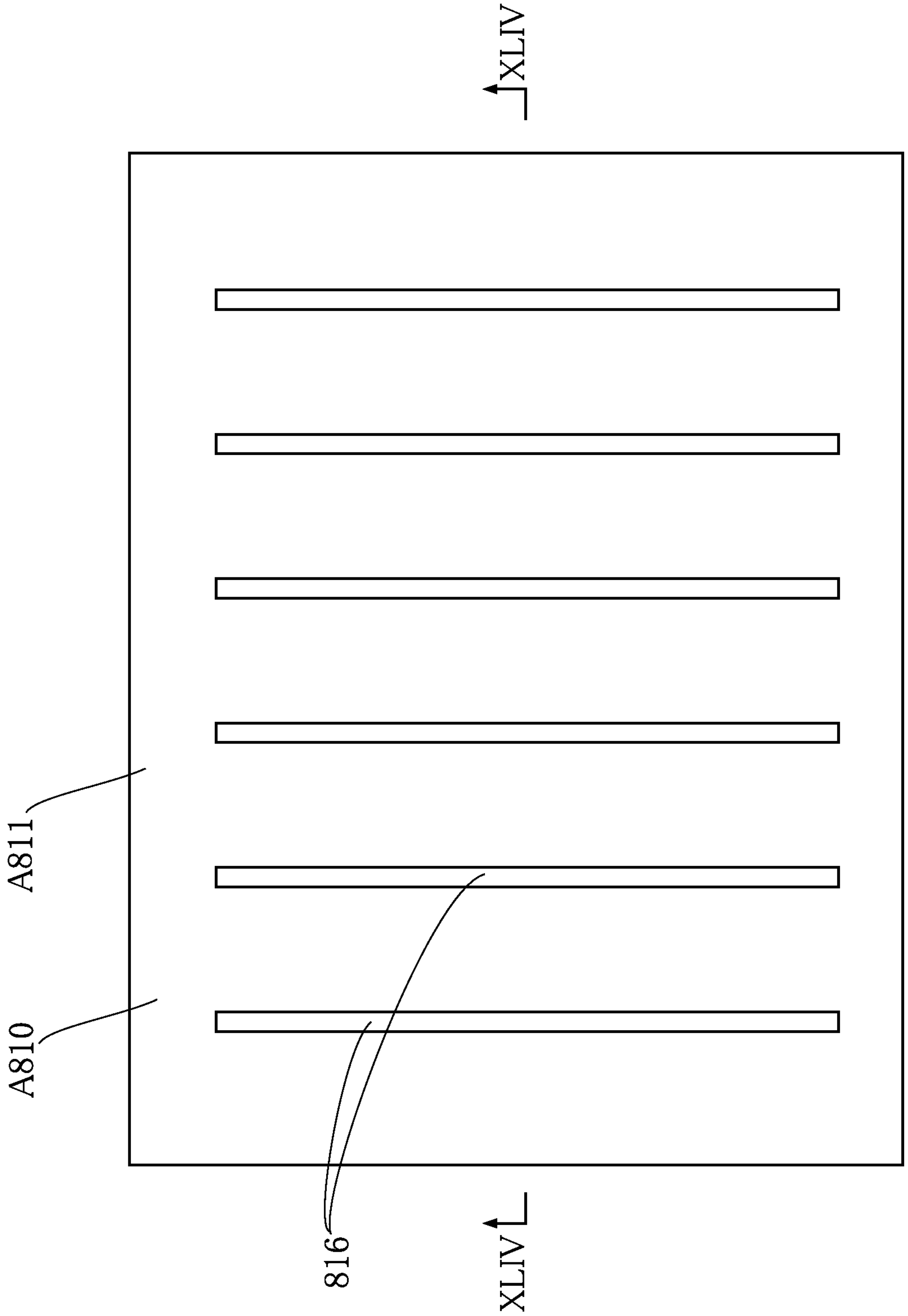
FIG. 42 is a plan view for explaining a manufacturing process of the chip resistor shown in FIG. 40.
Figure 43:
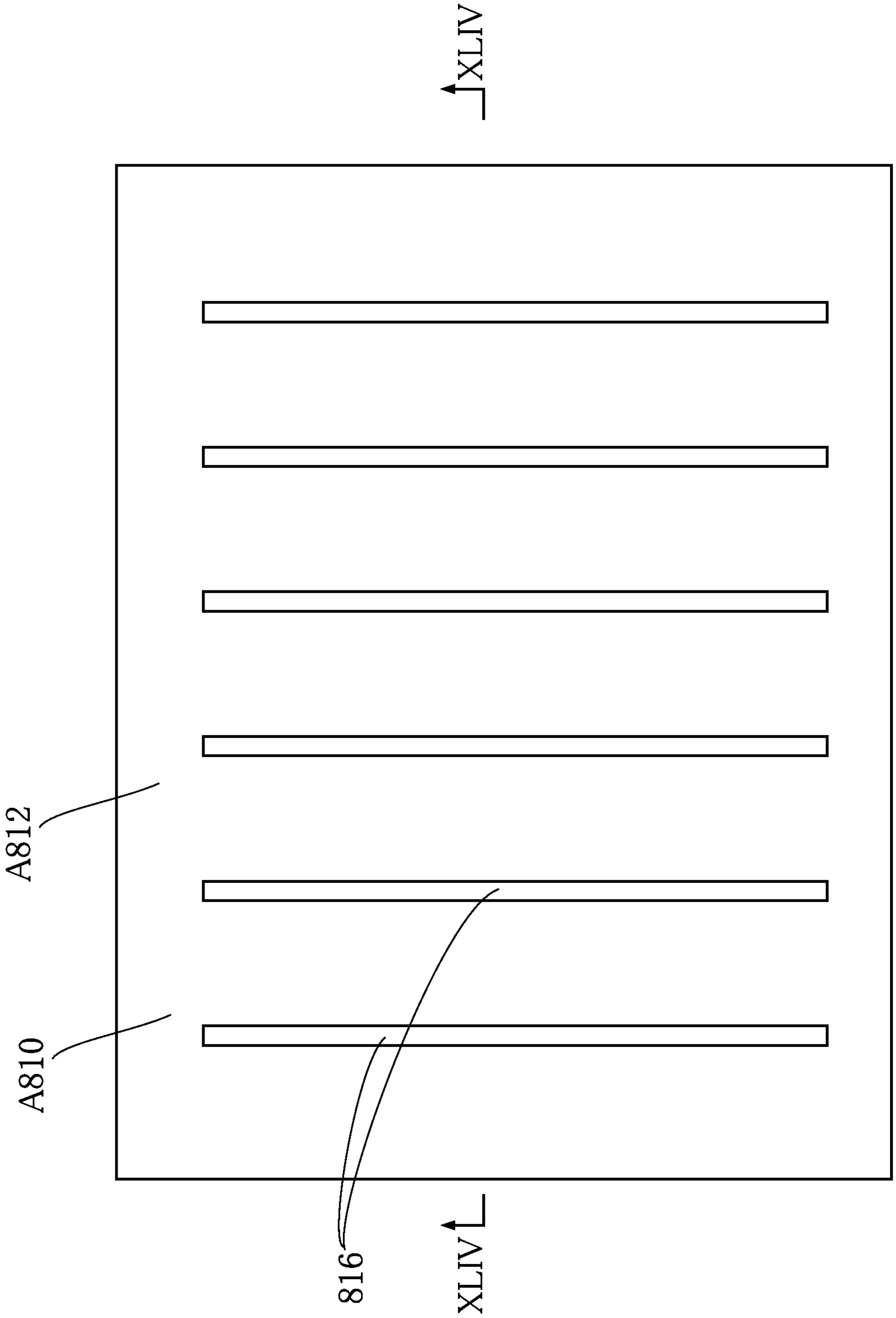
FIG. 43 is a rear view for explaining the manufacturing process of the chip resistor shown in FIG. 40.
Figure 44:
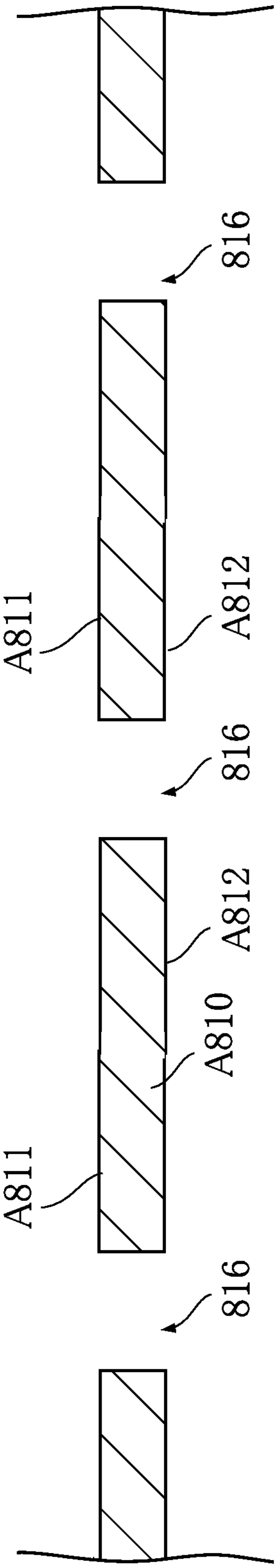
FIG. 44 is a cross-sectional view taken along a line XLIV-XLIV in FIGS. 42 and 43.

Referring first to FIGS. 42 to 44, a mother material A810 is prepared. FIG. 42 illustrates the front surface A811 of the mother material A810, and FIG. 43 illustrates the rear surface A812 of the mother material A810. The mother material A810 is to be formed into the first conductive plate A11 and the second conductive plate A12. The mother material A810 is formed of a conductive material such as Cu, Ag, Au, or Al. The mother material A810 includes a plurality of slits 816. The slits 816 are each formed so as to extend in one direction and to penetrate through the mother material A810 from the front surface A811 to the rear surface A812. The inner wall of the slit 816 corresponds to the first conductive plate inner lateral face A114 and the second conductive plate inner lateral face A124. The slits 816 may be formed by etching or punching, for example.

Figure 45:
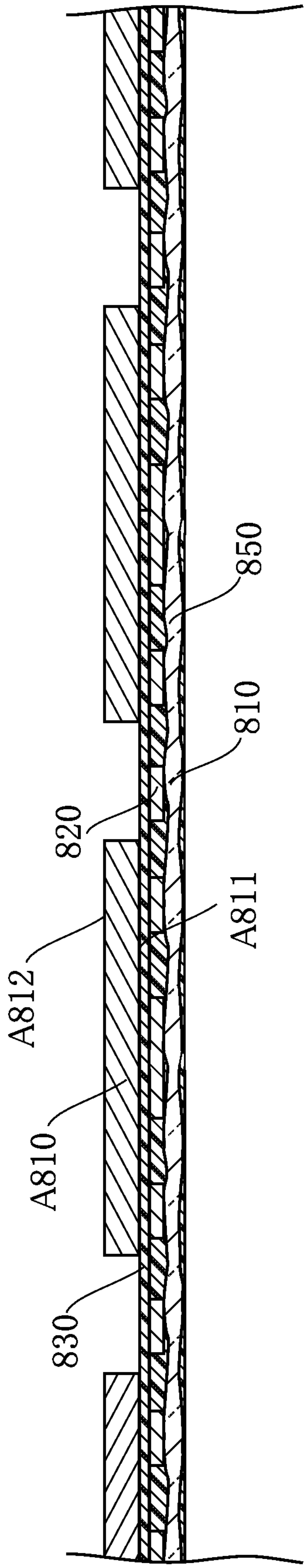
FIG. 45 is a cross-sectional view for explaining the manufacturing process of the chip resistor shown in FIG. 40.

As shown in FIG. 45, the front surface A811 and the composite sheet 850 (composed of substrate sheet 810 and resistor block 820) are bonded together with the bonding material 830. The bonding material 830 is to be formed into the bonding layer 3 as described earlier. In this embodiment, the bonding material 830 is a heat-conductive adhesive sheet, and the resistor block 820 is tentatively thermal-bonded to the bonding material 830 in the state shown in FIG. 45.

Instead of the adhesive sheet, a liquid adhesive may be employed as the bonding material 830.

Figure 46:
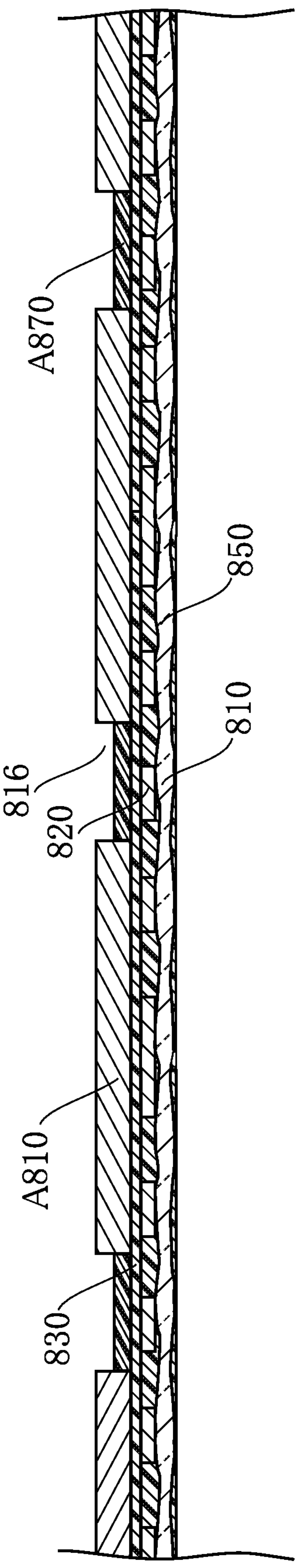
FIG. 46 is a cross-sectional view for explaining the manufacturing process that follows FIG. 45.

As shown in FIG. 46, a heat conductive material A870 is provided in the slits 816. The heat conductive material A870 is to be formed into the heat conducting portion 7. Though not shown, the intermediate product shown in FIG. 46 is then cured at a temperature of, for example, 150 to 200° C.

Figure 47:
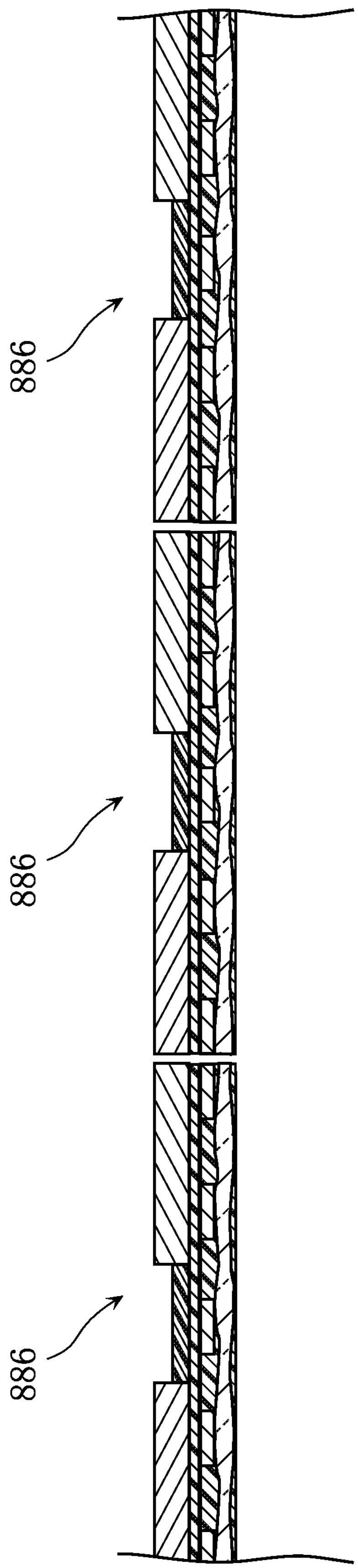
FIG. 47 is a cross-sectional view for explaining the manufacturing process that follows FIG. 46.

As shown in FIG. 47, the intermediate product shown in FIG. 46 is divided into a plurality of individual pieces 886. The plurality of individual pieces 886 may be obtained, for example, by cutting the mother material A810 and the substrate sheet 810. To obtain the individual pieces 886, for example punching or dicing is performed to cut the mother material A810.

Then the first plated layer A4 (first inner plated layer A41, first intermediate plated layer A42, and first outer plated layer A43) and the second plated layer A5 (second inner plated layer A51, second intermediate plated layer A52, and second outer plated layer A53) shown in FIG. 40 are formed on the individual pieces 886. To form the first plated layer A4 and the second plated layer A5, for example a barrel plating method may be employed. Throughout the foregoing process, the chip resistor 300 can be obtained.

This embodiment provides the following advantages.

In the above embodiment, the resistor 2 is embedded in the substrate 1. Such a configuration ensures that the overall size of the substrate 1 and the resistor 2 in the thickness direction Z1 of the substrate 1 are to be reduced. Therefore, the chip resistor 300 can be formed in a reduced thickness.

In this embodiment, the bonding layer 3 has a heat conductance as high as 0.5 W/(m·K) to 3.0 W/(m·K). Such a property facilitates the heat generated in the resistor 2 to be dissipated to outside of the chip resistor 300 through the bonding layer 3. Thus, the chip resistor 300 can be prevented from being overheated.

In this embodiment, the heat generated in the resistor 2 can be efficiently discharged to the mounting substrate 893 through the first conductive plate A11 and the second conductive plate A12. Such a configuration further assures that the overheating of the chip resistor 300 can be prevented.

In this embodiment, the substrate 1 and the mounting substrate 893 are both glass epoxy resin substrates. Accordingly, the substrate 1 and the mounting substrate 893 have generally the same thermal expansion coefficient. When the substrate 1 is thermally expanded during the use of the chip resistor 300, the mounting substrate 893 is supposed to thermally expand at the same rate. Such a configuration prevents a malfunction that may arise from the impact of thermal expansion during the use of the chip resistor 300, for example fracture of the chip resistor 300.

The chip resistor 300 is illustrated schematically in FIG. 40. Actually, the cross-sectional shape of first conductive plate A11 may not be a perfect rectangular shape in the case where the punching method is employed for cutting the mother material A810 and the substrate sheet 810. For example, the cross-section of the A11 may become as shown in FIG. 48.

Figure 48:
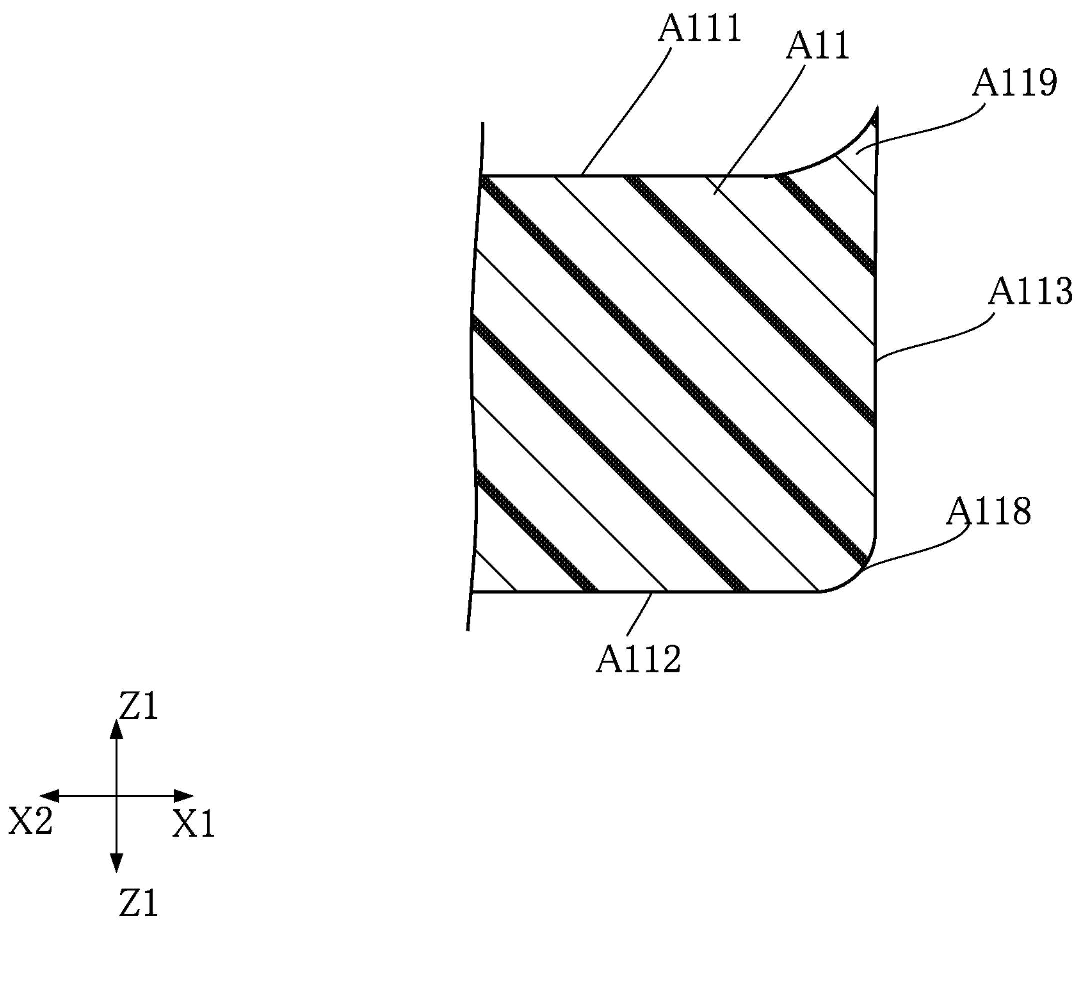
FIG. 48 is an enlarged fragmentary cross-sectional view of a first conductive plate according to the third embodiment.

The first conductive plate A11 shown in FIG. 48 includes a pointed portion A119 projecting in the thickness direction Z1. The pointed portion A119 is formed at the right-hand end of the first conductive plate A11 (that is, one end spaced apart from the other in the first direction X1), so as to project from the first conductive plate front surface A111. The first conductive plate A11 includes a first curved surface A118. The first curved surface A118 is formed so as to connect between the first conductive plate rear surface A112 and the first conductive plate outer lateral face A113.

In the case where the punching die is set in the vertically opposite manner, the end of the first conductive plate A11 of the chip resistor may assume a shape inverted with respect to the shape shown in FIG. 48.

Figure 49:
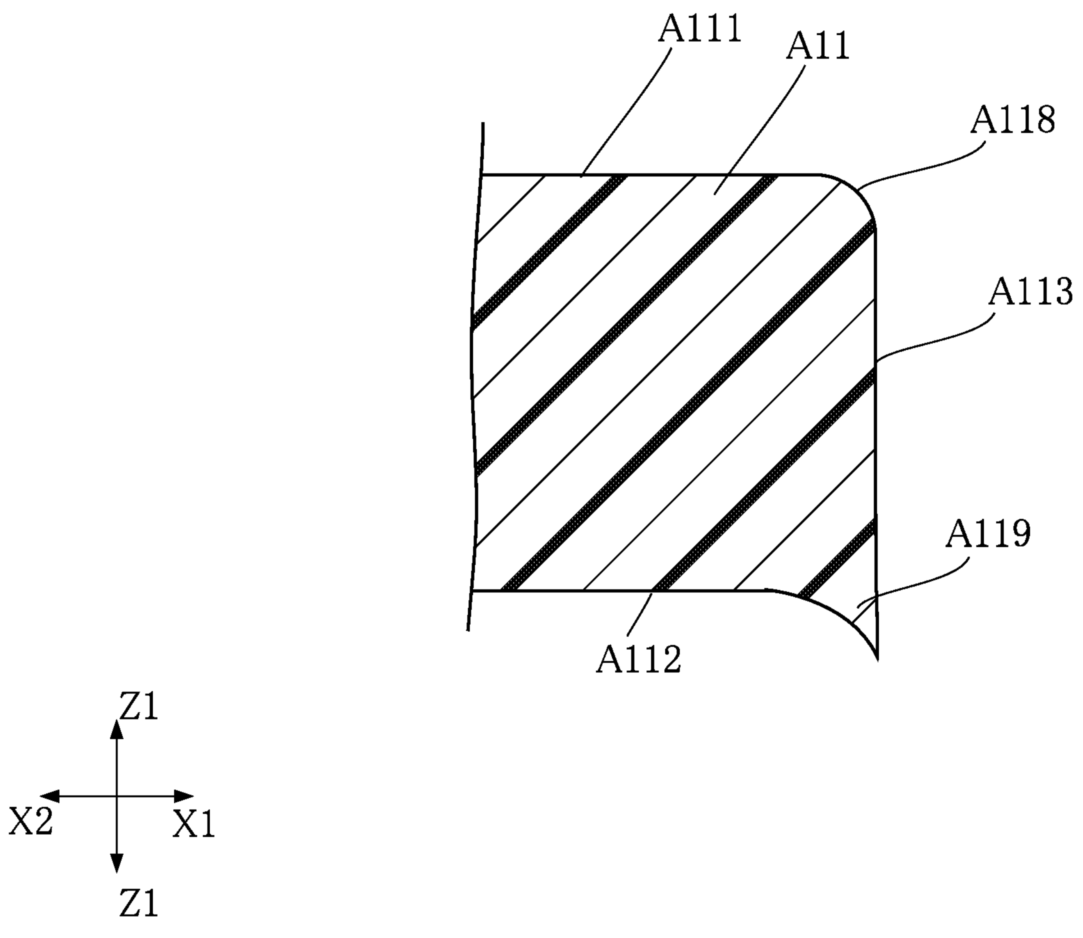
FIG. 49 is another enlarged fragmentary cross-sectional view of a first conductive plate according to the third embodiment.

As shown in FIG. 49, the pointed portion A119 is formed on a side of the first conductive plate rear surface A112. The first curved surface A118 is formed so as to connect between the first conductive plate front surface A111 and the first conductive plate outer lateral face A113.

Figure 50:
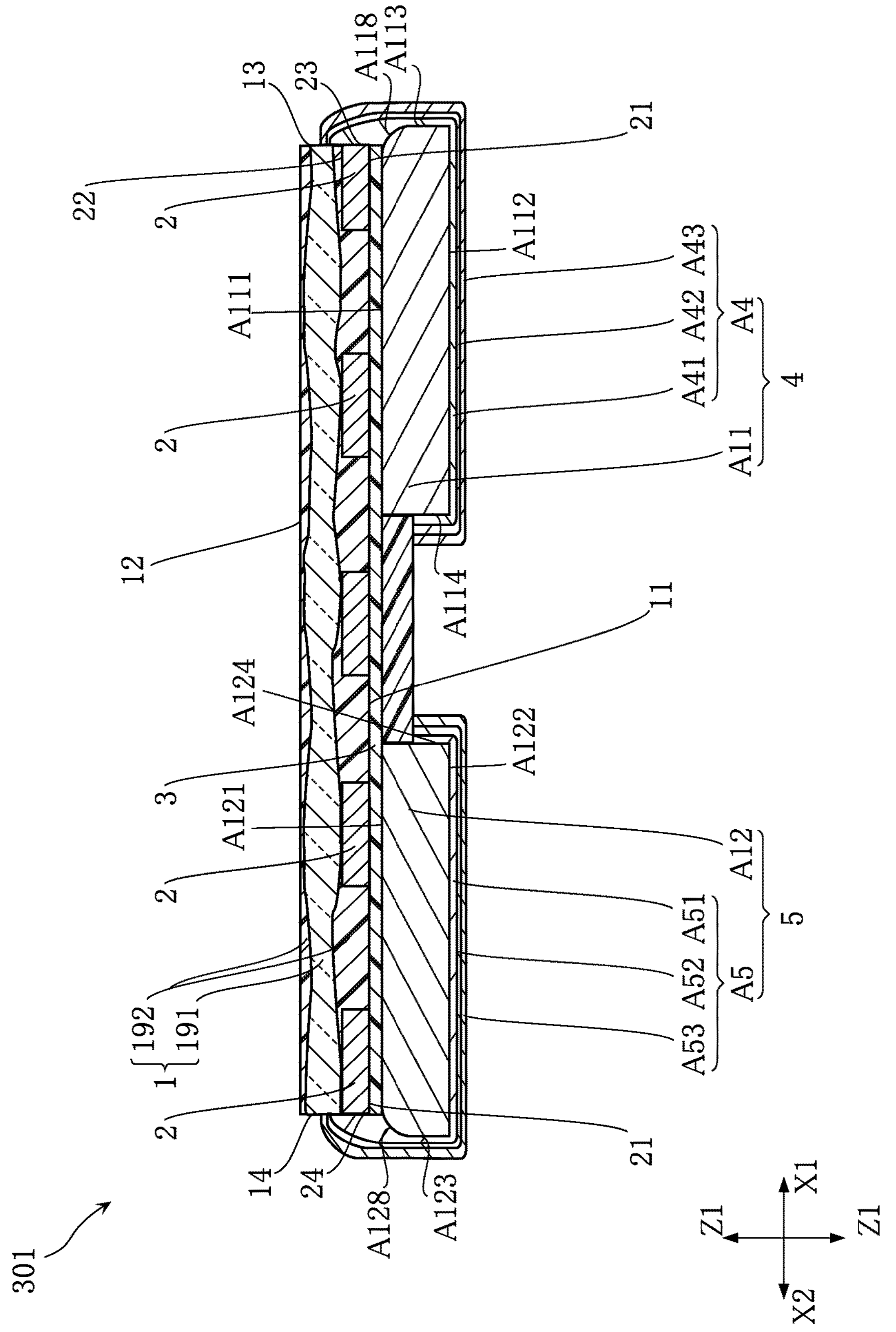
FIG. 50 is a cross-sectional view showing a chip resistor according to a first variation of the third embodiment.

FIG. 50 illustrates a variation of the above embodiment. In a chip resistor 301 shown in FIG. 50, the first conductive plate A11 protrudes in the first direction X1 with respect to the right end face of the resistor 2 (resistor first lateral face 23). In addition, the curved surface A118 is offset in the first direction X1 from the right end face of the resistor 2 (resistor first lateral face 23). Likewise, the second conductive plate A12 protrudes in the second direction X2 with respect to the left end face of the resistor 2 (resistor second lateral face 24), and the curved surface A128 is offset in the second direction X2 from the left end face of the resistor 2 (resistor second lateral face 24).

A manufacturing method of the chip resistor 301 configured as above will be described below.

Figure 51:
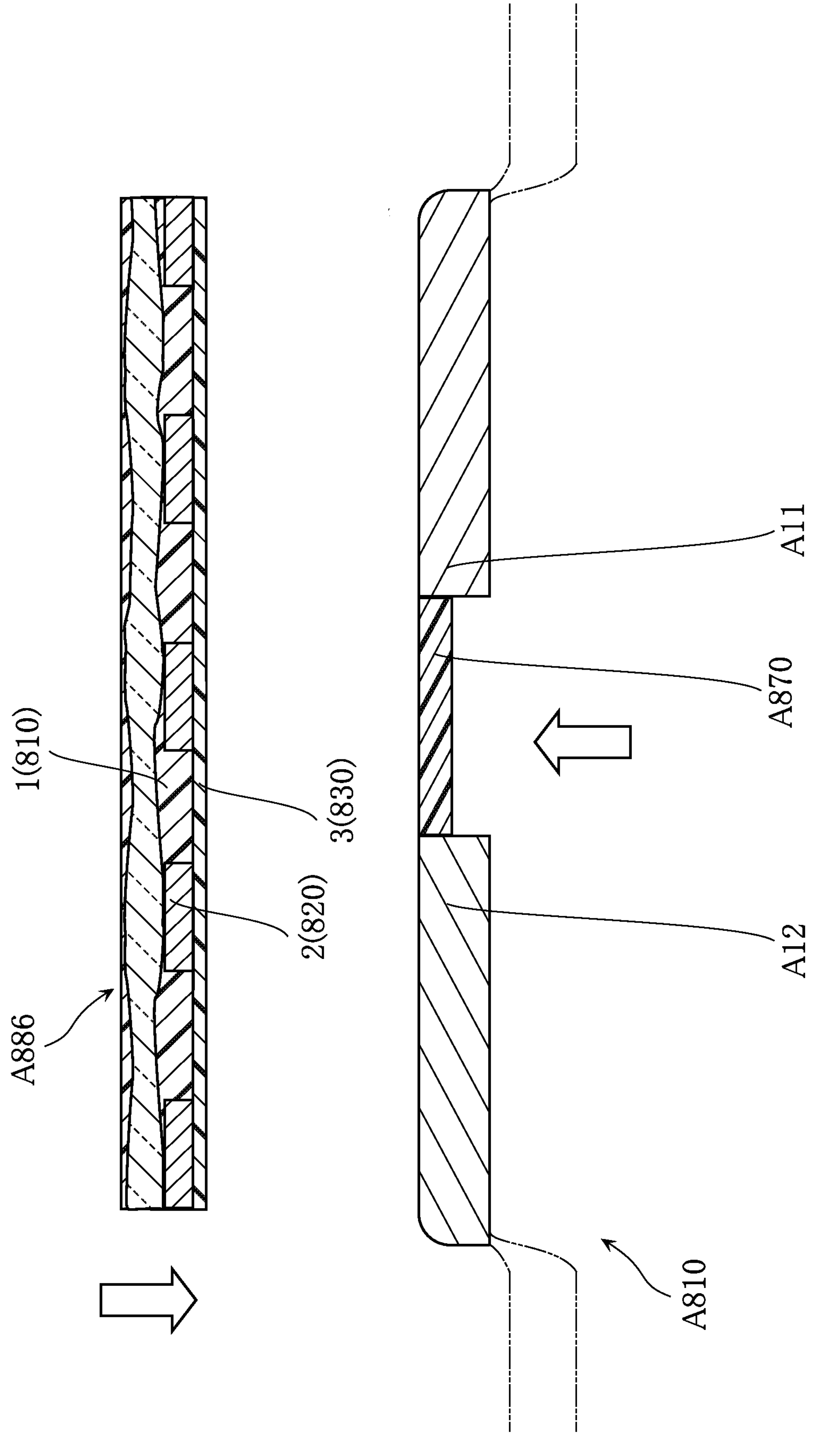
FIG. 51 is a cross-sectional view for explaining a manufacturing process of the chip resistor shown in FIG. 50.

The substrate sheet 810 and the resistor block 820 with the bonding material 830 bonded thereto as shown in FIG. 45 is collectively cut by dicing, to form a plurality of individual pieces A886 shown in FIG. 51. A non-illustrated dicing tape is stuck to the upper face of the substrate sheet 810 shown in the upper section of FIG. 51, and therefore the individual pieces A886 are prevented from falling apart.

After the heat conductive material A870 is provided in the slits 816 of the mother material A810 shown in FIG. 44, the portions of the mother material A810 corresponding to the first conductive plate A11 and the second conductive plate A12 are pushed by a non-illustrated tool, so that those portions are made to protrude with respect to the surrounding portions, as shown in the lower section of FIG. 51. At this point, the portions corresponding to the first conductive plate A11 and the second conductive plate A12 remain connected to the surrounding portions.

Figure 52:
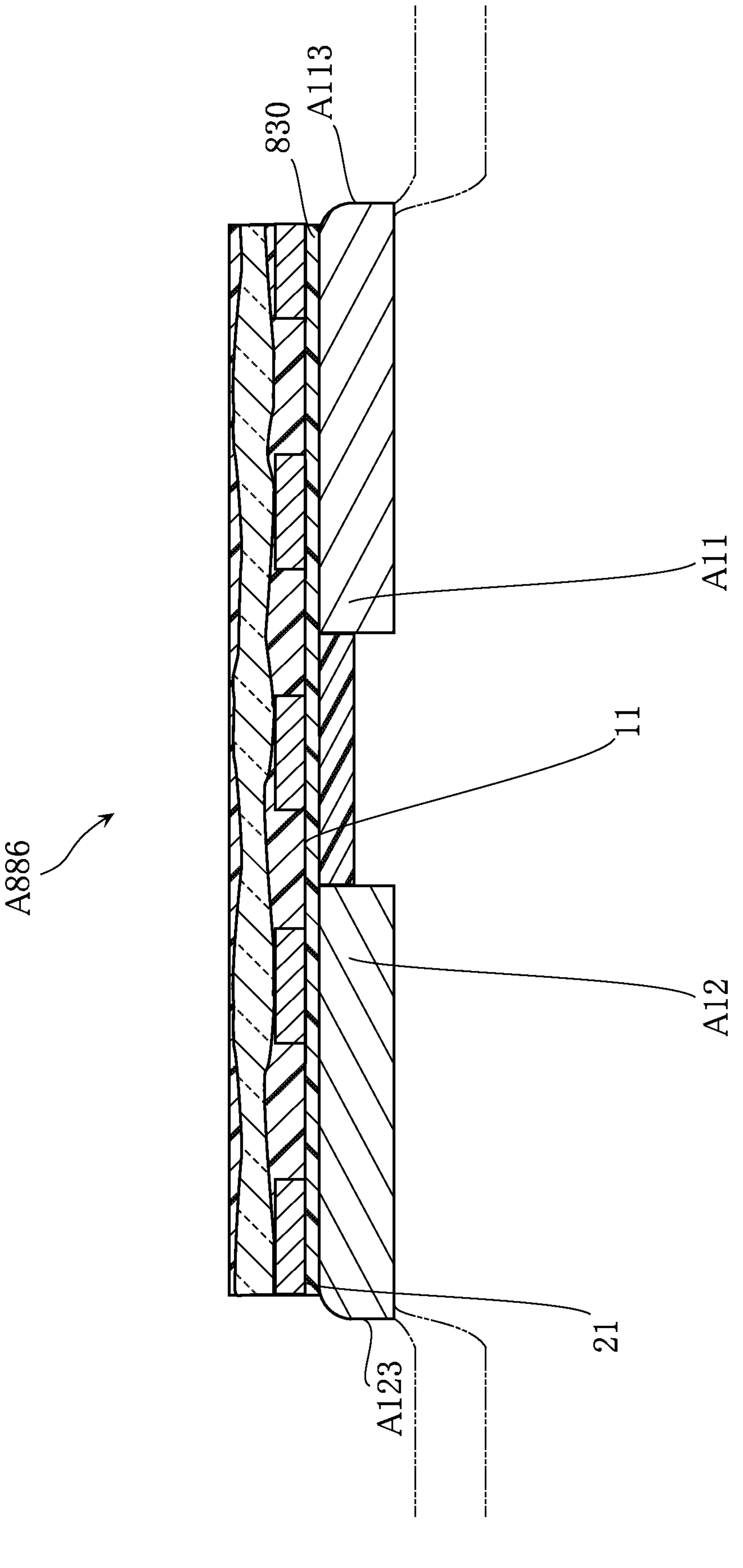
FIG. 52 is a cross-sectional view for explaining the manufacturing process that follows FIG. 51.

As shown in FIG. 52, the portions corresponding to the first conductive plate A11 and the second conductive plate A12 are bonded to the individual pieces A886 via the bonding material 830. Then the portions corresponding to the first conductive plate A11 and the second conductive plate A12 are separated from the surrounding portions by punching. Upon forming thereafter the first plated layer A4 and the second plated layer A5, the chip resistor 301 can be obtained.

The foregoing manufacturing method eliminates the need to cut the substrate sheet 810 and the resistor block 820 by punching. Therefore, the end portion of the substrate sheet 810 and the resistor block 820 can be prevented from being bent.

Figure 53:
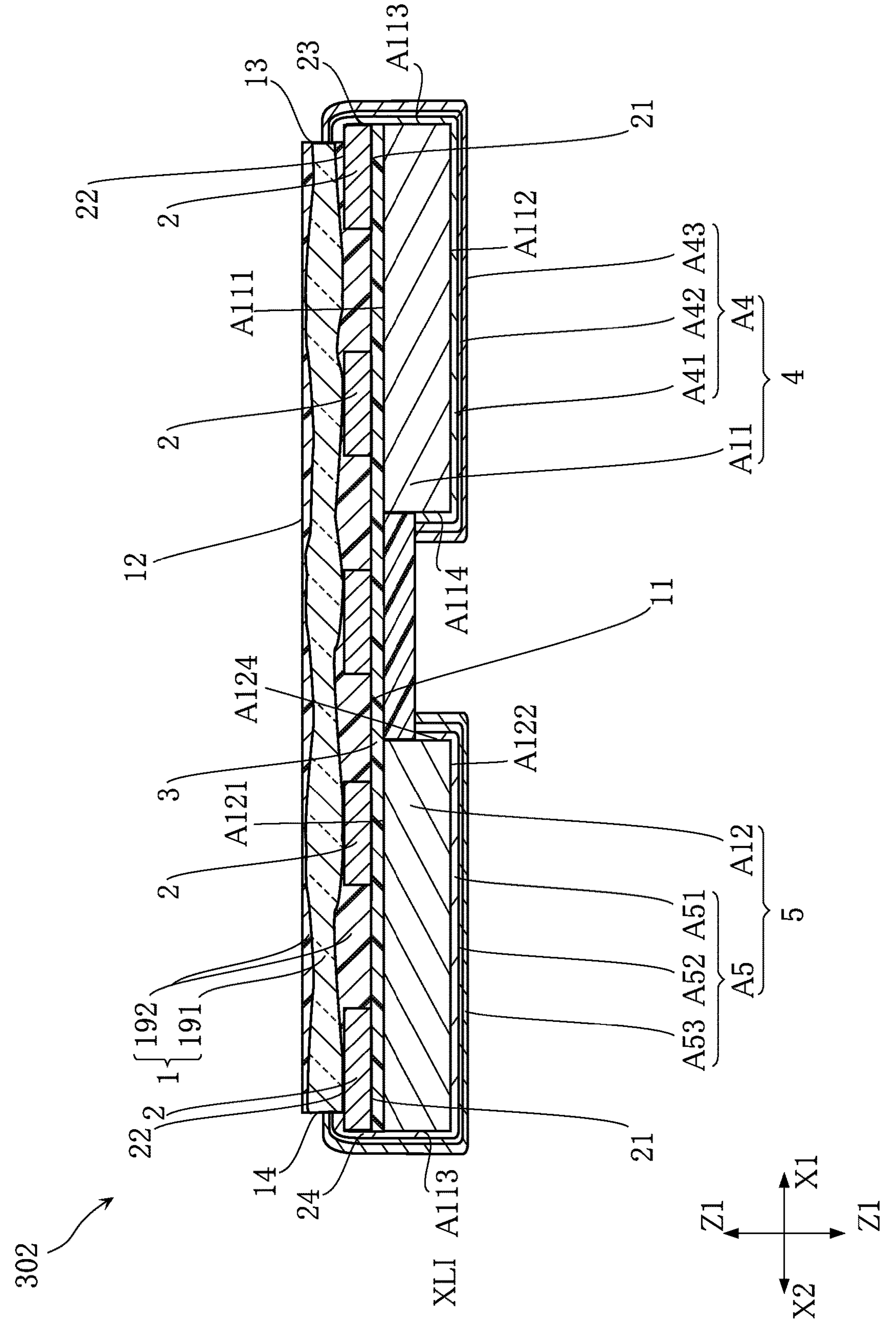
FIG. 53 is a cross-sectional view showing a chip resistor according to a second variation of the third embodiment.

FIG. 53 illustrates another variation of the above embodiment.

A chip resistor 302 shown in FIG. 53 is different from the chip resistor 300 in that a part of the resistor reverse surface 22 of the resistor 2 is covered with the first plated layer A4 or the second plated layer A5. The chip resistor 302 can be obtained by dicing a part of the substrate 1 (substrate sheet 810) using a dicing blade, before forming the individual pieces 886 by punching.

The chip resistor 302 thus configured also provides the same advantages as those provided by the chip resistor 300. The configuration according to this variation, in which a part of the resistor reverse surface 22 of the resistor 2 is covered with the first plated layer A4 or the second plated layer A5, may be combined with the resistor 301 shown in FIG. 50.

The present invention is not limited to the foregoing embodiments. Specific configurations of the constituents of the present invention may be modified in various manners within the scope of the present invention.

In the foregoing embodiments, the resistor is embedded in a substrate made of a glass epoxy resin. Alternatively, a substrate may be composed of a base plate (made of e.g. a glass epoxy resin) and an insulating layer formed on a surface of the base plate, and the resistor may be embedded in the insulating layer.

Configurations according to the present invention, as well as the variations thereof, may be presented as in the following appendices.

APPENDIX 1

A chip resistor including: a resistor; an insulating layer covering the resistor; a first electrode electrically connected to the resistor; and a second electrode electrically connected to the resistor and spaced apart from the first electrode in a second direction opposite to a first direction. The first electrode includes an underlying layer in direct contact with the resistor and a plated layer covering the underlying layer, and the insulating layer is disposed between the underlying layer and the resistor.

APPENDIX 2

The chip resistor according to Appendix 1, in which the underlying layer is disposed between the plated layer and the insulating layer.

APPENDIX 3

The chip resistor according to Appendix 1 or 2, in which the underlying layer is at least one quarter as large as the resistor, in the first direction.

APPENDIX 4

The chip resistor according to Appendix 1 or 2, in which the underlying layer is at least one third as large as the resistor, in the first direction.

APPENDIX 5

The chip resistor according to any one of Appendices 1 to 4, in which the underlying layer has a size of 600 to 3200 μm in the first direction.

APPENDIX 6

The chip resistor according to any one of Appendices 1 to 5, in which the underlying layer is thinner than the resistor.

APPENDIX 7

The chip resistor according to any one of Appendices 1 to 6, in which the underlying layer has a thickness of 0.5 to 1.0 nm.

APPENDIX 8

The chip resistor according to any one of Appendices 1 to 7, in which the underlying layer is formed by one of PVD, CVD, and printing.

APPENDIX 9

The chip resistor according to any one of Appendices 1 to 7, in which the underlying layer is formed by sputtering.

APPENDIX 10

The chip resistor according to any one of Appendices 1 to 9, in which the underlying layer is formed of a Ni—Cr alloy.

APPENDIX 11

The chip resistor according to any one of Appendices 1 to 10, in which the plated layer is in direct contact with the insulating layer.

APPENDIX 12

The chip resistor according to any one of Appendices 1 to 11, in which the plated layer is in direct contact with a portion of the insulating layer located offset from the underlying layer in the second direction.

APPENDIX 13

The chip resistor according to any one of Appendices 1 to 12, in which the plated layer includes a Cu layer and a Sn layer, and the Cu layer is disposed between the Sn layer and the resistor.

APPENDIX 14

The chip resistor according to Appendix 13, in which the plated layer includes a Ni layer disposed between the Cu layer and the Sn layer.

APPENDIX 15

The chip resistor according to any one of Appendices 1 to 14, in which the resistor includes a resistor first lateral face directed in the first direction, the underlying layer includes an underlying layer first lateral face directed in the first direction, and the resistor first lateral face is flush with the underlying layer first lateral face.

APPENDIX 16

The chip resistor according to Appendix 15, in which the resistor first lateral face and the underlying layer first lateral face are covered with the plated layer.

APPENDIX 17

The chip resistor according to any one of Appendices 1 to 16, in which the resistor includes a resistor reverse surface and a resistor obverse surface directed in opposite directions to each other, and the resistor reverse surface is in direct contact with the substrate.

APPENDIX 18

The chip resistor according to any one of Appendices 1 to 17, in which the insulating layer includes an insulating layer reverse surface and an insulating layer obverse surface directed in opposite directions to each other, and the insulating layer obverse surface is in direct contact with the underlying layer.

APPENDIX 19

The chip resistor according to any one of Appendices 1 to 18, in which the insulating layer includes a portion disposed between the resistor and the first electrode, and a portion disposed between the resistor and the second electrode.

APPENDIX 20

The chip resistor according to any one of Appendices 1 to 18, in which the first electrode and the second electrode are formed on the insulating layer obverse surface.

APPENDIX 21

The chip resistor according to Appendix 20, in which a part of the insulating layer obverse surface is exposed from the first electrode and the second electrode.

APPENDIX 22

The chip resistor according to any one of Appendices 1 to 21, in which the insulating layer has a heat conductance of 1.0 W/(m·K) to 5.0 W/(m·K).

APPENDIX 23

The chip resistor according to any one of Appendices 1 to 22, further including a substrate on which the resistor is mounted.

APPENDIX 24

The chip resistor according to Appendix 23, in which the substrate is formed of an insulative material.

APPENDIX 25

The chip resistor according to Appendix 23 or 24, in which the substrate includes a substrate end face, the insulating layer includes an insulating layer end face, and the substrate end face and the insulating layer end face are both directed in a third direction perpendicular to both the thickness direction of the substrate and the first direction, where the two faces are flush with each other.

APPENDIX 26

The chip resistor according to any one of Appendices 23 to 25, in which the substrate includes a substrate reverse surface and a substrate obverse surface directed in opposite directions to each other, the resistor is located adjacent to the substrate obverse surface, and the substrate reverse surface is exposed.

APPENDIX 27

The chip resistor according to any one of Appendices 23 to 26, in which a material constituting the substrate has higher heat conductance than a material constituting the insulating layer.

APPENDIX 28

The chip resistor according to any one of Appendices 23 to 27, further including a bonding layer disposed between the substrate and the resistor.

APPENDIX 29

The chip resistor according to Appendix 28, in which the bonding layer is formed of an epoxy-based material.

APPENDIX 30

The chip resistor according to any one of Appendices 1 to 29, in which the resistor has a serpentine shape.

APPENDIX 31

The chip resistor according to any one of Appendices 1 to 30, in which the resistor is formed of one of manganin, zeranin, a Ni—Cr alloy, a Cu—Ni alloy, and a Fe—Cr alloy.

APPENDIX 32

A chip resistor mounting structure including: a chip resistor according to any one of Appendices 1 to 31; a mounting substrate on which the chip resistor is mounted; and an electroconductive bonding portion disposed between the mounting substrate and the chip resistor.

The invention claimed is:

1. A chip resistor comprising:

a substrate;

a resistive member supported by the substrate; and an electrode held in contact with the resistive member, wherein the electrode comprises a plate having an outer lateral face that faces in a first direction perpendicular to a thickness direction of the plate, the resistive member has a resistive outer lateral face that faces in the first direction, and the outer lateral face of the plate is offset ahead of the resistive outer lateral face in the first direction, and the substrate has a first outer lateral face that faces in the first direction, and that is flush with the resistive outer lateral face.

2. The chip resistor according to claim 1, wherein the plate includes a pointed portion and a curved surface spaced apart from the pointed portion in the thickness direction.

3. The chip resistor according to claim 2, wherein the plate has a front surface and a rear surface that are spaced apart from each other in the thickness direction, the pointed portion being closer to the front surface than to the rear surface, the curved surface being closer to the rear surface than to the front surface.

4. The chip resistor according to claim 2, wherein the plate has a front surface and a rear surface that are spaced apart from each other in the thickness direction, the pointed portion being closer to the rear surface than to the front surface, the curved surface being closer to the front surface than to the rear surface.

5. The chip resistor according to claim 2, further comprising a bonding layer disposed between the resistive member and the electrode, wherein the curved surface of the electrode is exposed from the bonding layer.

6. The chip resistor according to claim 5, wherein the bonding layer is smaller in thickness than each of the resistive member and the electrode.

7. The chip resistor according to claim 2, wherein the outer lateral face of the plate is flat and directly connected to the curved surface.

8. The chip resistor according to claim 1, further comprising at least one plated layer formed on the plate.

9. The chip resistor according to claim 1, further comprising a layer formed on the plate and held in contact with the resistive member.

10. The chip resistor according to claim 1, wherein the substrate contains a glass material.

11. The chip resistor according to claim 1, wherein at least a part of the resistive member is embedded in the substrate.

12. The chip resistor according to claim 1, wherein the electrode comprises a Cu plated layer held in direct contact with the plate.

13. The chip resistor according to claim 12, wherein the electrode comprises a Ni plated layer and a Sn plated layer, the Ni plated layer being disposed between the Cu plated layer and the Sn plated layer.

14. The chip resistor according to claim 1, wherein the substrate includes a glass fiber portion and a resin portion.

15. The chip resistor according to claim 14, wherein the resistive member includes a serpentine-shaped portion that is embedded in the resin portion of the substrate.

16. The chip resistor according to claim 14, wherein the substrate has a second outer lateral face opposite to the first outer lateral face in the first direction, and the glass fiber portion extends continuously from the first outer lateral face to the second outer lateral face.

17. The chip resistor according to claim 1, wherein the plate is formed of one of Cu, Ag, Au or Al.

18. The chip resistor according to claim 1, wherein the plate is greater in thickness than the resistive member.

19. The chip resistor according to claim 1, further comprising a heat conducting portion held in contact with an inner lateral face of the plate that is opposite to the outer lateral face of the plate.

* * * * *